(12) United States Patent
Igaki et al.

(10) Patent No.: US 8,894,268 B2
(45) Date of Patent: Nov. 25, 2014

(54) LED LIGHTBULB

(75) Inventors: Masaru Igaki, Kyoto (JP); Hirotaka Shimizu, Kyoto (JP); Kohei Mizuta, Kyoto (JP); Hideharu Osawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 277 days.

(21) Appl. No.: 13/536,176

(22) Filed: Jun. 28, 2012

(65) Prior Publication Data

US 2013/0003361 A1 Jan. 3, 2013

(30) Foreign Application Priority Data

| Jun. 29, 2011 | (JP) | 2011-144713 |
| Jun. 29, 2011 | (JP) | 2011-144717 |
| Jun. 29, 2011 | (JP) | 2011-144718 |
| Jun. 30, 2011 | (JP) | 2011-145463 |
| Aug. 10, 2011 | (JP) | 2011-174964 |
| Apr. 26, 2012 | (JP) | 2012-100892 |

(51) Int. Cl.
| F21S 4/00 | (2006.01) |
| F21V 29/00 | (2006.01) |
| H01L 33/50 | (2010.01) |
| F21V 5/00 | (2006.01) |
| F21V 23/00 | (2006.01) |
| F21V 3/02 | (2006.01) |
| F21S 2/00 | (2006.01) |
| H05B 37/00 | (2006.01) |
| F21K 99/00 | (2010.01) |
| F21V 19/04 | (2006.01) |
| F21Y 105/00 | (2006.01) |

(52) U.S. Cl.
CPC ............... *F21S 2/00* (2013.01); *F21V 29/2231* (2013.01); *H01L 33/50* (2013.01); *F21V 29/004* (2013.01); *F21V 5/00* (2013.01); *F21V 23/00* (2013.01); *F21V 3/02* (2013.01); *F21V 29/22* (2013.01); *H05B 37/00* (2013.01); *F21K 9/135* (2013.01); *F21Y 2105/001* (2013.01); *F21V 19/04* (2013.01); *F21V 23/006* (2013.01); *F21V 29/2262* (2013.01)
USPC ...... 362/647; 362/650; 362/294; 362/249.02; 362/311.02; 362/311.06

(58) Field of Classification Search
USPC ............ 362/249.02, 294, 373, 647, 649, 650, 362/311.01, 311.02, 311.06, 311.14, 355, 362/359, 361
See application file for complete search history.

(56) References Cited

U.S. PATENT DOCUMENTS 7,963,686 B2 * 6/2011 Hu ................................ 362/547
(Continued)

FOREIGN PATENT DOCUMENTS

| CN | 101614345 | 12/2009 |
| JP | 2009-267082 | 11/2009 |

(Continued)

*Primary Examiner* — Thomas M Sember
(74) *Attorney, Agent, or Firm* — Hamre, Schumann, Mueller & Larson, P.C.

(57) ABSTRACT

An LED lightbulb is configured to properly illuminate a broader region. The LED lightbulb includes a light emitting unit, a pedestal, a power source unit, a heat dissipator, a base, and a globe swelling toward one side in a first direction for enclosing the light emitting unit. The globe is configured to diffusingly transmit light from the light emitting unit. The light emitting unit provides a light amount not less than 50% of the maximum light amount in a region not exceeding ±60° about the central axis extending in the first direction set as 0°. The globe provides a light amount not less than 50% in a region exceeding ±125° about the central axis set as 0°.

20 Claims, 37 Drawing Sheets

(56) References Cited

U.S. PATENT DOCUMENTS 8,272,762 B2 * 9/2012 Maxik et al. ............ 362/249.02
8,608,341 B2 * 12/2013 Boomgaarden et al. . 362/249.02
8,646,942 B2 * 2/2014 Boomgaarden et al. . 362/249.02

FOREIGN PATENT DOCUMENTS

| | | |
|---|---|---|
| JP | 2010-225409 | 10/2010 |
| JP | 2011-70972 | 4/2011 |
| JP | 2011-82132 | 4/2011 |

* cited by examiner

FIG.44
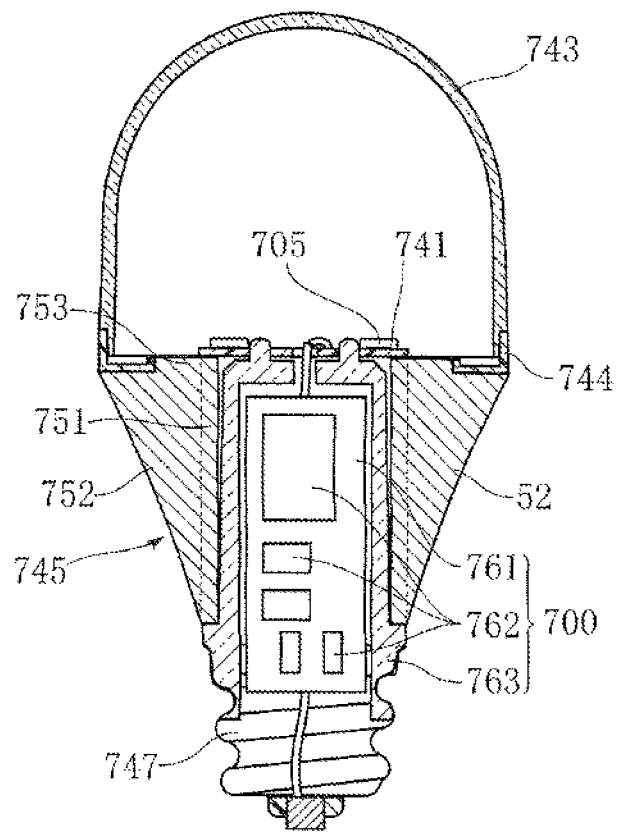
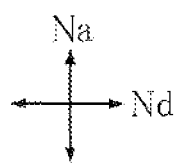

LED LIGHTBULB

BACKGROUND OF THE INVENTION

1. Technical Field

The present invention relates to an LED lightbulb.

2. Description of the Related Art

LED lightbulbs utilizing LED chips as a light source have been proposed as substitutes for incandescent lightbulbs, as disclosed in JP-A-2011-70972, for example. A typical LED lightbulb includes a light emitting unit including a plurality of LED chips, a globe covering the light emitting unit, and a power source unit that converts alternating current into direct current for the LED chips.

An incandescent lightbulb emits light substantially in all directions. Accordingly, the LED lightbulb is required to illuminate a region as broad as possible, when employed as substitute for the incandescent lightbulb. In addition, if the LED lightbulb were remarkably bigger than the incandescent lightbulb, it would be difficult to handle the LED lightbulb like handling the incandescent lightbulb. Therefore, the LED lightbulb is required to be made smaller.

The LED lightbulb including the LED chips mounted therein is starting to take the place of the incandescent lightbulb. The LED lightbulb is superior to the incandescent lightbulb in energy saving performance and life span.

FIG. 47 depicts an existing LED lightbulb (see, for example, JP-A-2010-225409). The LED lightbulb 910 shown in FIG. 47 is designed for use as substitute for an incandescent lightbulb, and includes a substrate 911, a plurality of LED chips 912, a heat dissipator 913, a base 914, and a globe 915. The plurality of LED chips 912 serve as the light source of the LED lightbulb 910, and is mounted on the substrate 911. The substrate 911 is formed of an insulative material, and fixed to the heat dissipator 913. The heat dissipator 913 is formed of a metal such as aluminum. The heat dissipator 913 supports the LED chips 912 via the substrate 911, and serves to release the heat of the LED chips 912 to outside. The base 914 is used to attach the LED lightbulb 910 to an illumination instrument, and formed in compliance with, for example, JIS. The globe 915 covers the plurality of LED chips 912 and transmits the light from the LED chips 912. The globe 915 is formed so as to swell upward in FIG. 47, and fixed to an upper end portion (fixing facet) of the heat dissipator 913.

When the LED lightbulb 910 attached to an illumination instrument is turned on, heat generated by the plurality of LED chips 912 transfers to the heat dissipator 913, thus increasing the temperature of the surface of the heat dissipator 913. Especially, the upper end portion of the heat dissipator 913, close to the LED chips 912 and where the globe 915 is attached is prone to bear a higher temperature. Now, when the LED lightbulb 910 is to be removed from the illumination instrument, the user often grabs the outer circumferential portion of the upper end portion of the heat dissipator 913 opposite the base 914, and/or an adjacent portion, i.e., the outer circumferential portion of the lower end portion of the globe 915. However, as stated above, the heat dissipator 913 (upper end portion in particular) bears a high temperature while the LED lightbulb 910 is turned on, and hence the surface of the upper end portion of the heat dissipator 913 maintains the high temperature for a while after the LED lightbulb 910 is turned off. In the case where the user touches the outer circumferential portion of the upper end portion of the heat dissipator 913 while it is still hot in order to remove the LED lightbulb 910, the user may feel uncomfortable.

FIG. 48 depicts another example of existing LED lightbulbs (see, for example, JP-A-2009-267082). The LED lightbulb 920 shown in FIG. 48 includes a plurality of LED modules 922 mounted on a substrate 921. The LED modules 922 have the function of emitting light from the LED lightbulb 920, and each include an LED chip (not shown). The substrate 921 is supported by a heat dissipator 923. A base 925 is used to attach the LED lightbulb 920 to an illumination instrument designed for an incandescent lightbulb. A globe 926 is formed in a generally spherical shape, and transmits light from the LED modules 922. A power source unit 924 supplies power to the LED modules 922. The power from the power source unit 924 is supplied to the LED module 922 through wiring 927. An end portion of the wiring 927 is connected to the upper surface of the substrate 921 by means of a solder 928.

The solder 928 is typically formed with a flux. The flux often contains bromine. While the LED lightbulb 920 is in use, the bromine is emitted from the flux. The bromine may provoke a change of color of a metal constituting the LED modules 922, which may lead to decreased light amount of the LED lightbulb 920.

As stated above, the LED lightbulbs including the LED chips mounted therein have been proposed as substitute for incandescent lightbulbs, because of the advantage in energy saving performance and life span compared with the incandescent lightbulbs.

The LED lightbulb has an appearance similar to that of the conventional incandescent lightbulb, and the base of the LED lightbulb serving as the power supply terminal is also equivalent to that of the incandescent lightbulb. Therefore, the LED lightbulb can be fitted to existing sockets designed for the incandescent lightbulb.

The LED lightbulb includes LED modules and a lighting circuit as disclosed, for example, in JP-A-2011-70972 and JP-A-2011-82132, so as to be turned on upon receipt of power from the lighting circuit.

However, it has been difficult to control the light of the LED lightbulb through a simple procedure. The existing LED lightbulbs are not provided with the dimming control function. In addition, the LED is driven by a constant current as disclosed in JP-A-2011-70972, and therefore the dimming control is performed by changing the duty ratio of the current pulse signal. For such a reason, even though the LED lightbulb can be fitted to a socket for the conventional incandescent lightbulb, the dimming control system for the incandescent lightbulb is inapplicable to the LED lightbulb, because the dimming control method is different.

SUMMARY OF THE INVENTION

The present invention has been proposed in view of the foregoing situation, with an object to provide an LED lightbulb capable of properly illuminating a broader region.

Another object of the present invention is to provide an LED lightbulb that performs proper heat release through a heat dissipator, and that yet alleviates discomfort that a user feels when removing the LED lightbulb.

Still another object of the present invention is to provide an LED lightbulb that suppresses a decrease in light amount.

Further, the present invention has been accomplished for achieving the foregoing objects, and provides an LED lightbulb that allows dimming control of the LED to be performed through a simple procedure.

A first aspect of the present invention provides an LED lightbulb an LED lightbulb comprising: a light emitting unit configured to emit light about a central axis extending in a first direction, the light emitting unit including at least one LED chip; a pedestal including a mounting surface on which the light emitting unit is mounted, the mounting surface facing in the first direction; a power source unit that supplies power to the light emitting unit, the power source unit being disposed at a position opposite to the light emitting unit with respect to the pedestal; a heat dissipator attached to the pedestal and including a power source chamber that accommodates the power source unit; a base attached to the heat dissipator; and a globe swelling in the first direction and enclosing the light emitting unit, the globe being configured to diffusingly transmit light from the light emitting unit. The light emitting unit is configured to provide a light amount not less than 50% of a maximum light amount in a region not exceeding ±60° about the central axis set as 0°, and the globe is configured to provide a light amount not less than 50% in a region exceeding ±125° about the central axis set as 0°.

In the LED lightbulb according to the first aspect, preferably the globe may include a top portion, a maximum diameter portion and an exposed bottom portion, where the top portion and the exposed bottom portion are spaced apart from each other in the first direction, and the maximum diameter portion is located between the top portion and the exposed bottom portion. The maximum diameter portion has a maximum diameter in a cross-section orthogonal to the first direction, and the exposed bottom portion is smaller in diameter of the cross-section orthogonal to the first direction than the maximum diameter portion.

In the LED lightbulb according to the first aspect, preferably, a distance between the top portion and the maximum diameter portion in the first direction is greater than a distance between the exposed bottom portion and the maximum diameter portion in the first direction.

In the LED lightbulb according to the first aspect, preferably, the globe may include a constricted portion between the maximum diameter portion and the exposed bottom portion, the constricted portion protruding inwardly.

In the LED lightbulb according to the first aspect, preferably, the globe may have a transmittance of 60 to 65%, and a light emission rate indicating a ratio of a total light flux transmitted through the globe to a total light flux from the light emitting unit may be not less than 90%.

In the LED lightbulb according to the first aspect, preferably, the light emitting unit may include an LED substrate on which said at least one LED chip is mounted.

In the LED lightbulb according to the first aspect, preferably, the LED substrate may be formed of a ceramic.

In the LED lightbulb according to the first aspect, preferably, a plurality of LED chips including the above-mentioned at least one LED chip may be arranged in a matrix pattern on the LED substrate.

In the LED lightbulb according to the first aspect, preferably, the light emitting unit may include an encapsulating resin that encapsulates therein the above-mentioned at least one LED chip and transmits the light from said at least one LED chip.

In the LED lightbulb according to the first aspect, preferably, the encapsulating resin may contain a fluorescent material that emits light of a frequency different from that of the light from the above-mentioned at least one LED chip upon being excited by the light from said at least one LED chip.

In the LED lightbulb according to the first aspect, preferably, the mounting surface may include a pair of wiring openings spaced from each other across the light emitting unit, and wiring elements may pass through the wiring openings, respectively, for connecting the light emitting unit and the power source unit.

In the LED lightbulb according to the first aspect, preferably, the LED substrate may have a rectangular shape.

In the LED lightbulb according to the first aspect, preferably, the LED substrate may be formed with a pair of pads spaced apart from each other in a diagonal direction of the LED substrate, and each of the wiring elements may extend along a side of the LED substrate between a corresponding one of the wiring openings and a corresponding one of the pads.

In the LED lightbulb according to the first aspect, preferably, the mounting surface may be flat.

In the LED lightbulb according to the first aspect, preferably, the pedestal may include a disk portion that serves as the mounting surface.

In the LED lightbulb according to the first aspect, preferably, the power source chamber may comprise a round column-shaped space having a central axis extending in the first direction, the power source chamber being closed at an end thereof by the disk portion.

In the LED lightbulb according to the first aspect, preferably, each of the wiring openings may be elongated in a direction orthogonal to the first direction, and partially covered with the LED substrate.

In the LED lightbulb according to the first aspect, preferably, the heat dissipator may be formed with a sloped surface connected to the power source chamber, the sloped surface having a circular cross-section that increases in diameter as proceeding away from the base in the first direction, and the wiring openings and the sloped surface may overlap with each other as viewed in the first direction.

In the LED lightbulb according to the first aspect, preferably, wherein the wiring openings may be spaced apart from the LED substrate as viewed in the first direction.

In the LED lightbulb according to the first aspect, preferably, the heat dissipator may be formed with a pair of concave portions that overlap with the wiring openings respectively as viewed in the first direction, and each of the concave portions may be recessed from the above-mentioned end of the power source chamber in the first direction and also recessed in a direction orthogonal to the first direction.

The LED lightbulb thus configured can emit light to a broader region on the other side in the first direction. In the case, for example, where the LED lightbulb is attached to an illumination instrument provided on a ceiling, the other side in the first direction corresponds to the side of the ceiling. Accordingly, the LED lightbulb can properly illuminate a broader region from the floor to the ceiling of the room, as in the case of using an incandescent lightbulb.

A second aspect of the present invention provides an LED lightbulb including a light emitting unit including one or more LED chips and configured to emit light about a central axis extending to one side in a first direction, a pedestal on which the light emitting unit is mounted and having a mounting surface oriented to the one side in the first direction, a power source unit that supplies power to the light emitting unit, the power source unit being located on the other side in the first direction with respect to the pedestal, a heat dissipator attached to the pedestal on the other side in the first direction and including a power source chamber that accommodates therein the power source unit, a base attached to the heat dissipator on the other side in the first direction, and a globe formed so as to swell toward the one side in the first direction and to enclose therein the light emitting unit, and configured to diffusingly transmit the light from the light emitting unit. The mounting surface includes a pair of wiring openings spaced from each other across the light emitting unit, and a wiring connecting the light emitting unit and the power source unit is passed through the respective wiring opening.

In the LED lightbulb according to the second aspect, preferably the light emitting unit may include an LED substrate on which the one or more LED chips are mounted.

In the LED lightbulb according to the second aspect, preferably the LED substrate may be formed of a ceramic.

In the LED lightbulb according to the second aspect, preferably a plurality of the LED chips may be arranged in a matrix pattern on the LED substrate.

In the LED lightbulb according to the second aspect, preferably the light emitting unit may include an encapsulating resin that encapsulates therein the LED chips and transmits the light from the LED chips.

In the LED lightbulb according to the second aspect, preferably the encapsulating resin may contain a fluorescent material that emits light of a frequency different from that of the light from the LED chips upon being excited by the light from the LED chips.

In the LED lightbulb according to the second aspect, preferably the LED substrate may have a rectangular shape.

In the LED lightbulb according to the second aspect, preferably the LED substrate may include a pair of pads located with a spacing therebetween in a diagonal direction of the LED substrate, and the wiring may be arranged so as to extend between the corresponding wiring opening and one of the pads, along a side of the LED substrate.

In the LED lightbulb according to the second aspect, preferably the mounting surface may be flat.

In the LED lightbulb according to the second aspect, preferably the pedestal may include a disk portion that serves as the mounting surface.

In the LED lightbulb according to the second aspect, preferably the power source chamber may be a round column-shaped space, and the disk portion may close the power source chamber on the one side in the first direction.

In the LED lightbulb according to the second aspect, preferably the wiring openings may be elongated in a direction orthogonal to the first direction, and may be partially covered with the LED substrate.

In the LED lightbulb according to the second aspect, preferably the heat dissipator may be connected to an end portion of the power source chamber on the one side in the first direction, and may include a sloped surface having a circular cross-section the diameter of which increases toward the one side in the first direction. The wiring openings and the sloped surface may be located so as to overlap as viewed in the first direction.

In the LED lightbulb according to the second aspect, preferably the wiring openings may be spaced apart from the LED substrate as viewed in the first direction.

In the LED lightbulb according to the second aspect, preferably the heat dissipator may include a pair of concave portions each located so as to overlap with one of the wiring openings as viewed in the first direction, and recessed from the end portion of the power source chamber on the one side in the first direction toward a direction orthogonal to the first direction and to the other side in the first direction.

In the LED lightbulb according to the second aspect, preferably the light emitting unit may be configured to provide a light amount not less than 50% of a maximum light amount thereof in a region not exceeding ±60° about the central axis set as 0°, and the globe may be configured to provide a light amount not less than 50% in a region not exceeding ±125° about the central axis set as 0°.

In the LED lightbulb according to the second aspect, preferably the globe may include a top portion corresponding to an end portion thereof on the one side in the first direction, a maximum diameter portion where the diameter of a cross-section of the globe orthogonal to the first direction is largest, and an exposed bottom portion corresponding to an end portion of the exposed portion of the globe on the other side in the first direction, the exposed bottom portion being smaller in diameter of the cross-section orthogonal to the first direction than the maximum diameter portion.

In the LED lightbulb according to the second aspect, preferably a distance between the top portion and the maximum diameter portion in the first direction may be longer than a distance between the exposed bottom portion and the maximum diameter portion in the first direction.

In the LED lightbulb according to the second aspect, preferably the globe may include a constricted portion formed so as to inwardly protrude, at a position between the maximum diameter portion and the exposed bottom portion.

In the LED lightbulb according to the second aspect, preferably the globe may have a transmittance of 60 to 65%, and a light emission rate indicating a ratio of a total light flux transmitted through the globe to a total light flux from the light emitting unit may be not less than 90%.

The foregoing configuration of the LED lightbulb prevents the pair of wiring openings from being unevenly located in the pedestal. Therefore, the pedestal and the light emitting unit can be located such that the respective center coincides with each other, which allows the LED lightbulb to be formed in a smaller size.

A third aspect of the present invention provides an LED lightbulb including a light emitting unit having one or more LED chips, a heat dissipator made of a metal and supporting the light emitting unit, and a globe that covers the light emitting unit and transmits light, the globe being formed so as to swell toward one side in a first direction and attached to a fixing facet provided at an end portion of the heat dissipator on the one side in the first direction. The fixing facet includes an outer circumferential portion surrounding an axis extending in the first direction and including protruding and recessed portions at least on a part thereof.

In the LED lightbulb according to the third aspect, preferably the protruding and recessed portions may include a plurality of protruding portions spaced from each other and grooves formed between adjacent ones of the protruding portions.

In the LED lightbulb according to the third aspect, preferably the protruding portions and the grooves may be formed in a strip shape so as to extend in a predetermined direction, and alternately aligned in a predetermined pitch.

In the LED lightbulb according to the third aspect, preferably the fixing facet may have a disk shape having a central axis extending in the first direction.

In the LED lightbulb according to the third aspect, preferably the protruding portions and the grooves may be aligned circumferentially of the fixing facet.

In the LED lightbulb according to the third aspect, preferably a pitch between the adjacent protruding portions may be 1 to 5 mm.

In the LED lightbulb according to the third aspect, preferably the protruding portions may have a rectangular cross-section.

In the LED lightbulb according to the third aspect, preferably a ratio of an interval between the adjacent protruding portions to the pitch between the adjacent protruding portions may be 30 to 50%.

In the LED lightbulb according to the third aspect, preferably a ratio of a depth of the grooves to a width of the protruding portions may be 25 to 50%.

In the LED lightbulb according to the third aspect, preferably the protruding portions may each have a trapezoidal cross-section. A ratio of a width of a bottom portion of the protruding portions to the pitch between the adjacent the protruding portions may be 50 to 100%, and a ratio of a width of a top portion of the protruding portions to the pitch between the adjacent protruding portions may be 25 to 50%.

In the LED lightbulb according to the third aspect, preferably the protruding and recessed portions may include a plurality of groove's spaced from each other and protruding portions formed between adjacent ones of the grooves.

In the LED lightbulb according to the third aspect, preferably the protruding and recessed portions may include a plurality of dimples.

In the LED lightbulb according to the third aspect, preferably an interval between adjacent ones of the dimples may be 50 μm to 0.5 mm.

In the LED lightbulb according to the third aspect, preferably a depth of the dimples may be not less than 0.1 mm.

In the LED lightbulb according to the third aspect, preferably the plurality of dimples may be formed through a sandblasting process.

In the LED lightbulb according to the third aspect, preferably the protruding portions may each have a smooth end portion, and a pitch between the adjacent protruding portions may be 50 μm to 2 mm.

In the LED lightbulb according to the third aspect, preferably the protruding portions may each have a rectangular cross-section, and an interval between the adjacent protruding portions may be 50 μm to 1 mm.

In the LED lightbulb according to the third aspect, preferably a ratio of an interval between the adjacent protruding portions to the pitch between the adjacent protruding portions may be 30 to 50%.

In the LED lightbulb according to the third aspect, preferably a depth of the grooves may be 50 μm to 1 mm.

In the LED lightbulb according to the third aspect, preferably a ratio of the depth of the grooves to a width of the protruding portions may be 25 to 50%.

In the LED lightbulb according to the third aspect, preferably the protruding portions may each have a trapezoidal cross-section. A ratio of a width of a bottom portion of the protruding portions to the pitch between the adjacent the protruding portions may be 50 to 100%, and a ratio of a width of a top portion of the protruding portions to the pitch between the adjacent protruding portions may be 25 to 50%.

In the LED lightbulb according to the third aspect, preferably the heat dissipator may include a first member and a second member fixed to the first member and including the fixing facet.

In the LED lightbulb according to the third aspect, preferably the fixing facet may include a maximum diameter portion having a largest size in a direction orthogonal to the first direction.

In the LED lightbulb according to the third aspect, preferably the protruding and recessed portions may be provided on the entirety of the outer circumferential portion.

In the LED lightbulb according to the third aspect, preferably the protruding and recessed portions may be separately provided in a plurality of regions on the outer circumferential portion spaced from each other at a predetermined interval.

In the LED lightbulb according to the third aspect, preferably the heat dissipator may include a plurality of fins each radially projecting outward and extending from a portion of the heat dissipator on the other side in the first direction to the fixing facet, and a plurality of dimples constituting the protruding and recessed portions may be formed on an outer circumferential surface of the plurality of fins.

A fourth aspect of the present invention provides an LED lightbulb including one or more LED chips, a substrate including a base member having a mounting surface and a back surface oriented opposite to each other, the substrate supporting the LED chips on the mounting surface, a power source unit located opposite to the LED chips with respect to the substrate and configured to supply power for causing the LED chips to emit light, a base located opposite to the substrate with respect to the power source unit, and a globe that covers the LED chips and transmits the light from the LED chips. The substrate includes an interconnect pattern provided on the mounting surface of the base member, a pad provided on the back surface of the base member, and a conductive portion for electrical connection between the interconnect pattern and the pad, the pad being electrically connected to the LED chips, and the LED lightbulb including a wiring having an end portion connected to the power source unit and the other end portion connected to the pad.

In the LED lightbulb according to the fourth aspect, preferably the substrate may include a pair of openings, and the wiring may be routed from the power source unit to the back surface of the base member through one of the pair of openings, via the mounting surface of the base member, and through the other of the pair of openings.

Preferably, the LED lightbulb according to the fourth aspect may further include a seal material that closes the pair of openings.

In the LED lightbulb according to the fourth aspect, preferably the seal material may be formed of an insulative resin.

In the LED lightbulb according to the fourth aspect, preferably the pair of openings may be filled with the seal material.

In the LED lightbulb according to the fourth aspect, preferably one of the pair of openings may be located closer to the pad than the other as viewed in a depthwise direction of the base member, and the wiring may be routed from the power source unit to the mounting surface of the base member through the opening more distant from the pad, and from the mounting surface of the base member to the back surface thereof through the opening closer to the pad.

In the LED lightbulb according to the fourth aspect, preferably a plurality of the LED chips may be arranged in an annular shape as viewed in the depthwise direction of the base member, and the pair of openings and the pad may be located inside the plurality of LED chips as viewed in the depthwise direction of the base member.

In the LED lightbulb according to the fourth aspect, preferably the conductive portion may be formed so as to penetrate through the base member.

In the LED lightbulb according to the fourth aspect, preferably the wiring may be soldered to the pad.

Preferably, the LED lightbulb according to the fourth aspect may further include a radiator provided on the mounting surface of the base member, the radiator having a higher radiation rate than the mounting surface of the substrate.

In the LED lightbulb according to the fourth aspect, preferably the radiator may have a higher specific heat than the base member.

In the LED lightbulb according to the fourth aspect, preferably the radiator may be formed of a ceramic.

In the LED lightbulb according to the fourth aspect, preferably the radiator may be finished in a black color.

In the LED lightbulb according to the fourth aspect, preferably an inner surface of the globe may be subjected to a cold mirror coating process.

Preferably, the LED lightbulb according to the fourth aspect may further include a heat dissipator that supports the substrate, the heat dissipator including an exposed portion exposed from the substrate in a direction in which the substrate extends.

In the LED lightbulb according to the fourth aspect, preferably the heat dissipator may be formed of aluminum, and the exposed portion may be subjected to an alumite treatment.

In the LED lightbulb according to the fourth aspect, preferably the heat dissipator may include a power source cavity in which the power source unit is to be stored.

In the LED lightbulb according to the fourth aspect, preferably the base may be located opposite to the globe with respect to the heat dissipator.

The foregoing configuration restricts bromine, for example contained in the solder used for connecting the other end of the wiring to the pad, from directly reaching the LED chip even though the bromine in the solder is emitted. Therefore, the decrease in light amount of the LED lightbulb can be suppressed.

A fifth aspect of the present invention provides an LED lightbulb including thereinside an LED chip, and a dimming control unit that controls light from the LED chip in stages with a pulse-width modulation signal. The dimming control unit is activated to generate the pulse-width modulation signal by an off-on action of an external switch connecting an external AC power source and inside of the LED lightbulb.

The LED lightbulb according to the fifth aspect includes the LED chip and the dimming control unit that controls the light from the LED chip in stages with a pulse-width modulation signal, and the dimming control unit is activated to generate the pulse-width modulation signal by an off-on action of an external switch connecting an external AC power source and inside of the LED lightbulb. Such a configuration allows the dimming control of the LED lightbulb to be easily performed, simply by attaching the LED lightbulb to a socket for the existing incandescent lightbulb and turning on and off a switch usually provided on a roof wall.

Other features and advantages of the present invention will become more apparent through detailed description given below with reference to the accompanying drawings.

BRIEF DESCRIPTION OF THE DRAWINGS

FIG. 44 is a cross-sectional view taken along a line XLIV-XLIV in FIG. 43;

DETAILED DESCRIPTION OF THE PREFERRED EMBODIMENTS

Preferred embodiments of the present invention will be described below with reference to the accompanying drawings.

Figure 1:
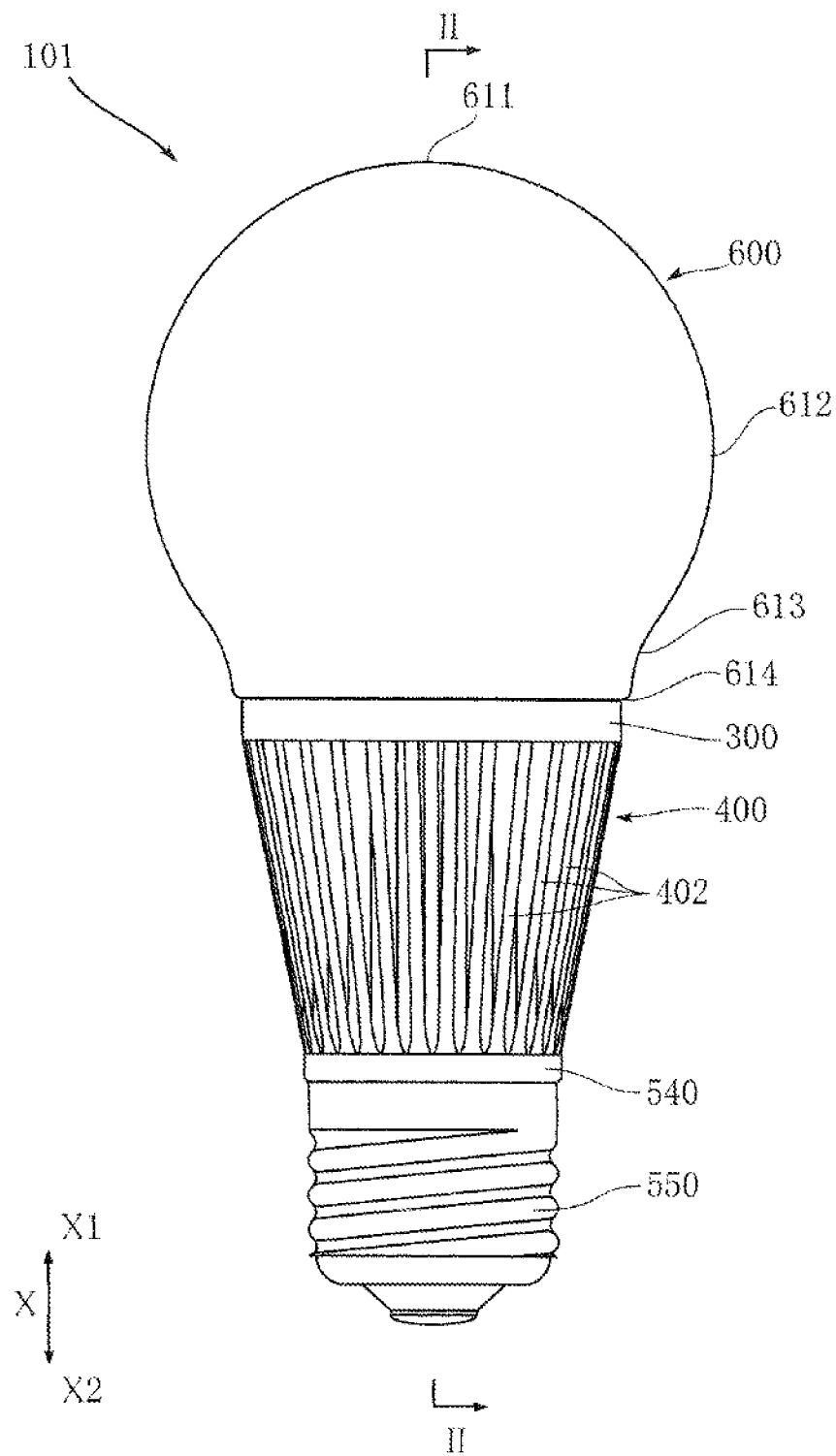
FIG. 1 is a front view showing an LED lightbulb according to a first embodiment of the present invention.
Figure 2:
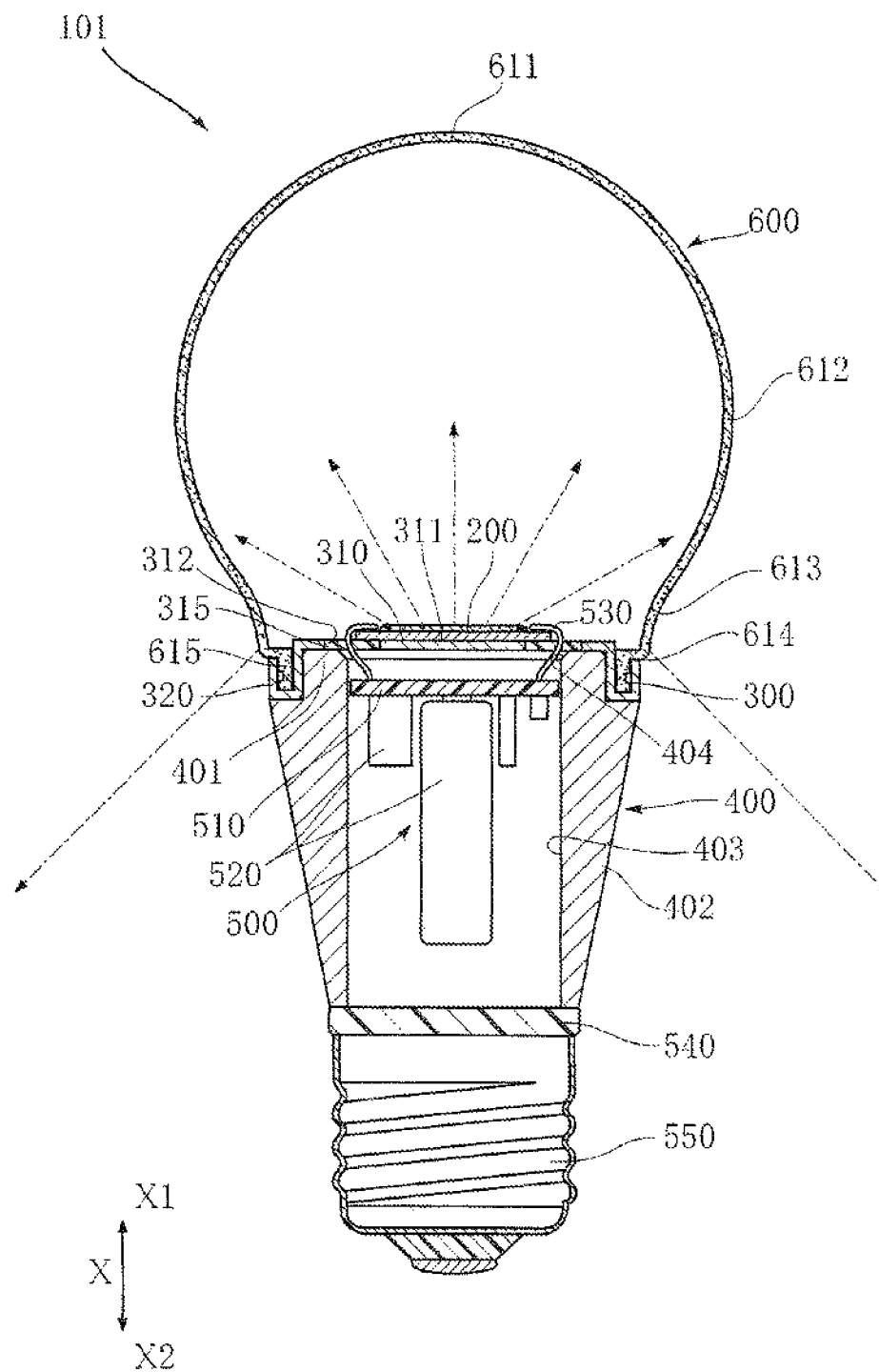
FIG. 2 is a cross-sectional view taken along a line II-II in FIG. 1.
Figure 3:
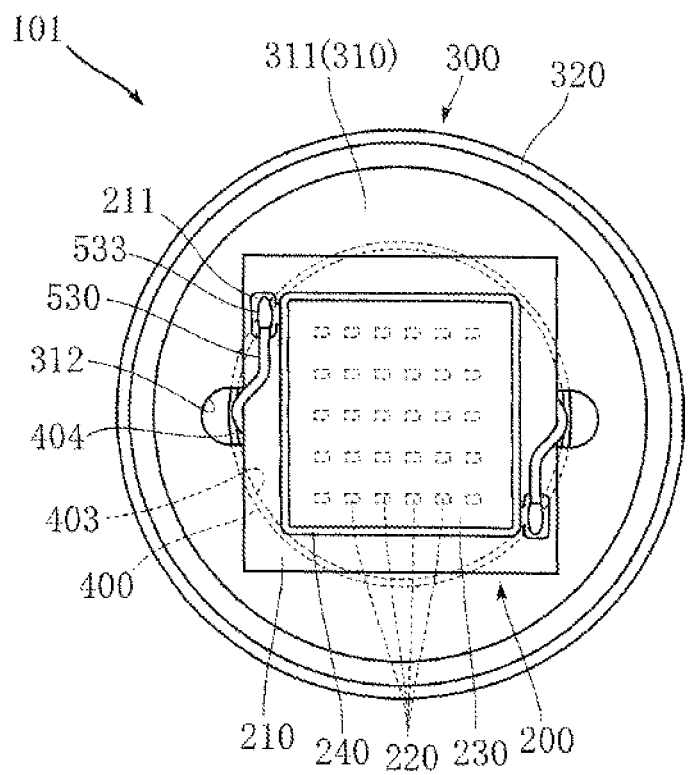
FIG. 3 is a plan view showing an essential part of the LED lightbulb shown in FIG. 1.

FIGS. 1 to 3 depict an LED lightbulb according to a first embodiment of the present invention. The LED lightbulb 101 according to this embodiment includes a light emitting unit 200, a pedestal 300, a heat dissipator 400, a power source unit 500, a base 550, and a globe 600. The LED lightbulb 101 is for use with an illumination instrument as substitute for a common incandescent lightbulb, and has an overall size of approximately 123 mm in an X-direction. In FIG. 3, the globe 600 and an encapsulating resin 315 to be subsequently described are not illustrated.

Figure 7:
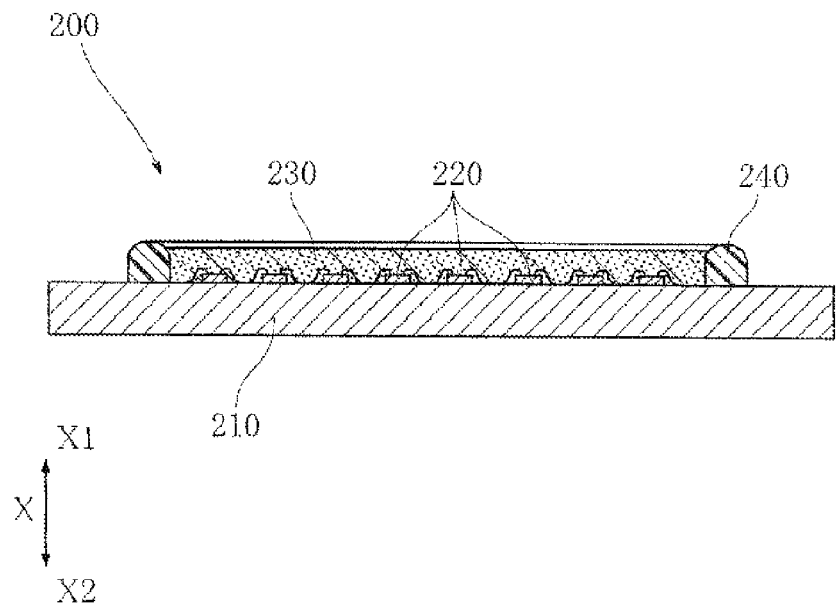
FIG. 7 is a cross-sectional view of a light emitting unit included in the LED lightbulb shown in FIG. 1.

The light emitting unit 200 is generally formed in a rectangular thin plate shape, as shown in FIG. 3. FIG. 7 is a cross-sectional view of the light emitting unit 200 taken along a plane orthogonal to the X-direction. As shown in FIG. 7, the light emitting unit 200 includes an LED substrate 210, a plurality of LED chips 220, an encapsulating resin 230, and a weir 240. The LED substrate 210 has a rectangular shape, and is formed of a ceramic such as alumina. On the LED substrate 210, the plurality of LED chips 220 are mounted and an interconnect pattern (not shown) serving as the channel for supplying power to the LED chips 220 is provided. As shown in FIG. 3, a pair of pads 211 is provided on the LED substrate 210. The pair of pads 211 is formed of a metal such as Cu or Ag, and located with a spacing therebetween in a diagonal direction of the LED substrate 210. The pads 211 are electrically connected to the interconnect pattern.

The LED chips 220 each include a p-type semiconductor layer and an n-type semiconductor layer, for example formed of a GaN-based semiconductor material, and an active layer interposed between the p-type semiconductor layer and the n-type semiconductor layer, and are configured to emit blue light, for example. In this embodiment, as shown in FIG. 7, the LED chips 220 are of a 2-wire type, connected to the interconnect pattern on the LED substrate 210 through two wires. Alternatively, a 1-wire type or flip-chip type chip may be employed. As shown in FIG. 3, the LED chips 220 are arranged in a matrix pattern on the LED substrate 210.

The encapsulating resin 230 serves to encapsulate the plurality of LED chips 220 as shown in FIG. 7, and is formed of a resin that transmits the light from the LED chip 220, such as a silicone resin or an epoxy resin. The encapsulating resin 230 also contains a fluorescent material that emits yellow light upon being excited by the blue light from the LED chip 220. The encapsulating resin 230 may alternatively contain fluorescent materials that emit, upon being excited by the blue light, green light and red light respectively. The weir 240 is formed in a rectangular frame shape on the LED substrate 210 as shown in FIG. 7, and formed of, for example, a white silicone resin. The weir 240 serves to block the liquid-phase resin in the formation process of the encapsulating resin 230, thus preventing the resin from flowing out to an unintended region.

As shown in FIGS. 3 and 7, the surface of the encapsulating resin 230 on the light emitting unit 200 on an X1-side in the X-direction X1 is flat, and the light is emitted through this flat surface. The light from the light emitting unit 200 is emitted to the X1-side about a central axis extending in the X-direction. The light from the light emitting unit 200 having an amount not less than 50% of the maximum light amount thereof is provided in a region not exceeding ±60°, upon setting the central axis as 0°. In other words, the region where the light amount is not less than 50% of the maximum light amount is not broader than 120°.

Figure 4:
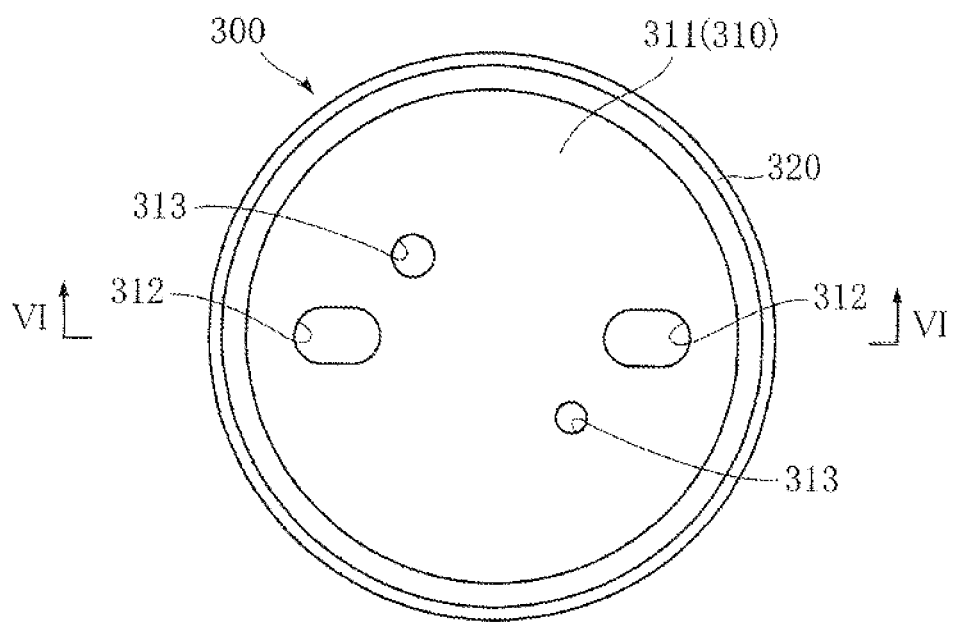
FIG. 4 is a plan view showing a pedestal included in the LED lightbulb shown in FIG. 1.
Figure 5:
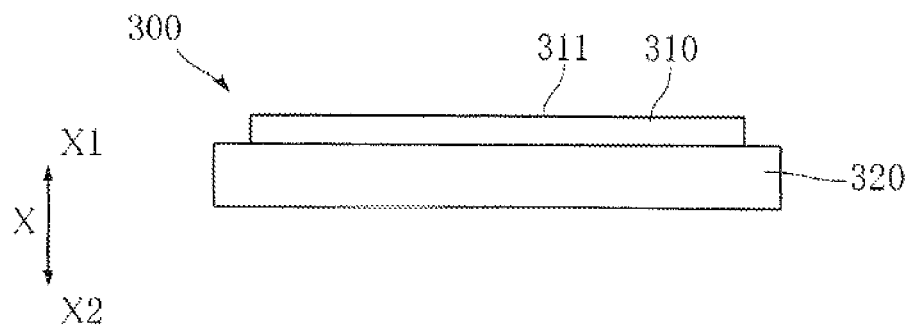
FIG. 5 is a front view of the pedestal shown in FIG. 4.
Figure 6:
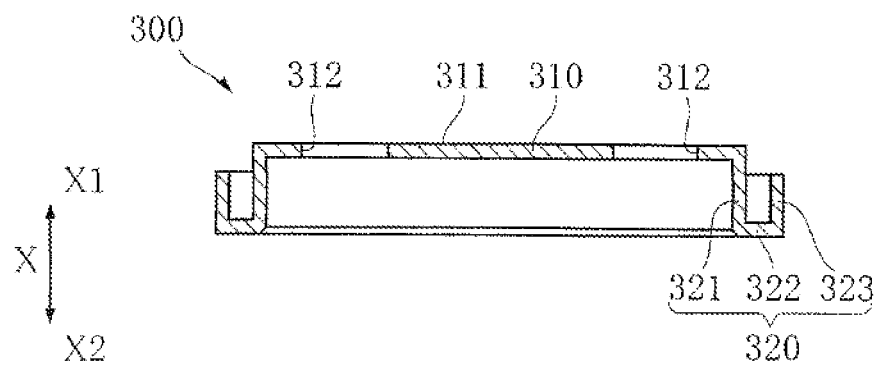
FIG. 6 is a cross-sectional view taken along a line VI-VI in FIG. 4.

The pedestal 300 is formed of a metal such as aluminum, and includes a disk portion 310 and a frame-shaped joint portion 320. The disk portion 310 has a disk shape in the X-direction view, and is approximately 35 mm in diameter and approximately 1 mm in thickness. The surface of the disk portion 310 on the X1-side in the X-direction is utilized as a mounting surface 311. The light emitting unit 200 is mounted on the mounting surface 311, for example by means of an adhesive. Referring to FIGS. 4 to 6, the disk portion 310 includes a pair of wiring openings 312 and a pair of fixing openings 313. The wiring openings 312 are located with a spacing therebetween so as to be spaced apart from each other in a radial direction of the disk portion 310, and each of the wiring openings is formed in an oval shape, elongated in the radial direction. As shown in FIG. 3, the wiring openings 312 are partially covered with the LED substrate 210. The fixing openings 313 are located closer to the center of the disk portion 310 than is the pair of wiring openings 312, and covered with the LED substrate 210. The fixing openings 313 serve for positioning the power source unit 500 with respect to the pedestal 300.

The frame-shaped joint portion 320 is utilized for fixing the heat dissipator 400 and the globe 600 to the pedestal 300. The frame-shaped joint portion 320 includes an inner cylindrical portion 321, an annular bottom portion 322, and an outer cylindrical portion 323. The inner cylindrical portion 321 is a cylindrical portion extending from the outer circumferential edge of the disk portion 310 to the X2-side in the X-direction. The size of the inner cylindrical portion 321 in the X-direction is, for example, approximately 6.4 mm. The annular bottom portion 322 extends outward from the end portion of the inner cylindrical portion 321 on the X2-side in the X-direction, forming an annular portion of approximately 35 mm in inner diameter and approximately 38 mm in outer diameter. The outer cylindrical portion 323 is a cylindrical portion extending from the outer circumferential edge of the annular bottom portion 322 to the X1-side in the X-direction. The size of the outer cylindrical portion 323 in the X-direction is, for example, approximately 4.4 mm.

Figure 8:
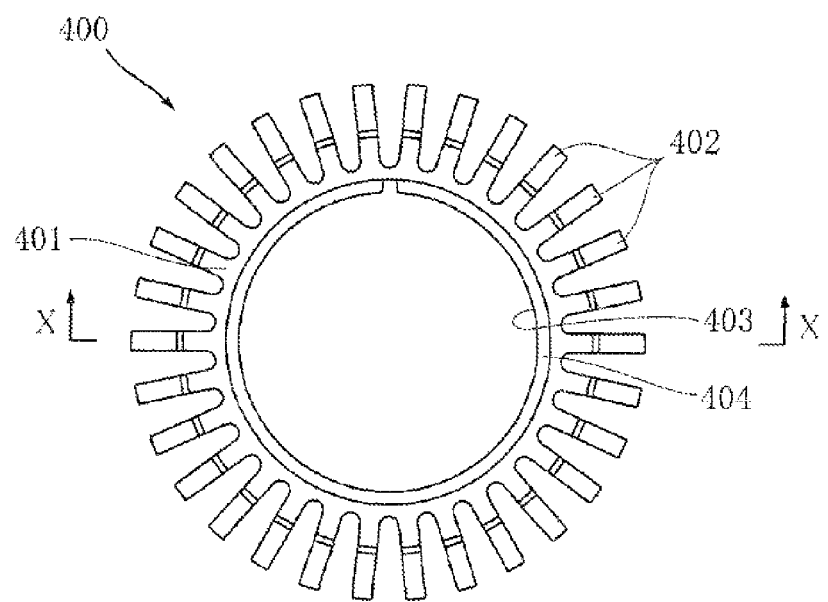
FIG. 8 is a plan view showing a heat dissipator included in the LED lightbulb shown in FIG. 1.
Figure 9:
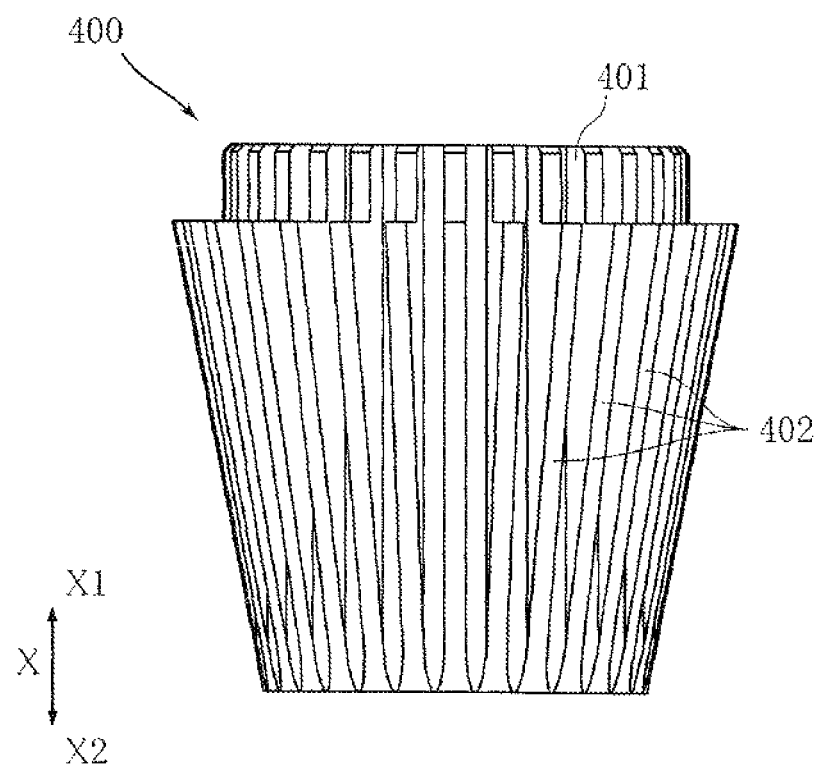
FIG. 9 is a front view of the heat dissipator included in the LED lightbulb shown in FIG. 1.
Figure 10:
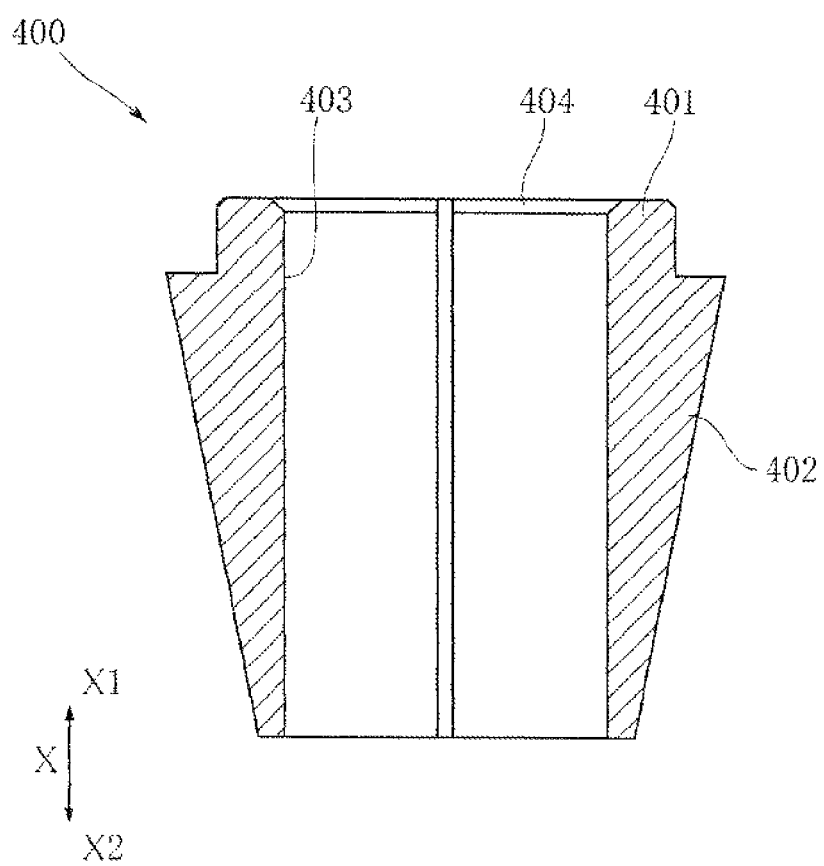
FIG. 10 is a cross-sectional view taken along a line X-X in FIG. 8.
Figure 11:
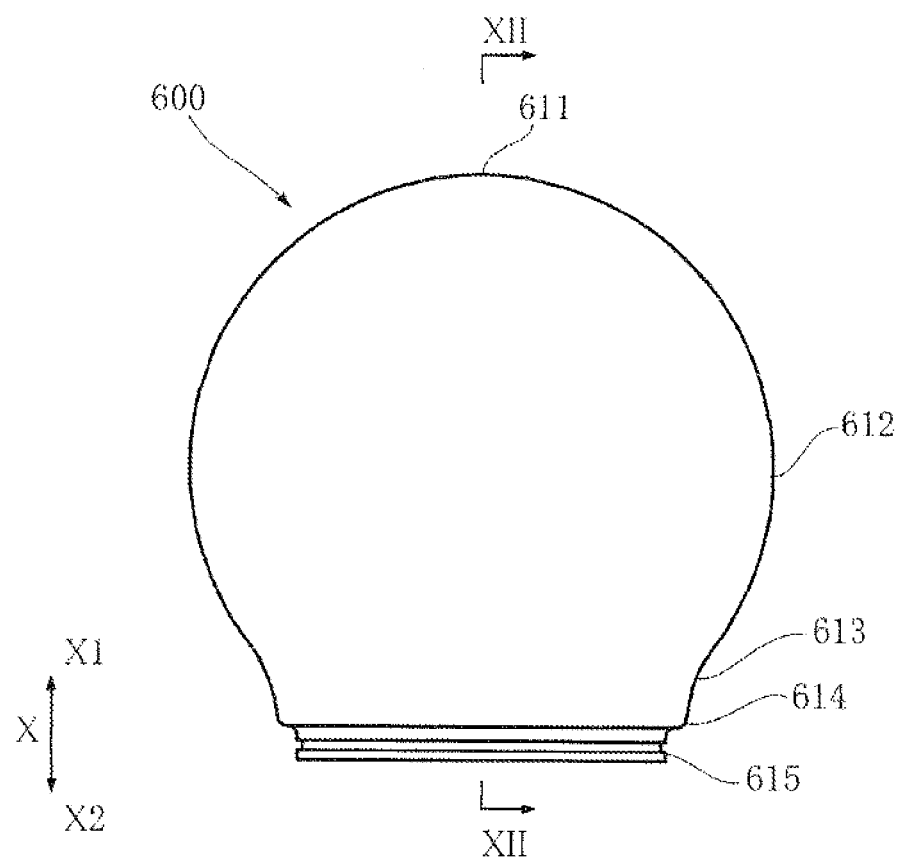
FIG. 11 is a front view showing a globe included in the LED lightbulb shown in FIG. 1.
Figure 12:
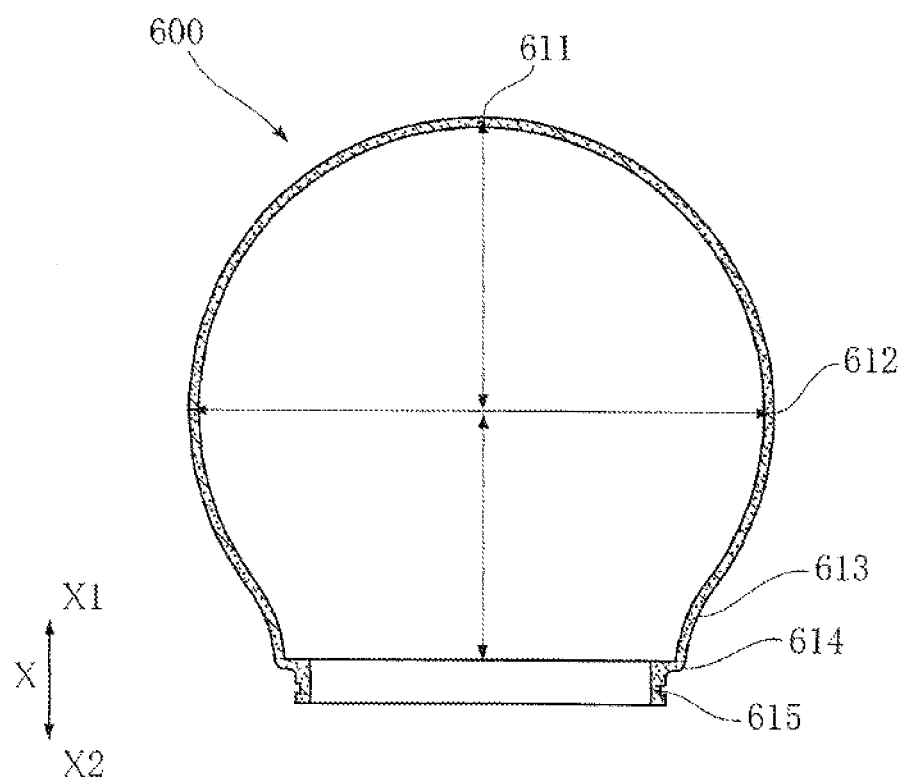
FIG. 12 is a cross-sectional view taken along a line XII-XII in FIG. 11.

The pedestal 300 is attached to the heat dissipator 400 as shown in FIG. 2, and the heat dissipator 400 includes a protruding joint portion 401, a plurality of fins 402, and a power source chamber 403 as shown in FIGS. 8 to 10. It is preferable to employ a material having high heat conductivity to form the heat dissipator 400, for example a metal such as aluminum. The overall size of the heat dissipator 400 in the X-direction is approximately 38 mm, the maximum diameter is approximately 40 mm, and the diameter of the end portion on the X-2 side in the X-direction is approximately 27 mm.

The protruding joint portion 401 is formed so as to stick out to the X1-side in the X-direction, and in an annular shape of approximately 33 mm in outer diameter and approximately 5 mm in length in the X-direction. As shown in FIG. 2, the protruding joint portion 401 fits inside the inner cylindrical portion 321 of the pedestal 300. The pedestal 300 and the heat dissipator 400 are coupled for example by means of an adhesive. The plurality of fins 402 are radially formed about an axis extending in the X-direction, as shown in FIGS. 8 to 10. The fins 402 serve to improve the heat-releasing performance of the heat dissipator 400. The power source chamber 403 is a round column-shaped space formed so as to penetrate through the heat dissipator 400, and used for accommodating the power source unit 500. The heat dissipator 400 includes a sloped surface 404. The sloped surface 404 is connected to the end portion of the power source chamber on the X-1 side in the X-direction and has a circular cross-section the diameter of which increases toward the X1-side in the X-direction. As shown in FIG. 3, the sloped surface 404 overlaps with the pair of wiring openings 312 in the X-direction view.

The power source unit 500 generates a DC power suitable for activating the light emitting unit 200 (LED chip 220), for example from a commercial AC power of 100 V and supplies the DC power to the light emitting unit 200 (LED chip 220). As shown in FIG. 2, the power source unit 500 includes a power supply substrate 510, a plurality of electronic parts 520, and wiring 530. The power supply substrate 510 and the electronic parts 520 constituting the power source unit 500 are accommodated in the power source chamber 403 of the heat dissipator 400.

The power supply substrate 510 is formed of, for example, a glass composite copper-clad laminate, in a circular shape as a whole. The power supply substrate 510 is located on the X-2 side of the disk portion 310 of the pedestal 300, in the X-direction. The power supply substrate 510 includes a plurality of projections (not shown). The projections serve for positioning the power supply substrate 510 with respect to the pedestal 300, upon being inserted in the fixing openings 313 shown in FIG. 4. The plurality of electronic parts 520 are mounted on the surface of the power supply substrate 510 on the X2-side in the X-direction.

The plurality of electronic parts 520 serve to convert, for example, the commercial AC power of 100 V into the DC power suitable for activating the light emitting unit 200 (LED chip 220). The electronic parts 520 include a capacitor, a resistor, a coil, a diode, an IC, and so forth. In FIG. 2, for example the most outstanding one of the electronic parts 520 projecting to the X2-side in the X-direction is the capacitor.

The wiring 530 serves to conduct the DC power from the electronic parts 520 to the light emitting unit 200. The wiring 530 is arranged from the power supply substrate 510 to the light emitting unit 200 through the pair of wiring openings 312 of the pedestal 300. An encapsulating resin 315 is loaded in each wiring opening 312, except for the region where the wiring 530 is present. The encapsulating resin 315 is composed of an insulative resin and serves to ensure air-tightness between the space in the globe 600 and the power source chamber 403. As shown in FIGS. 2 and 3, the wiring 530 and the sloped surface 404 of the heat dissipator 400 partially overlap in the X-direction view. The portion of the wiring 530 bent so as to circumvent the LED substrate 210 overlaps with the sloped surface 404. The leading end of the wiring 530 is, as shown in FIG. 3, connected to the pad 211 formed on the LED substrate 210 by means of a solder 533. In a region between the wiring opening 312 and the pad 211, the wiring 530 is arranged so as to extend along a side of the LED substrate 210 formed in a rectangular shape.

The base 550 is the portion to be attached to an illumination instrument designed for common electric bulbs conforming to e.g. JIS, and fixed to the heat dissipator 400 via an insulating spacer 540. In this embodiment, the base 550 is so designed as to conform to JIS. The base 550 is connected to the power source unit 500 through wiring.

The globe 600 covers the light emitting unit 200, and is formed so as to swell toward the X1-side in the X-direction. The globe 600 is formed of a milk-white semitransparent resin, for example composed of a polycarbonate resin with a diffusion agent mixed therein. In this embodiment, the transmittance of the globe 600 is 60 to 65%. The globe 600 has a thickness of approximately 1 mm, and an X-direction size of approximately 60 mm.

Referring to FIGS. 1, 2, 11, and 12, the globe 600 includes a top portion 611, a maximum diameter portion 612, a constricted portion 613, an exposed bottom portion 614, and a cylindrical joint portion 615. The top portion 611 corresponds to the farthest portion to the X-1 side in the X-direction. The maximum diameter portion 612 corresponds to the portion of the globe 600 where the diameter of a cross-section orthogonal to the X-direction is largest. In this embodiment, the diameter of the maximum diameter portion 612 is approximately 60 mm. The exposed bottom portion 614 is, as shown in FIG. 1, the end portion on the X2-side in the X-direction, of the visibly exposed portion of the globe 600. The diameter of the exposed bottom portion 614 is approximately 42 mm. The distance between the maximum diameter portion 612 and the top portion 611 in the X-direction is approximately 30 mm, and the distance between the maximum diameter portion 612 and the exposed bottom portion 614 is approximately 26 mm. In other words, the maximum diameter portion 612 is more distant from the top portion 611 than from the exposed bottom portion 614, in the X-direction.

As shown in FIGS. 1, 2, 11, and 12, the constricted portion 613 is located between the maximum diameter portion 612 and the exposed bottom portion 614, and formed so as to slightly protrude inwardly of the globe 600. The cylindrical joint portion 615 is formed so as to extend from the exposed bottom portion 614 to the X-2 side in the X-direction, and has a round column shape of approximately 38 mm in outer diameter and approximately 3.5 mm in X-direction length. As shown in FIG. 2, the cylindrical joint portion 615 is fitted between the inner cylindrical portion 321 and the outer cylindrical portion 323 of the frame-shaped joint portion 320 in the pedestal 300, and bonded by means of an adhesive, for example. The globe 600 is thus fixed to the pedestal 300.

Figure 13:
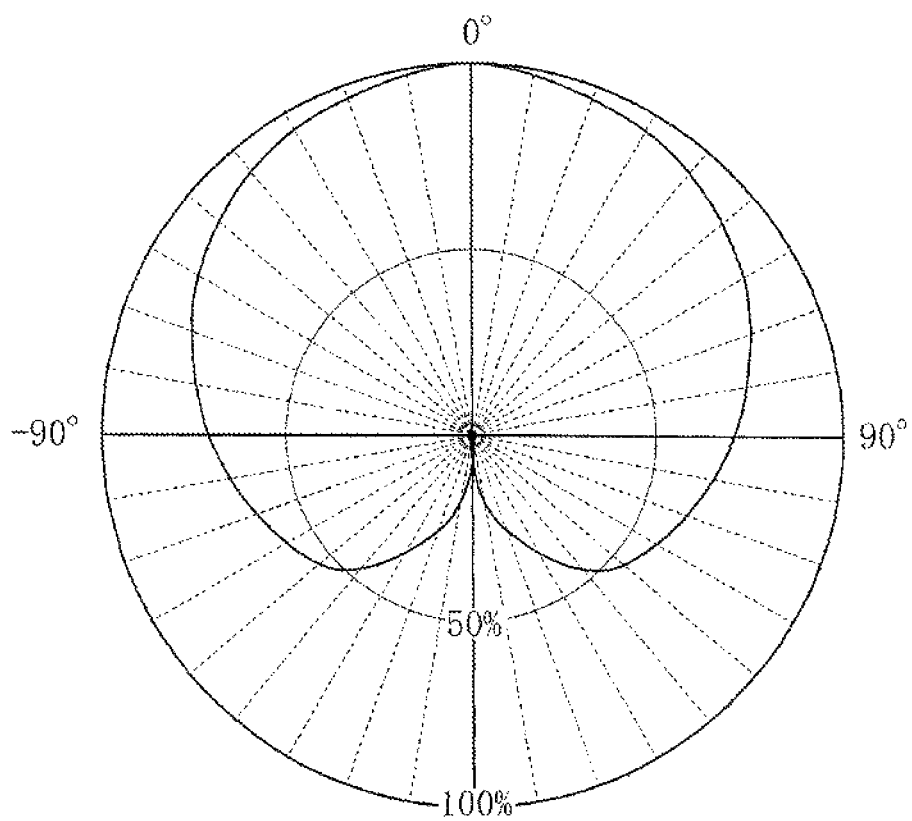
FIG. 13 is a graph showing a light distribution characteristic of the LED lightbulb shown in FIG. 1.

In this embodiment, as shown in FIG. 2, the upper surface of the encapsulating resin 230 of the light emitting unit 200 is located so as to be aligned with the constricted portion 613, or at a level between the constricted portion 613 and the exposed bottom portion 614, in the X-direction. FIG. 13 illustrates a light distribution characteristic of the light emitted from the LED lightbulb 101, in other words from the globe 600. In FIG. 13, the central axis extending from the center of the light emitting unit 200 to the X-1 side in the X-direction corresponds to 0°. The amount of the light from the globe 600 is largest at the azimuth of 0°, and denoted as 100% in FIG. 13. A light amount not less than 50% of the maximum light amount is secured in a region not narrower than the azimuth of ±125°. In other words, the region where the light amount is not less than 50% of the maximum light amount is not narrower than 250°. In this embodiment, a light amount not less than 50% of the maximum light amount is secured in a region not narrower than the azimuth of ±135°. In other words, the region where the light amount is not less than 50% of the maximum light amount is as broad as 270°.

The LED lightbulb 101 offers the following advantageous effects.

The LED lightbulb according to this embodiment can emit light to a broader region on the X2-side in the X-direction. In the case, for example, where the LED lightbulb 101 is attached to an illumination instrument provided on a ceiling, the X2-side in the X-direction corresponds to the side of the ceiling. Accordingly, the LED lightbulb 101 can properly illuminate a broader region from the floor to the ceiling of the room, as in the case of using an incandescent lightbulb.

The portion of the globe 600 on the X2-side from the maximum diameter portion 612 in the X-direction is oriented to the X2-side in the X-direction rather than the X1-side. Accordingly, the light emitted from such a portion efficiently proceeds to the region on the X2-side in the X-direction. Consequently, the LED lightbulb 101 can more brightly illuminate the region on the X2-side in the X-direction.

The portion of the constricted portion 613 on the X1-side in the X-direction is oriented to the X2-side at a gentler angle. Therefore, the light emitted from such a portion more efficiently travels to the X2-side in the X-direction X2-side.

Setting the transmittance of the globe 600 as 60 to 65% allows the light from the light emitting unit 200 to be efficiently emitted while properly diffusing the light. In this embodiment, a light emission rate, indicating a ratio of a total light flux transmitted through the globe 600 to a total light flux from the light emitting unit 200 is not less than 90%, which is significantly high. According to the studies performed by the present inventors, it has proved that setting the transmittance of the globe 600 at less than 60% leads to undue decline in the light emission rate, without a remarkable improvement in light diffusion effect. Conversely, it has proved that setting the transmittance of the globe 600 at not less than 65% results in the light distribution characteristic of the LED lightbulb 101 being narrowed to less than 250°.

In this embodiment, the light emitting unit 200 is located on the X2-side in the X-direction in the globe 600, and the upper surface of the encapsulating resin 230, which is the light-emitting surface, is flat. Accordingly, a portion of the light emitted from the light emitting unit 200 reflected inwardly by a portion of the globe 600 is more likely to be transmitted outward through another portion of the globe 600, than absorbed by the light emitting unit 200. Such a configuration contributes to improving the light emission rate of the LED lightbulb 101.

Locating the pair of wiring openings 312 with a spacing therebetween across the light emitting unit 200 prevents the wiring openings 312 from being unevenly located in the pedestal 300. Locating the wiring openings 312 at biased positions often leads to deviation of the light emitting unit 200 with respect to the pedestal 300, which would naturally produce uneven light amount distribution from the LED lightbulb 101. The configuration according to this embodiment allows the center of the pedestal 300 and that of the light emitting unit 200 to coincide, thereby assuring uniform light amount distribution from the LED lightbulb 101. Such a configuration can be achieved by preparing, in the manufacturing process of the LED lightbulb 101, a jig having positioning projections that respectively fit in the pair of wiring openings 312, and setting the light emitting unit 200 in position on the pedestal 300 utilizing the jig tentatively placed thereon.

Locating the wiring openings 312 as above also facilitates connection of each wiring 530 to a corresponding one of the pair of pads 211 diagonally spaced from each other. Placing the pads 211 with a spacing therebetween diagonally of the LED substrate 210 prevents complication of the routing of the interconnect pattern, provided for supplying power to the plurality of LED chips 220 arranged in a matrix pattern.

Routing the wiring 530 from the wiring opening 312 to the pad 211 along a side of the LED substrate 210 allows the portion located along the side of the LED substrate 210 to serve as a buffer in case that an unexpected force is applied to the wiring 530 to the X2-side in the X-direction. This leads to a reduced load imposed on the solder 533. Further, loading the encapsulating resin 315 in the wiring opening 312 prevents an external force applied to the wiring 530 from affecting the solder 533.

As shown in FIG. 2, forming the sloped surface 404 on the heat dissipator 400 allows the wiring 530 to be routed from the power supply substrate 510 to the light emitting unit 200 so as to circumvent the LED substrate 210. To arrange the wiring 530 without forming the sloped surface 404 the power source chamber 403 would have to be made larger, which is undesirable because it leads to an increase in size of the heat dissipator 400. Therefore, providing the sloped surface 404 as in this embodiment contributes to reducing the size of the LED lightbulb 101 without the need to reduce the size of the light emitting unit 200.

Figure 14:
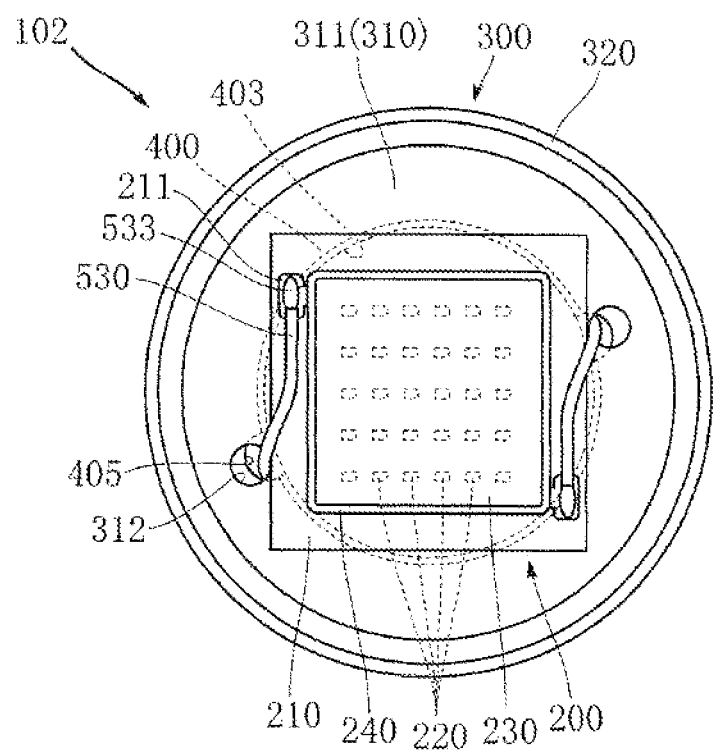
FIG. 14 is a plan view showing an essential part of an LED lightbulb according to a second embodiment of the present invention.

FIG. 14 depicts an LED lightbulb according to a second embodiment of the present invention. In FIG. 14, constituents the same as or similar to those of the foregoing embodiment are given the same numeral. The LED lightbulb 102 according to this embodiment is different from the foregoing LED lightbulb 101 in the configuration of the pair of wiring openings 312 of the pedestal 300 and the heat dissipator 400.

In this embodiment, the wiring openings 312 are formed in a circular shape. In addition, neither of the pair of wiring openings 312 is located so as to overlap with the LED substrate 210. The respective wiring openings 312 are located closer to diagonal corners of the LED substrate 210, than to the center thereof.

Figure 15:
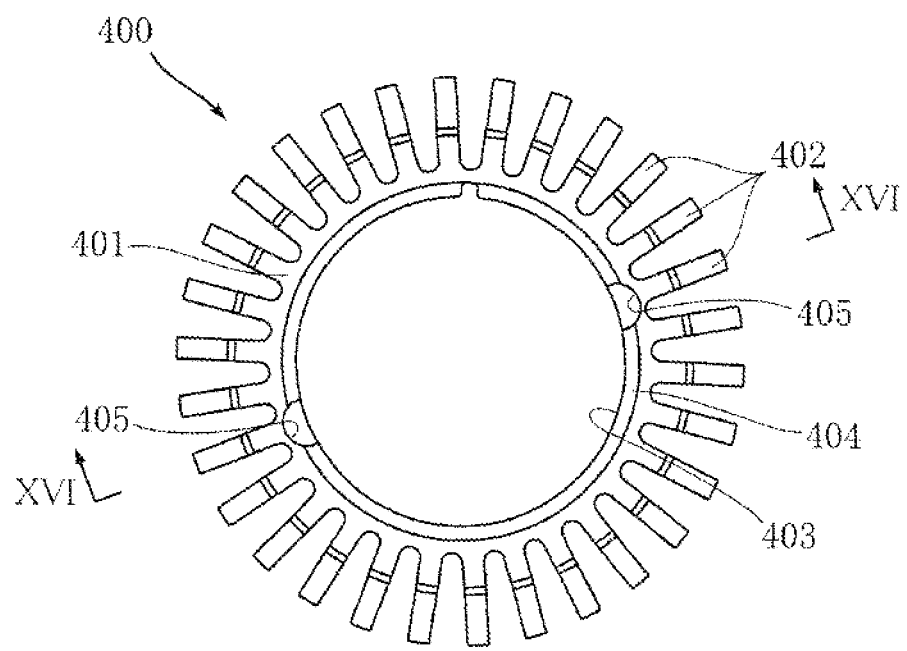
FIG. 15 is a plan view showing a heat dissipator included in the LED lightbulb shown in FIG. 14.
Figure 16:
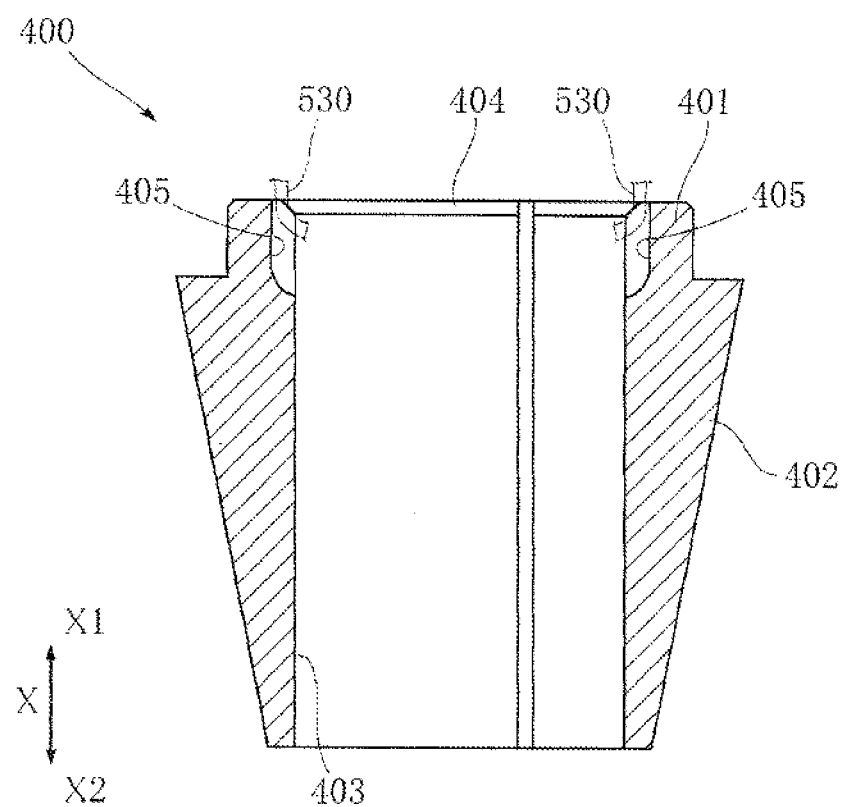
FIG. 16 is a cross-sectional view taken along a line XVI-XVI in FIG. 15.

Referring to FIGS. 15 and 16, the heat dissipator 400 includes a pair of concave portions 405. The concave portions 405 are formed so as to recede from the end portion of the power source chamber 403 on the X1-side in the X-direction, in a direction orthogonal to the X-direction as well as to the X2-side in the X-direction. As shown in FIG. 14, the concave portions 405 each overlap with the wiring opening 312 in the X-direction view. In other words, as shown in FIGS. 14 and 16, the portion of the wiring 530 routed so as to circumvent the LED substrate 210 is accommodated in each concave portion 405.

Forming thus the concave portions 405 allows the wiring 530 to be properly arranged without the need to increase the size of the power source chamber 403, hence the heat dissipator 400. Such a configuration contributes, therefore, to reducing the size of the LED lightbulb 102 without reducing the size of the light emitting unit 200.

The LED lightbulb according to the present invention is not limited to the foregoing embodiments. Specific configuration of the parts of the LED lightbulb according to the present invention may be modified in various manners.

The technical configuration of the LED lightbulb according to the foregoing embodiment may be itemized as the following appendices.

[Appendix A1]

An LED lightbulb including:

a light emitting unit including one or more LED chips and configured to emit light about a central axis extending to one side in a first direction;

a pedestal on which the light emitting unit is mounted and having a mounting surface oriented to the one side in the first direction;

a power source unit that supplies power to the light emitting unit, the power source unit being located on the other side in the first direction with respect to the pedestal;

a heat dissipator attached to the pedestal on the other side in the first direction and including a power source chamber that accommodates therein the power source unit;

a base attached to the heat dissipator on the other side in the first direction; and a globe formed so as to swell toward the one side in the first direction and to enclose therein the light emitting unit, and configured to diffusingly transmit the light from the light emitting unit, wherein the mounting surface includes a pair of wiring openings spaced from each other across the light emitting unit, and wiring connecting the light emitting unit and the power source unit is passed through the respective wiring opening.

[Appendix A2]

The LED lightbulb according to Appendix A1, wherein the light emitting unit includes an LED substrate on which the one or more LED chips are mounted.

[Appendix A3]

The LED lightbulb according to Appendix A2, wherein the LED substrate is formed of a ceramic.

[Appendix A4]

The LED lightbulb according to Appendix A2 or A3, wherein a plurality of the LED chips are arranged in a matrix pattern on the LED substrate.

[Appendix A5]

The LED lightbulb according to any of Appendices A2 to A4, wherein the light emitting unit includes an encapsulating resin that encapsulates therein the LED chips and transmits the light from the LED chips.

[Appendix A6]

The LED lightbulb according to Appendix A5, wherein the encapsulating resin contains a fluorescent material that emits light of a frequency different from that of the light from the LED chips upon being excited by the light from the LED chips.

[Appendix A7]

The LED lightbulb according to any of Appendices A2 to A6, wherein the LED substrate has a rectangular shape.

[Appendix A8]

The LED lightbulb according to Appendix A7, wherein the LED substrate includes a pair of pads located with a spacing therebetween in a diagonal direction of the LED substrate, and the wiring is arranged so as to extend between the corresponding wiring opening and one of the pads, along a side of the LED substrate.

[Appendix A9]

The LED lightbulb according to Appendix A7 or A8, wherein the mounting surface is flat.

[Appendix A10]

The LED lightbulb according to Appendix A9, wherein the pedestal includes a disk portion that serves as the mounting surface.

[Appendix A11]

The LED lightbulb according to Appendix A10, wherein the power source chamber is a round column-shaped space, and the disk portion may close the power source chamber on the one side in the first direction.

[Appendix A12]

The LED lightbulb according to Appendix A11, wherein the wiring openings are elongated in a direction orthogonal to the first direction, and are partially covered with the LED substrate.

[Appendix A13]

The LED lightbulb according to Appendix A12, wherein the heat dissipator is connected to an end portion of the power source chamber on the one side in the first direction, and includes a sloped surface having a circular cross-section the diameter of which increases toward the one side in the first direction, and the wiring openings and the sloped surface are located so as to overlap as viewed in the first direction.

[Appendix A14]

The LED lightbulb according to Appendix A11, wherein the wiring openings are spaced apart from the LED substrate as viewed in the first direction.

[Appendix A15]

The LED lightbulb according to Appendix A14, wherein the heat dissipater includes a pair of concave portions each located so as to overlap with one of the wiring openings as viewed in the first direction, and recessed from the end portion of the power source chamber on the one side in the first direction toward a direction orthogonal to the first direction and to the other side in the first direction.

[Appendix A16]

The LED lightbulb according to any of Appendices A1 to A15, wherein the light emitting unit is configured to provide a light amount not less than 50% of a maximum light amount thereof in a region not exceeding ±60° about the central axis set as 0°, and the globe is configured to provide a light amount not less than 50% in a region not exceeding ±125° about the central axis set as 0°.

[Appendix A17]

The LED lightbulb according to Appendix A16, wherein the globe includes a top portion corresponding to an end portion thereof on the one side in the first direction, a maximum diameter portion where the diameter of a cross-section of the globe orthogonal to the first direction is largest, and an exposed bottom portion corresponding to an end portion of the exposed portion of the globe on the other side in the first direction, the exposed bottom portion being smaller in diameter of the cross-section orthogonal to the first direction than the maximum diameter portion.

[Appendix A18]

The LED lightbulb according to Appendix A17, wherein a distance between the top portion and the maximum diameter portion in the first direction is longer than a distance between the exposed bottom portion and the maximum diameter portion in the first direction.

[Appendix A19]

The LED lightbulb according to Appendix A17 or A18, wherein the globe includes a constricted portion formed so as to inwardly protrude, at a position between the maximum diameter portion and the exposed bottom portion.

[Appendix A20]

The LED lightbulb according to any of Appendices A16 to A19, wherein the globe has a transmittance of 60 to 65%, and a light emission rate indicating a ratio of a total light flux transmitted through the globe to a total light flux from the light emitting unit is not less than 90%.

Figure 17:
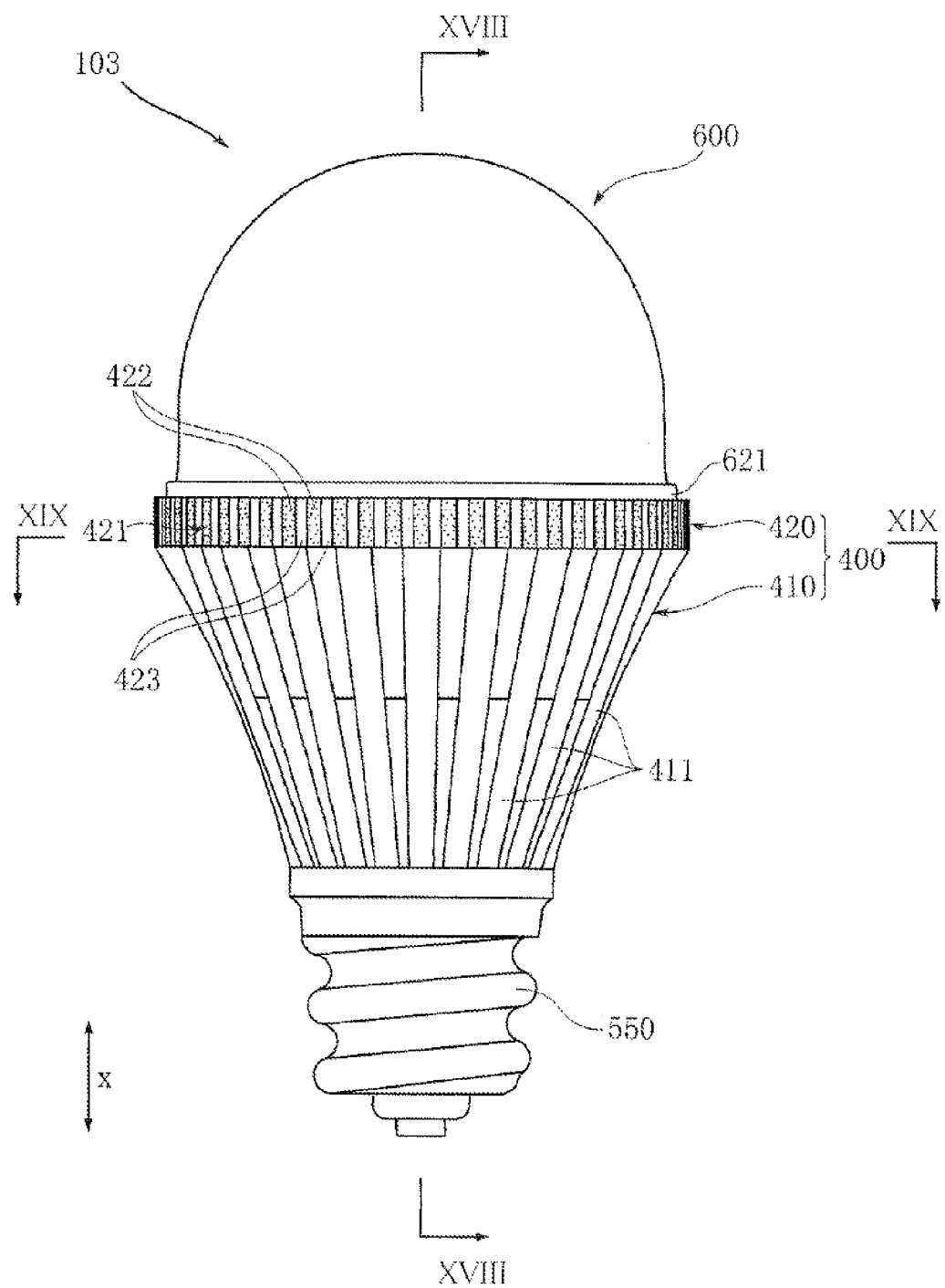
FIG. 17 is a front view showing an LED lightbulb according to a third embodiment of the present invention.
Figure 18:
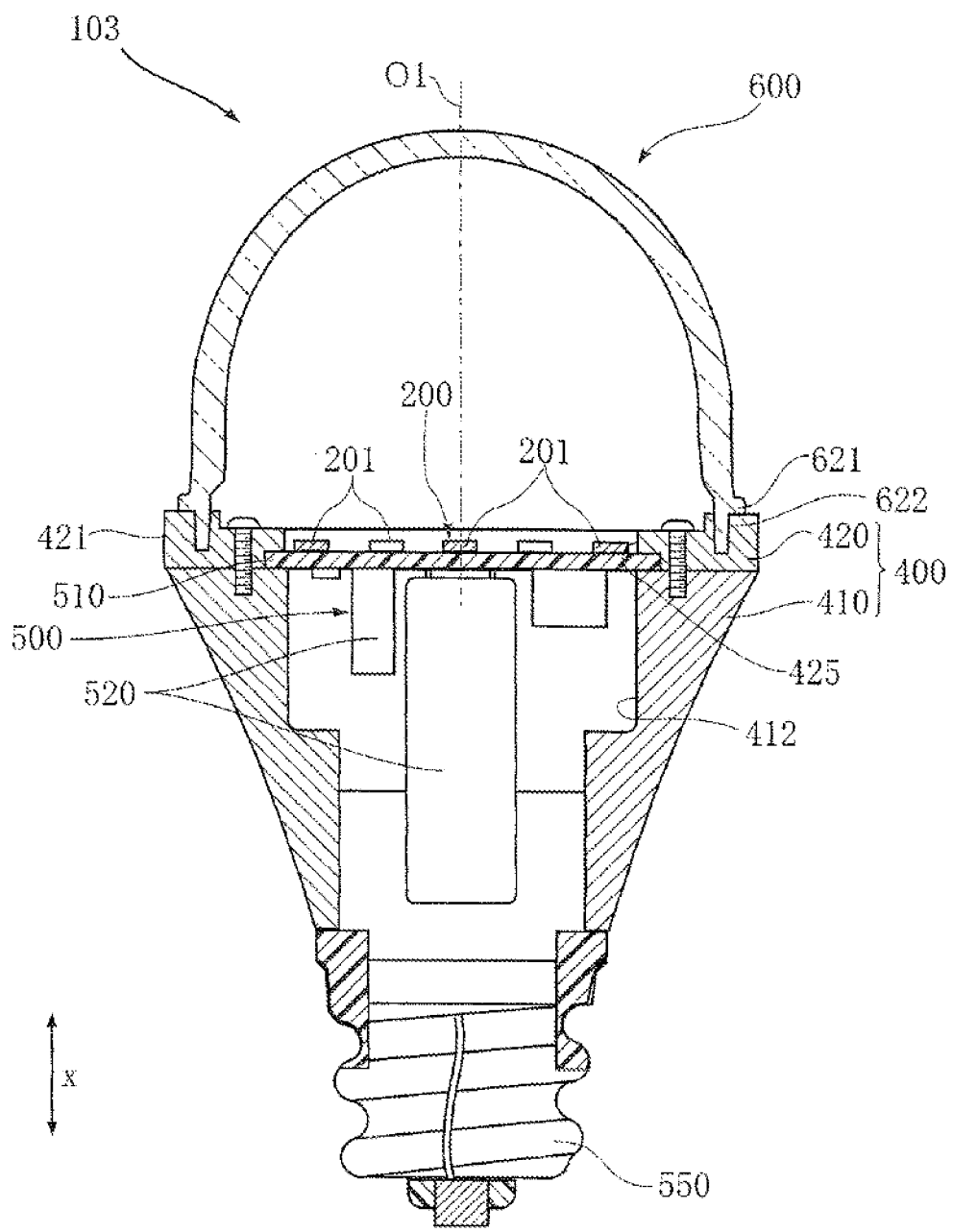
FIG. 18 is a cross-sectional view taken along a line XVIII-XVIII in FIG. 17.

FIGS. 17 and 18 depict an LED lightbulb according to a third embodiment of the present invention. The LED lightbulb 103 according to this embodiment includes the light emitting unit 200, the heat dissipator 400, the power source unit 500, the globe 600, and the base 550. The LED lightbulb 103 is for use with an illumination instrument designed for a common incandescent lightbulb, as substitute therefor, and has an overall size of approximately 55 mm in diameter and approximately 108 mm in height, which is generally the same as the size of an incandescent lightbulb of 60 W.

Figure 22:
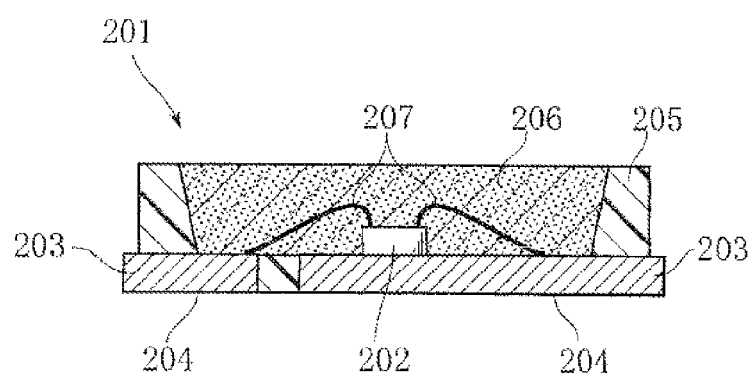
FIG. 22 is a cross-sectional view of an LED module included in the LED lightbulb shown in FIG. 17.

In this embodiment, the light emitting unit 200 includes a plurality of LED modules 201. Referring to FIG. 22, the LED modules 201 each include an LED chip 202, a pair of leads 203, a case 205, an encapsulating resin 206, and a wire 207. The pair of leads 203 is formed of a Cu alloy for example, and the LED chip 202 is mounted on one of the leads 203. The surface of the leads 203 opposite to the side on which the LED chip 202 is mounted serves as a mounting terminal 204 for surface-mounting the LED module 201. The LED chip 202 is the light source of the LED module 201, and configured to emit, for example, blue light. The encapsulating resin 206 serves to protect the LED chip 202. The encapsulating resin 206 is composed of a light-transmissive resin containing a fluorescent material that emits yellow light upon being excited by the light from the LED chip 202. Instead of the fluorescent material that emits yellow light, one that emits red light and another that emits green light may be employed in mixture. The case 205 is formed of a white resin for example, and serves to reflect upward the light emitted in a lateral direction from the LED chip 202.

The plurality of LED modules 201 each configured as above are mounted on the power supply substrate 510 to be subsequently described. The LED modules 201 are arranged, for example, in a matrix pattern.

As shown in FIGS. 17 and 18, the heat dissipator 400 according to this embodiment includes a main body 410 and a spacer 420. The heat dissipator 400 supports the LED module 201 (light emitting unit 200) via the power supply substrate 510. It is preferable to employ a material that has high heat conductivity to form the heat dissipator 400, for example a metal such as aluminum. Each of the main body 410 and the spacer 420 may be formed through a die-casting process.

The main body 410 has a flared shape as a whole, and includes a plurality of fins 411. The fins 411 are formed so as to radially project outward. The main body 410 includes a power source cavity 412. The power source cavity 412 is used to accommodate at least a part of the power source unit 500. In this embodiment, a most part of the power source unit 500 is accommodated in the power source cavity 412.

The spacer 420 is attached to the upper end portion of the main body 410 according to FIGS. 17 and 18, in other words located at the upper end portion (X1-side in the X-direction) of the heat dissipator 400. The spacer 420 is the portion to which the globe 600 is attached, and includes a portion corresponding to the fixing facet according to the present invention. The spacer 420 is of a disk shape having a vertically extending central axis O1 (X-direction) as shown in FIG. 18, and includes an outer circumferential portion 421 surrounding the central axis O1. As may be understood from FIGS. 17 and 18, the outer circumferential portion 421 of the spacer 420 has the largest size in the LED lightbulb 103, in the direction orthogonal to the central axis O1. The outer circumferential portion 421 may have a vertical size of approximately 3 to 5 mm.

Figure 19:
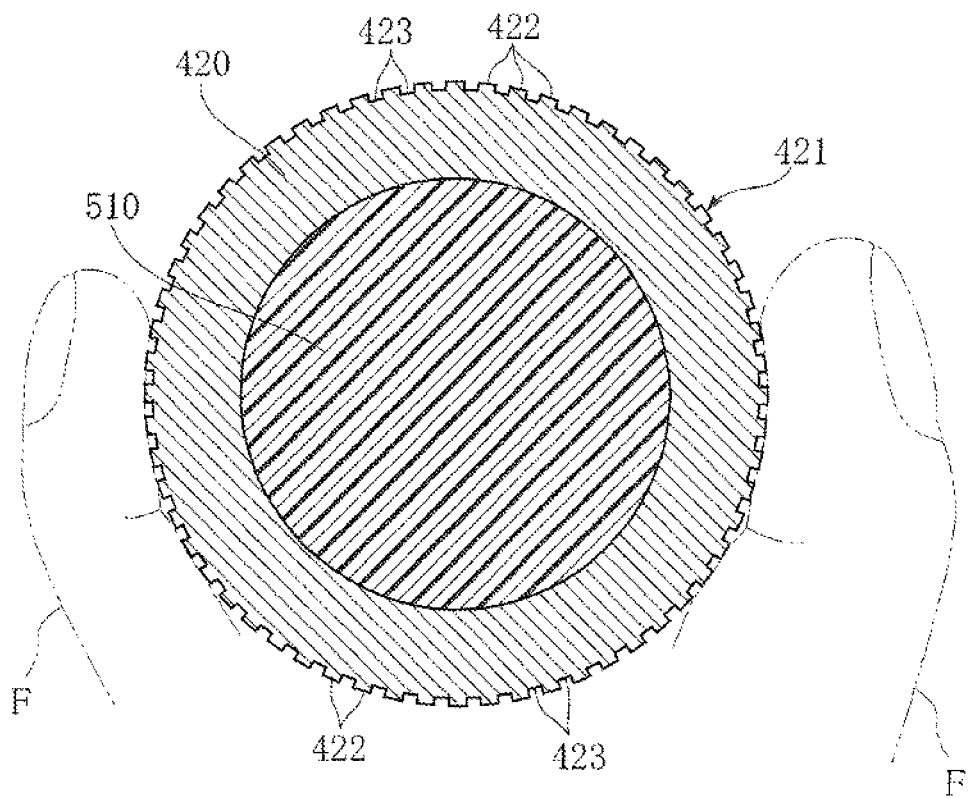
FIG. 19 is a cross-sectional view taken along a line XIX-XIX in FIG. 17.

Referring to FIGS. 17 and 19, the outer circumferential portion 421 is exposed to outside the LED lightbulb 103, and formed in a convex/concave shape including a plurality of protruding portions 422 spaced from each other and grooves 423 located between adjacent ones of the protruding portions 422. In this embodiment, both the protruding portions 422 and the grooves 423 are each formed in a strip shape extending in the x-direction (parallel to central axis O1). The protruding portions 422 and the grooves 423 are alternately aligned circumferentially of the spacer 420, over the entirety of the outer circumferential portion 421.

Figure 20:
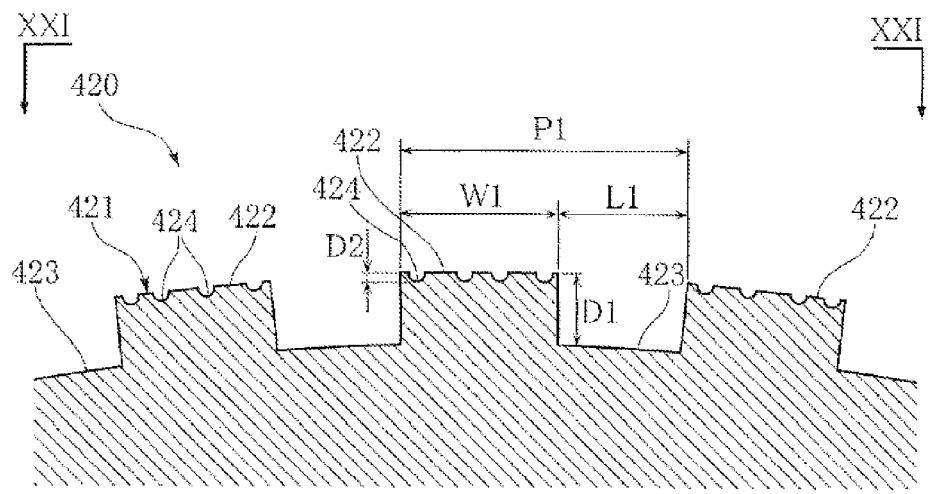
FIG. 20 is an enlarged fragmentary view of FIG. 19.

Referring to FIG. 20, the protruding portions 422 each have a rectangular cross-section. For example, a pitch P1 between the adjacent protruding portions 422 is approximately 1 to 5 mm. With respect to the pitch P1, a ratio of an interval L1 between the adjacent protruding portions 422 is 30 to 50%, and a ratio of a depth D1 of the grooves 423 to a width W1 of the protruding portions 422 is 25 to 50%.

Figure 21:
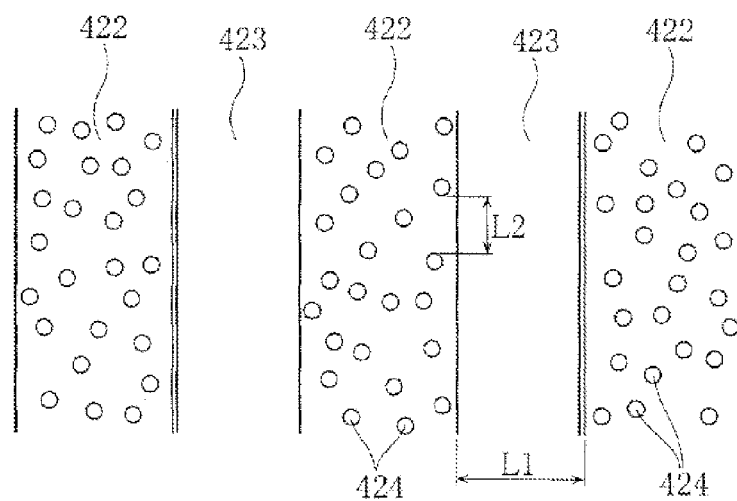
FIG. 21 is a lateral view of the portion shown in FIG. 20, viewed in a direction of XXI-XXI in FIG. 20.

Referring to FIGS. 20 and 21, the surface (outer circumferential portion) of each protruding portion 422 includes a plurality of dimples 424, so as to present a fine convex/concave surface. Regarding the size of the plurality of dimples 424, for example, an interval L2 between the adjacent dimples 424 is approximately 50 µm to 0.5 mm, and a depth D2 of each dimple 424 is not less than 0.1 mm.

The dimples 424 may be formed by, for example, applying a sand blasting process to the outer circumferential portion 421 of the spacer 420. In the case where the spacer 420 is formed through a die-casting process, the dimples are also formed on the grooves 423 through the sand blasting process, though not shown in FIG. 21. Here, although the interval L2 between the dimples 424 may be set as above, it is preferable to form the dimples 424 at sufficiently smaller intervals compared with the pitch P1 between the protruding portions 422. Such a setting provides a sufficient number of dimples 424 scattered on the surface of the protruding portions 422.

As shown in FIG. 18, the spacer 420 includes an opening 425. The opening 425 is provided for avoiding interference with the LED module 201.

The power source unit 500 generates DC power suitable for activating the light emitting unit 200 (LED chip 202), for example from the commercial AC power of 100 V, to thereby supply the DC power to the light emitting unit 200 (LED chip 202), and includes a power supply substrate 510 and a plurality of electronic parts 520, as shown in FIG. 18.

The power supply substrate 510 is formed of a material having high heat conductivity, for example a glass composite copper-clad laminate. The power supply substrate 510 has a circular shape as a whole. The plurality of electronic parts 520 are mounted on the lower surface of the power supply substrate 510, according to FIG. 18. On the upper and lower surfaces of the power supply substrate 510, an interconnect pattern (not shown) for supplying power to the LED chip 202 is provided, and the interconnect pattern on the upper surface and that of the lower surface are electrically connected, for example through an opening. The power supply substrate 510 is fixed to the heat dissipator 400, with a peripheral portion interposed between the main body 410 and the spacer 420 of the heat dissipator 400.

The electronic parts 520 serve to convert, for example, the commercial AC power of 100 V into the DC power suitable for activating the light emitting unit 200 (LED chip 202). The electronic parts 520 include a capacitor, a resistor, a coil, a diode, an IC, and so forth. In FIG. 18 for example, the most outstanding one of the electronic parts 520, projecting downward in a generally central portion of the power source cavity 412, is the capacitor.

The base 550 is the portion to be attached to an illumination instrument designed for common electric bulbs conforming to e.g. JIS. The base 550 is designed for the specifications E17, E26 of JIS. The base 550 is connected to the power source unit 500 through wiring. In addition, the base 550 has a threaded surface to be fitted into a screw-type socket of an illumination instrument.

The globe 600 serves to protect the light emitting unit 200 (LED module 201), and is attached so as to cover the light emitting unit 200. The globe 600 is formed of a transparent resin for example, and transmits the light emitted from the light emitting unit 200. In this embodiment, the globe 600 is formed in a dome shape as a whole, so as to swell toward one side in the X-direction (upward in FIGS. 17 and 18). The globe 600 includes a flange portion 621 and an insertion portion 622 formed on the lower end portion thereof, according to FIG. 18. The flange portion 621 is an annular projection. The insertion portion 622 is to be inserted into a groove formed on the heat dissipator 400, so as to fix the globe 600 to the heat dissipator 400.

The LED lightbulb 103 offers the following advantageous effects.

In the foregoing embodiment, the outer circumferential portion 421 of the spacer 420 includes the protruding and recessed portions, more particularly the plurality of protruding portions 422 and the plurality of grooves 423. To remove the LED lightbulb 103 from an illumination instrument for example, the user often grabs the outer circumferential portion 421 of the spacer 420. Since the outer circumferential portion 421 includes the protruding and recessed portions, the user's fingers F (drawn by imaginary lines in FIG. 19) contact the outer circumferential portion 421 via a smaller contact area. Accordingly, even though the surface of the spacer 420 is relatively hot, the heat transfer from the spacer 420 to the fingers F is suppressed. Therefore, the discomfort that the user feels when removing the LED lightbulb 103 can be alleviated.

In addition, the outer circumferential portion 421 of the spacer 420 has a larger surface area compared with the case of having a smooth surface, because of including the protruding portions and the grooves. Accordingly, the spacer 420 can efficiently dissipate heat through the outer circumferential portion 421, and hence an increase in temperature of the outer circumferential portion 421 can be suppressed. This contributes to alleviate the discomfort that the user feels when removing the LED lightbulb 103.

The spacer 420 is of a disk shape having a central axis O1, and the outer circumferential portion 421 of the spacer 420 corresponds to the maximum diameter portion where the size in a direction orthogonal to the central axis O1 is largest. Such a configuration prevents the fingers F from unintentionally contacting the main body 410 located on the opposite side of the globe 600 with respect to the spacer 420. In addition, whereas the base 550 has to be unscrewed in order to remove the LED lightbulb 103, grabbing the outer circumferential portion 421 of the spacer 420, which is the maximum diameter portion, allows a relatively large rotational momentum to be exerted on the threaded portion of the base 550. Accordingly, the base 550 can be unscrewed without the need to tightly grab the outer circumferential portion 421. The LED lightbulb 103 according to this embodiment can therefore substantially reduce the contact area between the outer circumferential portion 421 and the fingers F to thereby alleviate the discomfort, when the LED lightbulb 103 is to be removed. In this embodiment, further, the strip-shaped protruding portions 422 and the grooves 423, extending parallel to the central axis O1, are aligned circumferentially of the spacer 420. Such a configuration contributes to increasing the gripping force exerted on the outer circumferential portion 421, when the user grabs the outer circumferential portion 421 so as to unscrew the base 550.

In this embodiment, a unique configuration is adopted in the protruding portions 422 and the grooves 423, constituting the protruding and recessed portions of the outer circumferential portion 421. The protruding portions 422 and the grooves 423 are provided over the entire region of the outer circumferential portion 421, which assures that the fingers F effectively contact the protruding portions 422 of the protruding and recessed portions when the user grabs the outer circumferential portion 421. The protruding portions 422 are each formed in a shape having a rectangular cross-section, and the pitch P1 between the adjacent protruding portions 422 is relatively narrow, such as approximately 1 to 5 mm, and the ratio of the interval L1 between the adjacent protruding portions 422 to the pitch P1 is 30 to 50%. Accordingly, the fingers F can be prevented from intruding into between the adjacent protruding portions 422 when the user grabs the outer circumferential portion 421. In addition, forming the grooves 423 is advantageous for increasing the surface area of the outer circumferential portion 421. Further, the ratio of the depth D1 of the grooves 423 to the width W1 of the protruding portions 422 is 25 to 50%. Such a ratio of the depth D1 of the grooves 423 effectively suppresses the heat transfer from inside of the grooves 423 to the fingers F.

The protruding portions 422 each having the rectangular cross-section includes a plurality of dimples 424 formed on the surface (outer circumferential portion) thereof, thus presenting a fine convex/concave surface. Such a configuration makes the contact area between the outer circumferential portion 421 of the spacer 420 and the finger even smaller, when the user grabs the LED lightbulb 103. Accordingly, the user is further relieved from the discomfort when removing the LED lightbulb 103. In addition, the plurality of dimples 424 formed on the surface of the protruding portions 422 further increases the surface area of the outer circumferential portion 421.

In this embodiment, the plurality of protruding portions 422 and grooves 423 and the plurality of dimples 424 constituting the protruding and recessed portions are provided on the spacer 420, and the spacer 420 is fixed to the main body 410. Forming thus the protruding and recessed portions on the spacer 420, which is a component separate from the main body 410, facilitates the protruding and recessed portions to be formed in a desired shape.

Figure 23:
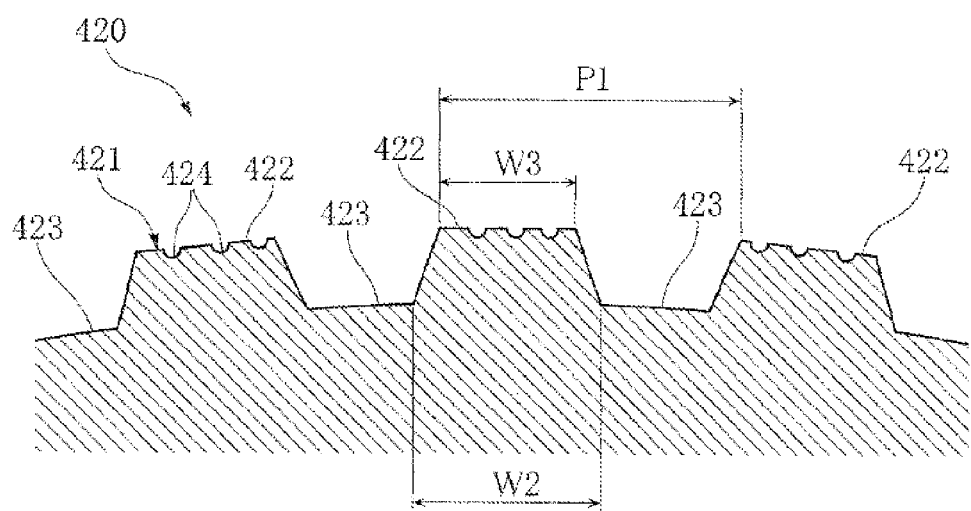
FIG. 23 is a cross-sectional view taken similarly to FIG. 20, showing a variation of the LED lightbulb according to the third embodiment of the present invention.

FIG. 23 depicts a variation of the third embodiment of the present invention. In the spacer 420 shown in FIG. 23, the protruding portions 422 are each formed in a shape having a trapezoidal cross-section, unlike the protruding portions 422 having the rectangular cross-section shown in FIG. 20. Regarding the dimensions of the protruding portions 422, for example, the pitch P1 between the adjacent protruding portions 422 is approximately 1 to 5 mm. The ratio of the width W2 of the bottom portion of the protruding portion 422 to the pitch P1 is 50 to 100%, and the ratio of the width W3 of the top portion of the protruding portion 422 to the pitch P1 is 25 to 50%.

In the configuration shown in FIG. 23 also, the outer circumferential portion 421 of the spacer 420 includes the protruding and recessed portions, more particularly the plurality of protruding portions 422 and the plurality of grooves 423. Since the outer circumferential portion 421 includes the protruding and recessed portions, the user's fingers F contact the outer circumferential portion 421 via a smaller contact area. Accordingly, even though the surface of the spacer 420 is relatively hot, the heat transfer from the spacer 420 to the fingers F is suppressed. Therefore, the discomfort that the user feels when removing the LED lightbulb 103 can be alleviated.

Forming the width W3 of the top portion of the protruding portion 422 in a ratio not greater than 50% (25 to 50%) to the pitch P1 between the adjacent protruding portions 422 effectively suppresses the heat conduction to the top portion. More specifically, while the temperature at the boundary between the spacer 420 and the main body 410 reaches, for example, as high as approximately 85° C., setting the ratio of the width W3 of the top portion to the pitch P1 within the foregoing range can decrease the heat transfer from the high-temperature portion to the top portion of the protruding portions 422 approximately to a quarter.

Figure 24:
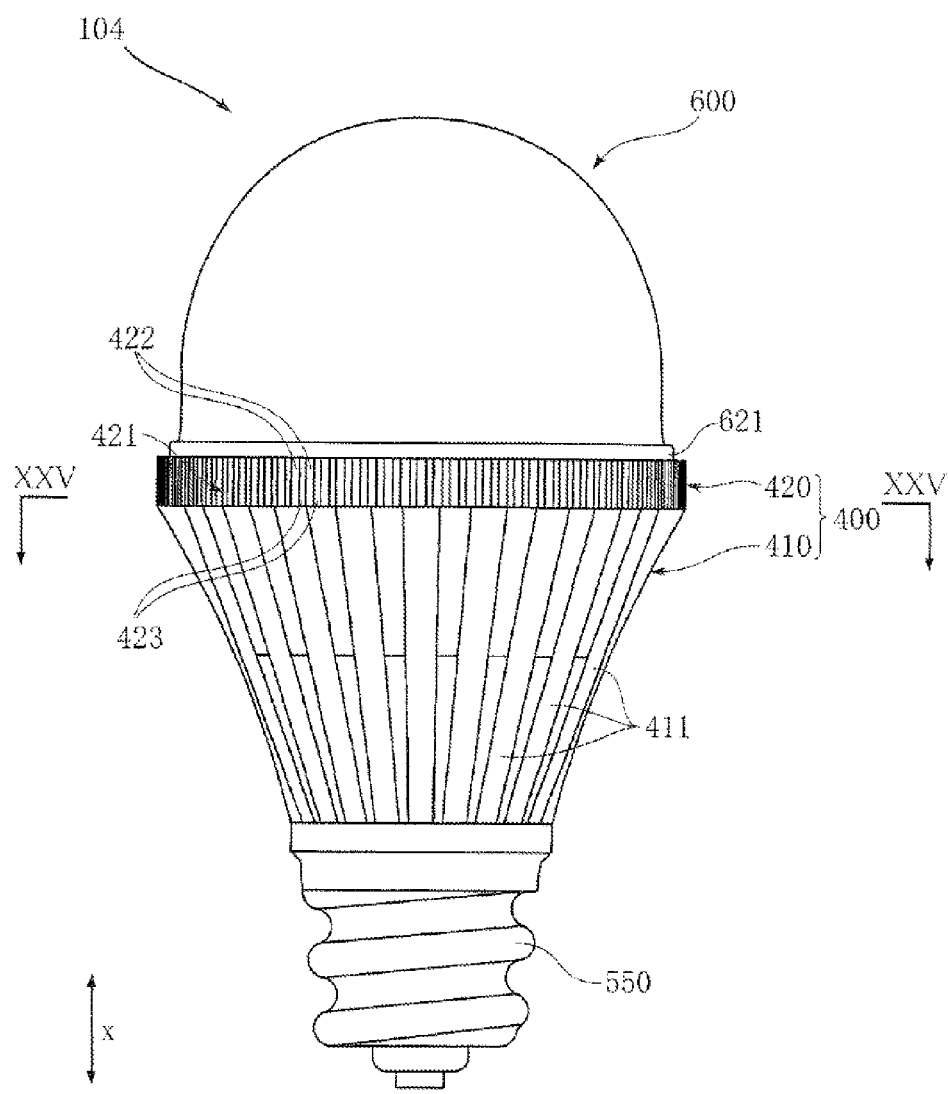
FIG. 24 is a front view showing an LED lightbulb according to a fourth embodiment of the present invention.
Figure 25:
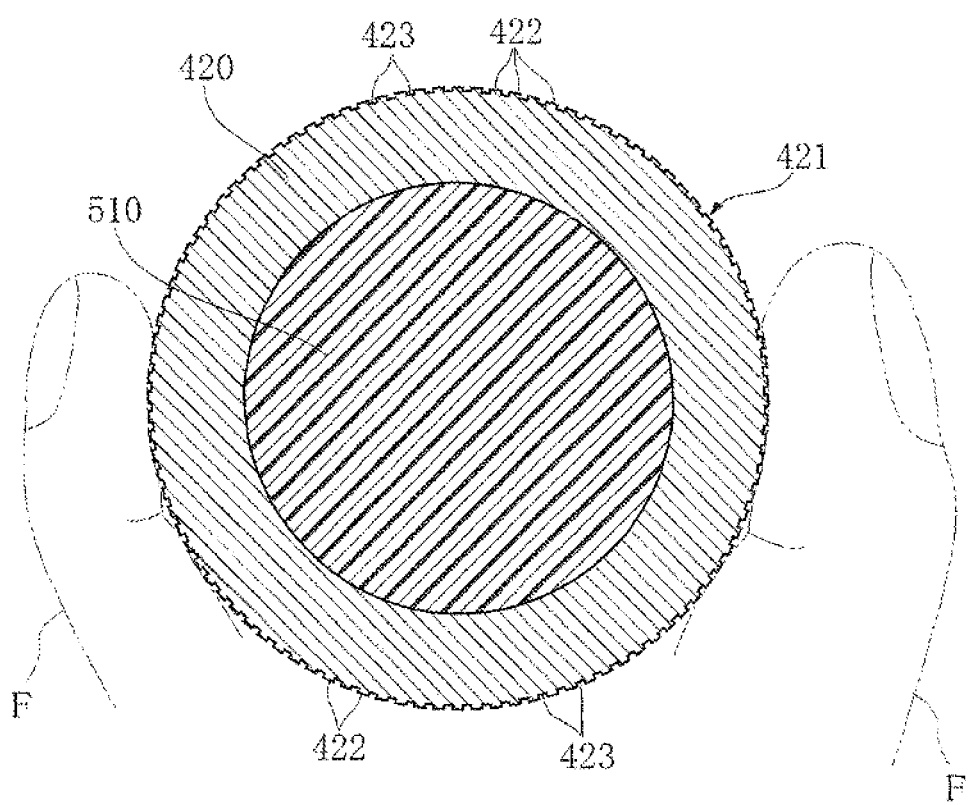
FIG. 25 is a cross-sectional view taken along a line XXV-XXV in FIG. 24.
Figure 26:
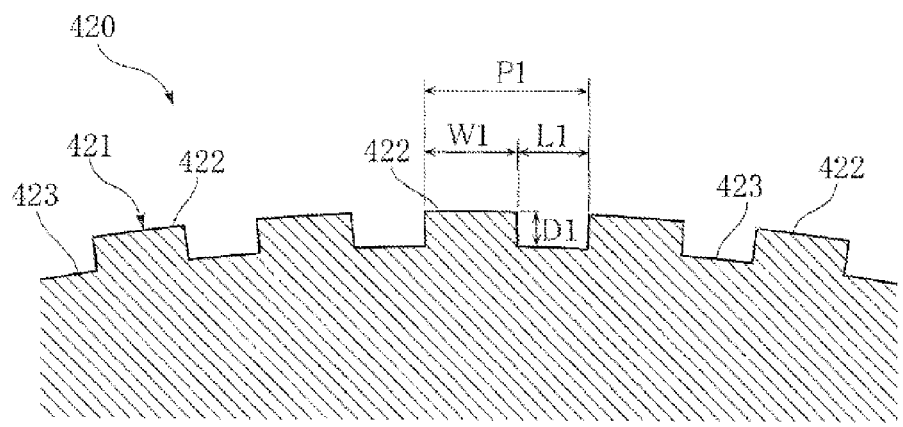
FIG. 26 is an enlarged fragmentary view of FIG. 25.

FIGS. 24 to 26 depict an LED lightbulb according to a fourth embodiment of the present invention. In these drawings, constituents the same as or similar to those of the foregoing embodiments are given the same numeral.

The LED lightbulb 104 according to this embodiment is different from the ones described above in the configuration of the outer circumferential portion 421 of the spacer 420. Like the foregoing embodiment, the outer circumferential portion 421 of the LED lightbulb 104 also includes the plurality of protruding portions 422 spaced from each other and the grooves 423 formed between the adjacent protruding portions 422. However, the sizes of the protruding portions 422 and the grooves 423 are smaller than in the foregoing embodiment, and the dimples 424 are not provided unlike the foregoing embodiment.

As shown in FIG. 26, the protruding portions 422 are each formed in a shape having a rectangular cross-section, and the top portion of each of the protruding portions 422 is flat and smooth. Regarding the dimensions of the protruding portions 422 and the grooves 423, for example, the pitch P1 between the adjacent protruding portions 422 is 50 μm to 2 mm, the interval L1 between the adjacent protruding portions 422 is 50 μm to 1 mm, and the depth D1 of the grooves 423 is 50 μm to 1 mm. The ratio of the interval L1 to the pitch P1 is 30 to 50%, and the ratio of the depth D1 of the grooves 423 to the width W1 of the protruding portions 422 is 25 to 50%.

In the LED lightbulb 104 according to this embodiment, the outer circumferential portion 421 of the spacer 420 includes the protruding and recessed portions, more particularly the plurality of protruding portions 422 and the plurality of grooves 423. Since the outer circumferential portion 421 includes the protruding and recessed portions, the user's fingers F contact the outer circumferential portion 421 via a smaller contact area. Accordingly, even though the surface of the spacer 420 is relatively hot, the heat transfer from the spacer 420 to the fingers F is suppressed. Therefore, the discomfort that the user feels when removing the LED lightbulb 104 can be alleviated.

The protruding portions 422 are each formed in a shape having a rectangular cross-section, and the interval L1 between the adjacent protruding portions 422 is 50 μm to 1 mm. Accordingly, the fingers F can be prevented from intruding into between the adjacent protruding portions 422 when the user grabs the outer circumferential portion 421 (see FIG. 25). In addition, the pitch P1 between the adjacent protruding portions 422 is as narrow as 50 μm to 2 mm, and the depth D1 of the grooves 423 is 50 aμm to 1 mm. Such a configuration is advantageous for increasing the surface area of the outer circumferential portion 421. Further, the ratio of the depth D1 of the grooves 423 to the width W1 of the protruding portions 422 is 25 to 50%. Such a ratio of the depth D1 of the grooves 423 effectively suppresses the heat transfer from inside of the grooves 423 to the fingers F.

Figure 27:
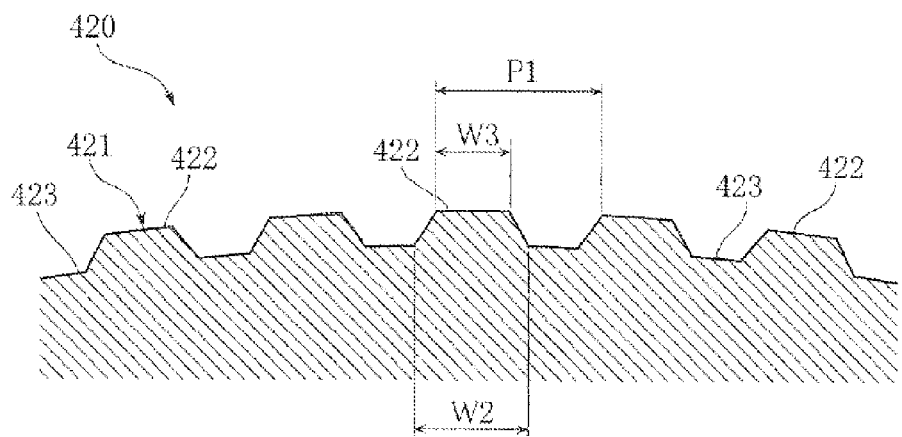
FIG. 27 is a cross-sectional view taken similarly to FIG. 26, showing a variation of the LED lightbulb according to the fourth embodiment of the present invention.

FIG. 27 depicts a variation of the fourth embodiment of the present invention. In the spacer 420 shown in FIG. 27, the protruding portions 422 are each formed in a shape having a trapezoidal cross-section, unlike the protruding portions 422 having the rectangular cross-section shown in FIG. 26. Regarding the dimensions of the protruding portions 422, for example, the pitch P1 between the adjacent protruding portions 422 is 50 to 2 mm. The ratio of the width W2 of the bottom portion of the protruding portion 422 to the pitch P1 is 50 to 100%, and the ratio of the width W3 of the top portion of the protruding portion 422 to the pitch P1 is 25 to 50%.

In the configuration shown in FIG. 27 also, the outer circumferential portion 421 of the spacer 420 includes the protruding and recessed portions, more particularly the plurality of protruding portions 422 and the plurality of grooves 423. Since the outer circumferential portion 421 includes the protruding and recessed portions, the user's fingers F contact the outer circumferential portion 421 via a smaller contact area. Accordingly, even though the surface of the spacer 420 is relatively hot, the heat transfer from the spacer 420 to the fingers F is suppressed. Therefore, the discomfort that the user feels when removing the LED lightbulb 104 can be alleviated.

Forming the width W3 of the top portion of the protruding portion 422 in a ratio not greater than 50% (25 to 50%) to the pitch P1 between the adjacent protruding portions 422 effectively suppresses the heat conduction to the top portion. More specifically, while the temperature at the boundary between the spacer 420 and the main body 410 reaches, for example, as high as approximately 85° C., setting the ratio of the width W3 of the top portion to the pitch P1 within the foregoing range can decrease the heat transfer from the high-temperature portion to the top portion of the protruding portions 422 approximately to a quarter.

Figure 28:
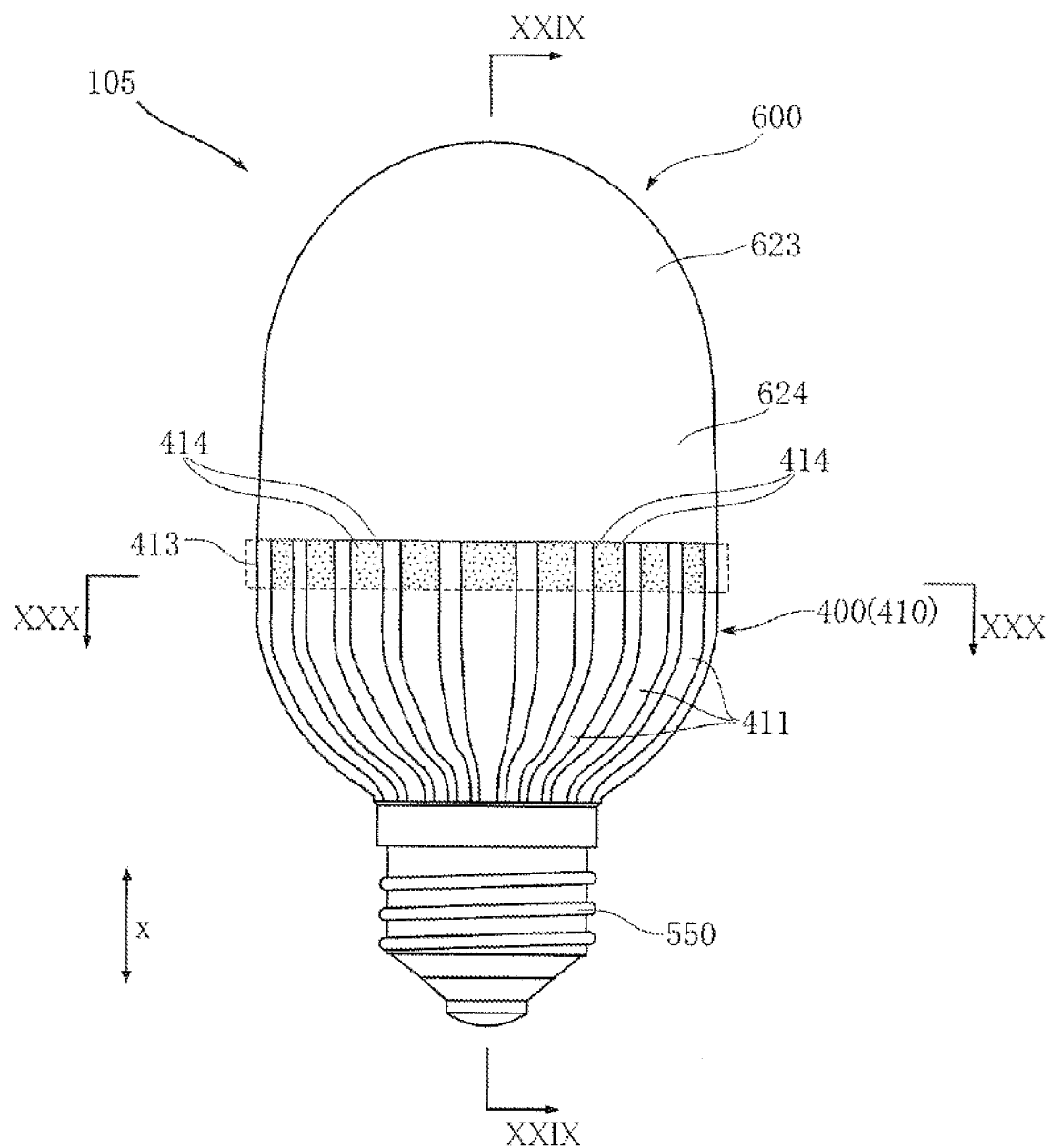
FIG. 28 is a front view showing an LED lightbulb according to a fifth embodiment of the present invention.
Figure 29:
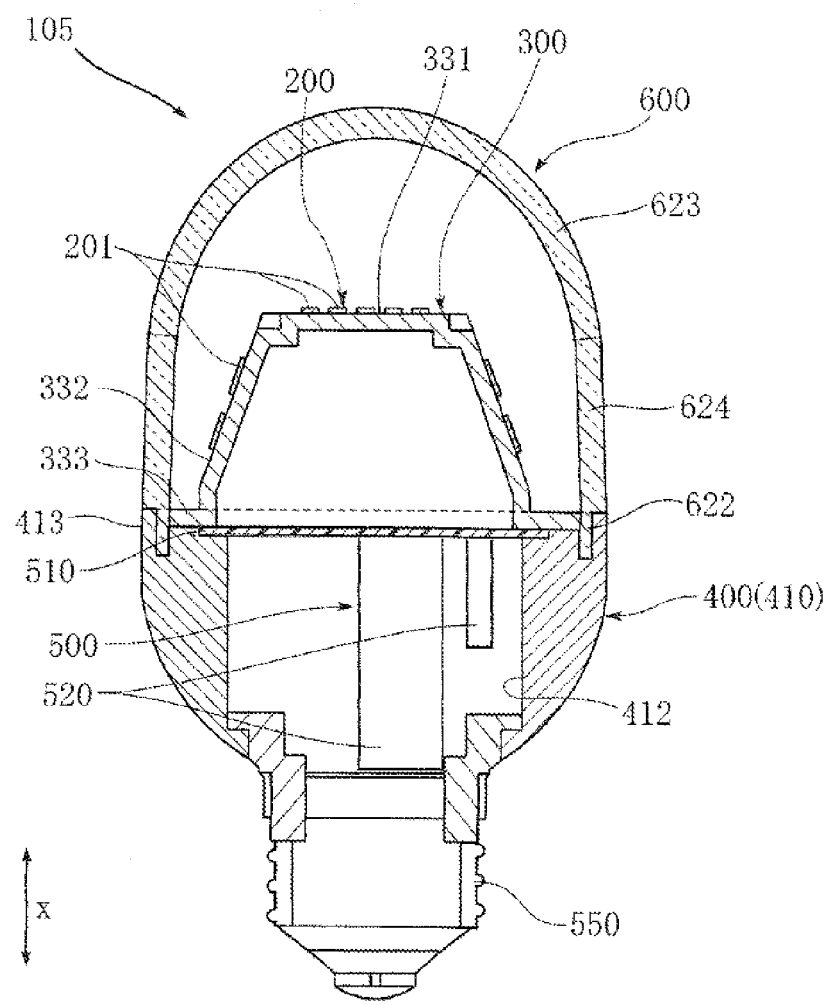
FIG. 29 is a cross-sectional view taken along a line XXIX-XXIX in FIG. 28.
Figure 30:
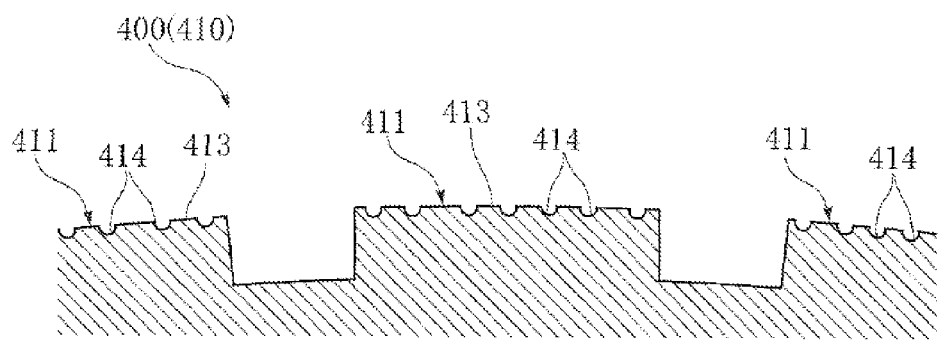
FIG. 30 is an enlarged fragmentary cross-sectional view taken along a line XXX-XXX in FIG. 28, showing a portion corresponding to FIG. 20.

FIGS. 28 to 30 depict an LED lightbulb according to a fifth embodiment of the present invention. In these drawings, constituents the same as or similar to those of the foregoing embodiments are given the same numeral.

The LED lightbulb 105 according to this embodiment is different from the ones described above in the configuration of the light emitting unit 200, the heat dissipator 400, and the globe 600, and further includes a pedestal 300.

Although the light emitting unit 200 includes a plurality of LED modules 201 as in the third embodiment, the LED modules 201 are supported by the pedestal 300 via a flexible wiring substrate (not shown), unlike in the third embodiment.

The pedestal 300 serves to support the flexible wiring substrate and the plurality of LED modules 201, and to transmit the heat from the LED modules 201 to the heat dissipator 400. The pedestal 300 protrudes to one side in the X-direction as a whole, and includes a top plate 331, a cylindrical portion 332, and a flange plate 333. The top plate 331 has a circular shape, and the plurality of LED modules 201 are mounted thereon. The cylindrical portion 332 is connected to the top plate 331, and formed in a tapered cylindrical shape having a diameter gradually reducing toward the top plate 331. On the outer circumferential surface of the cylindrical portion 332, the LED modules 201 are arranged in two rows. The flange plate 333 is formed in an annular shape so as to extend outward from the cylindrical portion 332. It is preferable to employ a material having high heat conductivity, including a metal such as aluminum, to form the pedestal 300.

In this embodiment, the heat dissipator 400 is constituted of a single member, namely the main body 410. The heat dissipator 400 according to this embodiment is formed for example through a die-casting process as a single integrated structure, and does not include the spacer 420 unlike in the third embodiment.

Referring to FIGS. 28 and 29, the upper end portion of the heat dissipator 400 (main body 410) is for receiving the globe 600, and corresponds to an example of the fixing facet according to the present invention. The heat dissipator 400 (main body 410) includes the plurality of fins 411 as in the foregoing embodiments, and the fins 411 are formed so as to radially extend outward. In this embodiment, the fins 411 are each formed over the region of the main body 410 from the lower end portion (the other side in the X-direction) to the upper end portion thereof.

The fins 411 each include a plurality of dimples 414 formed on the outer circumferential surface 413. The dimples 414 are provided in a predetermined region close to the upper end portion of the main body 410, as enclosed by broken lines in FIG. 28. With the dimples 414 thus formed, the outer circumferential surface 413 of the fins 411 presents a fine convex/concave surface.

The power supply substrate 510 of the power source unit 500 is interposed between the heat dissipator 400 (main body 410) and the flange plate 333 of the pedestal 300. Wiring (not shown) for conducting the DC power from the plurality of electronic parts 520 to the flexible wiring substrate is connected to the power supply substrate 510, and the wiring is routed through a wiring opening (not shown) formed in the pedestal 300 so as to reach the flexible wiring substrate.

In this embodiment, the globe 600 is formed in a longer size in the X-direction, so as to cover the pedestal 300. The globe 600 according to this embodiment includes a dome-shaped portion 623 formed so as to swell toward the one side in the X-direction (upward in FIGS. 28 and 29) and a cylindrical portion 624 extending from the lower end of the dome-shaped portion 623.

In the LED lightbulb 105 according to this embodiment, the upper end portion of the respective outer circumferential surface 413 of the fins 411 includes the plurality of dimples 414, thereby presenting the fine convex/concave surface. To remove the LED lightbulb 105 from an illumination instrument, the user often grabs the outer circumferential portion 413 of the upper end portion of the fins 411. Since the outer circumferential portion 413 of the upper end portion of the fins 411 includes the protruding and recessed portions, the user's fingers contact the outer circumferential portion 413 via a smaller contact area. Accordingly, even though the surface of the fins 411 is relatively hot, the heat transfer from the fins 411 to the fingers is suppressed. Therefore, the discomfort that the user feels when removing the LED lightbulb 105 can be alleviated.

Although specific embodiments of the present invention have been described thus far, the LED lightbulb according to the present invention is not limited to those embodiments. Specific configuration of the parts of the LED lightbulb according to the present invention may be modified in various manners.

Figure 31:
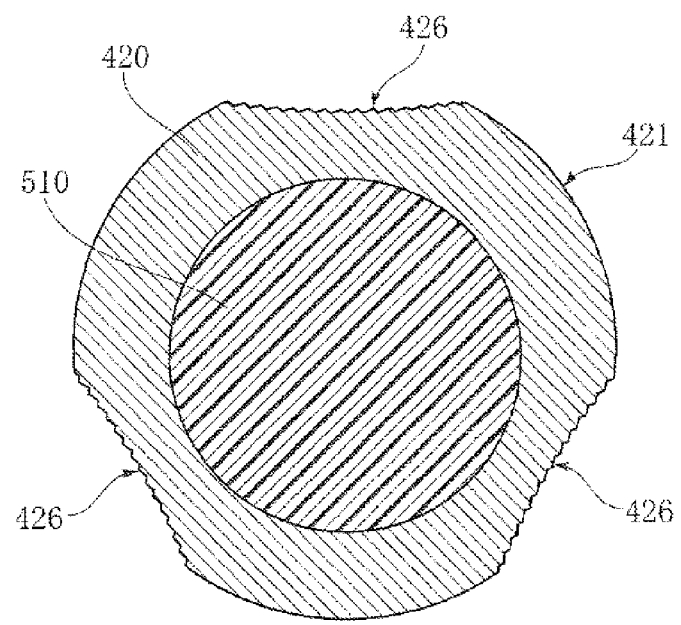
FIG. 31 is a cross-sectional view taken similarly to FIG. 20, showing another example of the present invention.

Although the protruding portions 422 and the grooves 423, constituting the protruding and recessed portions, are formed through a die-casting process according to the third embodiment, the protruding and recessed portions may instead be formed by a separate processing. In the case of forming the protruding and recessed portions by a separate processing, the protruding and recessed portions may be formed all over the outer circumferential portion of the spacer 420, or separately formed in a plurality of regions spaced from each other at a predetermined interval on the outer circumferential portion of the spacer 420. FIG. 31 depicts an example of the protruding and recessed portions 426, formed in a plurality of regions spaced from each other on the outer circumferential portion of the spacer 420. The regions where the protruding and recessed portions 426 are provided are recessed from the remaining regions of the outer circumferential portion 421, and such a configuration may be formed through a sand blasting process. In addition, the shape of the protruding and recessed portions is not limited to the shape having a rectangular cross-section as in the foregoing embodiments, but may be formed in a serrated shape including the protruding portions and grooves each having a triangular cross-section alternately aligned, or in a wavy shape including the protruding portions and grooves each having a curved cross-section alternately aligned.

Further, the protruding and recessed portions of the outer circumferential portion may be formed, for example, by attaching a mesh-type wire net around the outer circumferential portion. In this case, the protruding and recessed portions are constituted of the eyes of the mesh corresponding to the plurality of grooves spaced from each other, and the wire constituting the net corresponding to the protruding portions located between the adjacent grooves.

The technical configuration of the LED lightbulb according to the foregoing embodiment may be itemized as the following appendices.

[Appendix B1]

An LED lightbulb including:

a light emitting unit having one or more LED chips;

a heat dissipator made of a metal and supporting the light emitting unit; and a globe that covers the light emitting unit and transmits light, the globe being formed so as to swell toward one side in a first direction and attached to a fixing facet provided at an end portion of the heat dissipator on the one side in the first direction, wherein the fixing facet includes an outer circumferential portion surrounding an axis extending in the first direction and including protruding and recessed portions at least on a part thereof. [Appendix B2]

The LED lightbulb according to Appendix B1, wherein the protruding and recessed portions include a plurality of protruding portions spaced from each other and grooves formed between adjacent ones of the protruding portions.

[Appendix B3]

The LED lightbulb according to Appendix B2, wherein the protruding portions and the grooves are formed in a strip shape so as to extend in a predetermined direction, and alternately aligned in a predetermined pitch.

[Appendix B4]

The LED lightbulb according to Appendix B3, wherein the fixing facet has a disk shape having a central axis extending in the first direction.

[Appendix B5]

The LED lightbulb according to Appendix B4, wherein the protruding portions and the grooves are aligned circumferentially of the fixing facet.

[Appendix B6]

The LED lightbulb according to any of Appendices B2 to B5, wherein a pitch between the adjacent protruding portions is 1 to 5 mm.

[Appendix B7]

The LED lightbulb according to Appendix B6, wherein the protruding portions have a rectangular cross-section.

[Appendix B8]

The LED lightbulb according to Appendix B7, wherein a ratio of an interval between the adjacent protruding portions to the pitch between the adjacent protruding portions is 30 to 50%.

[Appendix B9]

The LED lightbulb according to Appendix B8, wherein a ratio of a depth of the grooves to a width of the protruding portions is 25 to 50%.

[Appendix B10]

The LED lightbulb according to Appendix B6, wherein the protruding portions each have a trapezoidal cross-section, a ratio of a width of a bottom portion of the protruding portions to the pitch between the adjacent the protruding portions is 50 to 100%, and a ratio of a width of a top portion of the protruding portions to the pitch between the adjacent protruding portions is 25 to 50%.

[Appendix B11]

The LED lightbulb according to Appendix B1, wherein the protruding and recessed portions include a plurality of grooves spaced from each other and protruding portions formed between adjacent ones of the grooves.

[Appendix B12]
The LED lightbulb according to any of Appendices B1 to B11, wherein the protruding and recessed portions include a plurality of dimples.

[Appendix B13]
The LED lightbulb according to Appendix B12, wherein an interval between adjacent ones of the dimples is 50 µm to 0.5 mm.

[Appendix B14]
The LED lightbulb according to Appendix B12 or B13, wherein a depth of the dimples is not less than 0.1 mm.

[Appendix B15]
The LED lightbulb according to any of Appendices B12 to B14, wherein the plurality of dimples are formed through a sand blasting process.

[Appendix B16]
The LED lightbulb according to any of Appendices B2 to B5, wherein the protruding portions each have a smooth end portion, and a pitch between the adjacent protruding portions is 50 µm to 2 mm.

(Appendix B17)
The LED lightbulb according to Appendix B16, wherein the protruding portions each have a rectangular cross-section, and an interval between the adjacent protruding portions is 50 µm to 1 mm.

[Appendix B18]
The LED lightbulb according to Appendix B17, wherein a ratio of an interval between the adjacent protruding portions to the pitch between the adjacent protruding portions is 30 to 50%.

[Appendix B19]
The LED lightbulb according to any of Appendices B16 to B18, wherein a depth of the grooves is 50 µm to 1 mm.

[Appendix B20]
The LED lightbulb according to Appendix B19, wherein a ratio of the depth of the grooves to a width of the protruding portions is 25 to 50%.

[Appendix B21]
The LED lightbulb according to Appendix B16, wherein the protruding portions each have a trapezoidal cross-section, a ratio of a width of a bottom portion of the protruding portions to the pitch between the adjacent protruding portions is 50 to 100%, and a ratio of a width of a top portion of the protruding portions to the pitch between the adjacent protruding portions is 25 to 50%.

[Appendix B22]
The LED lightbulb according to any of Appendices B1 to B21, wherein the heat dissipator includes a first member and a second member fixed to the first member and including the fixing facet.

[Appendix B23]
The LED lightbulb according to any of Appendices B1 to B22, wherein the fixing facet includes a maximum diameter portion having a largest size in a direction orthogonal to the first direction.

[Appendix B24]
The LED lightbulb according to any of Appendices B1 to B23, wherein the protruding and recessed portions are provided on the entirety of the outer circumferential portion.

[Appendix B25]
The LED lightbulb according to any of Appendices B1 to B23, wherein the protruding and recessed portions are separately provided in a plurality of regions on the outer circumferential portion spaced from each other at a predetermined interval.

[Appendix B26]
The LED lightbulb according to Appendix B1, wherein the heat dissipator includes a plurality of fins each radially projecting outward and extending from a portion of the heat dissipator on the other side in the first direction to the fixing facet, and a plurality of dimples constituting the protruding and recessed portions is formed on an outer circumferential surface of the plurality of fins.

Figure 32:
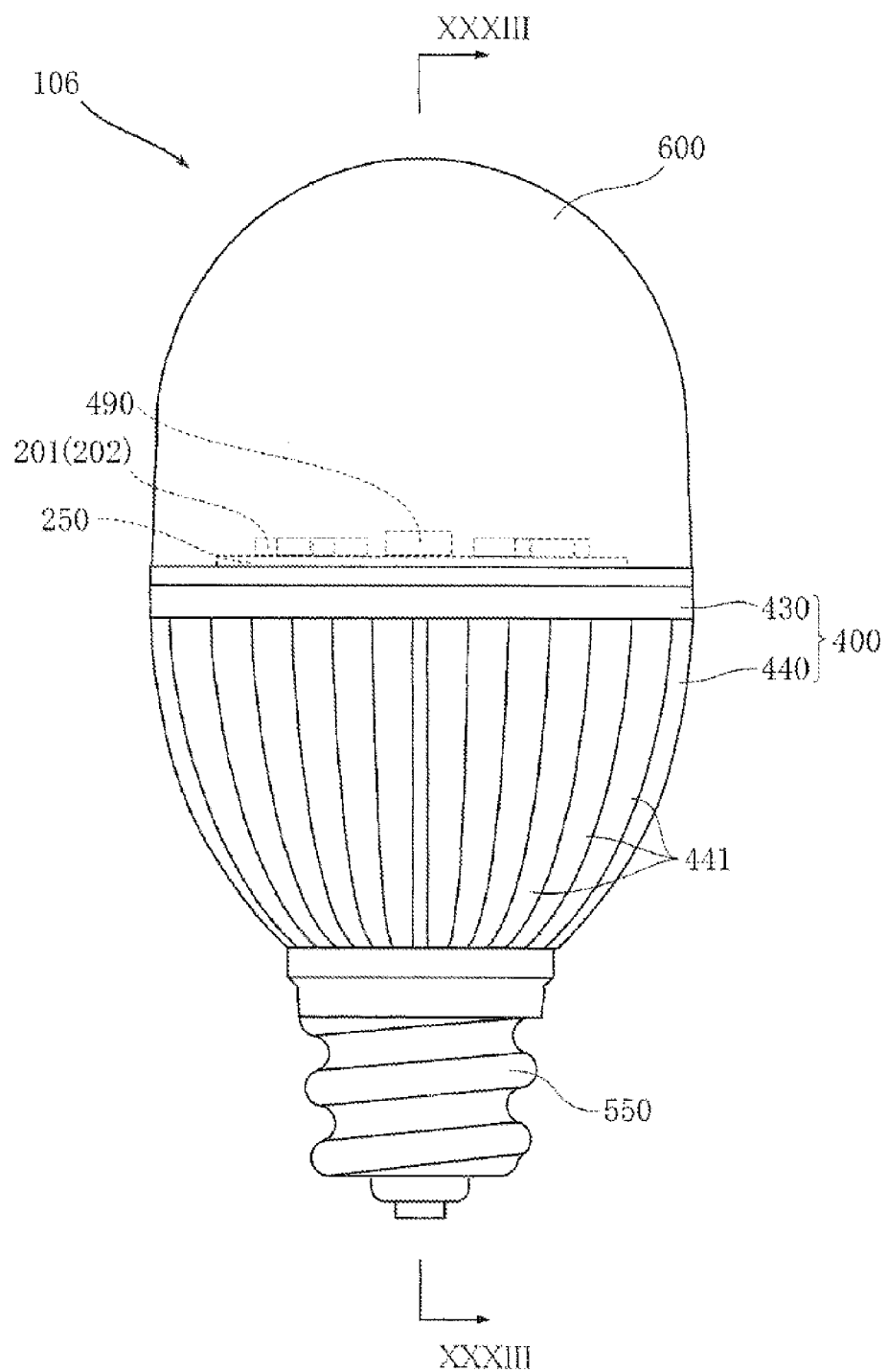
FIG. 32 is a front view showing an LED lightbulb according to a sixth embodiment of the present invention.
Figure 33:
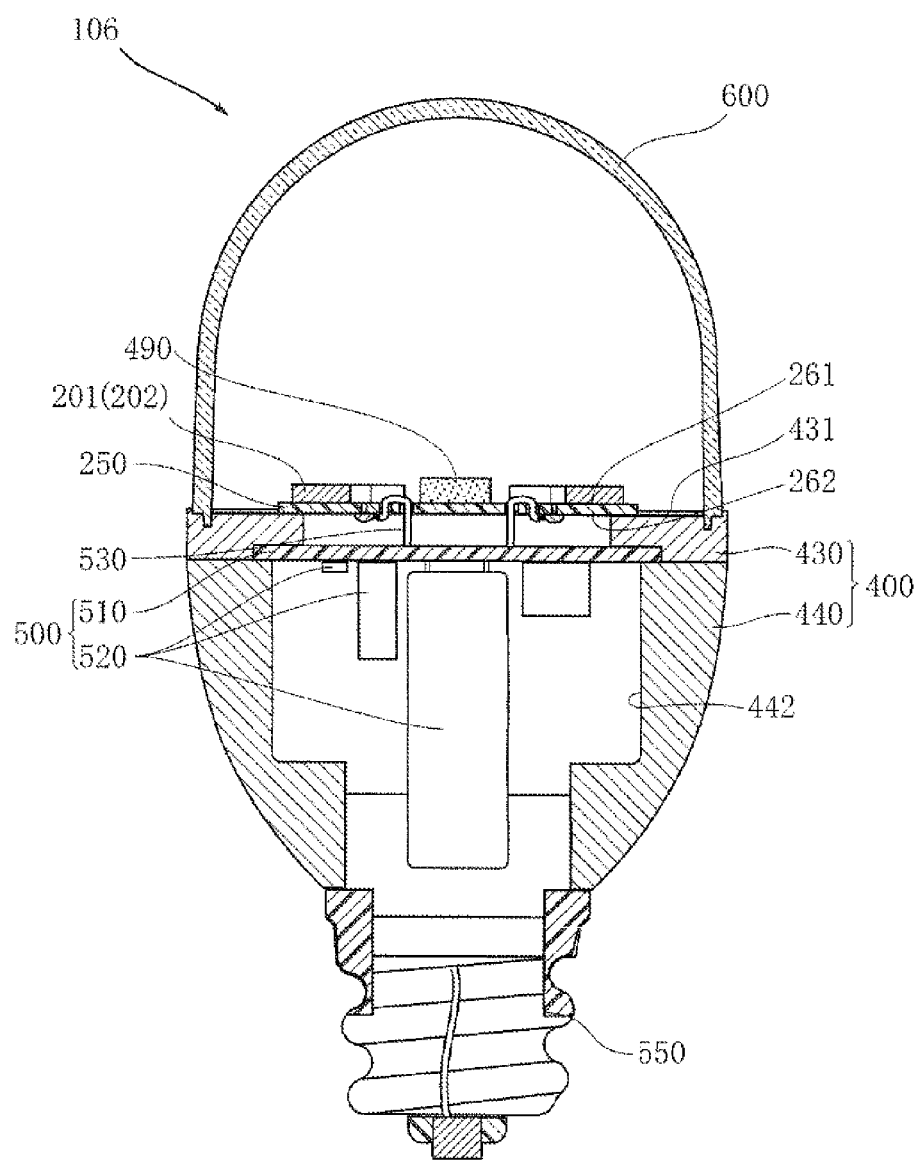
FIG. 33 is a cross-sectional view taken along a line XXXIII-XXXIII in FIG. 32.
Figure 34:
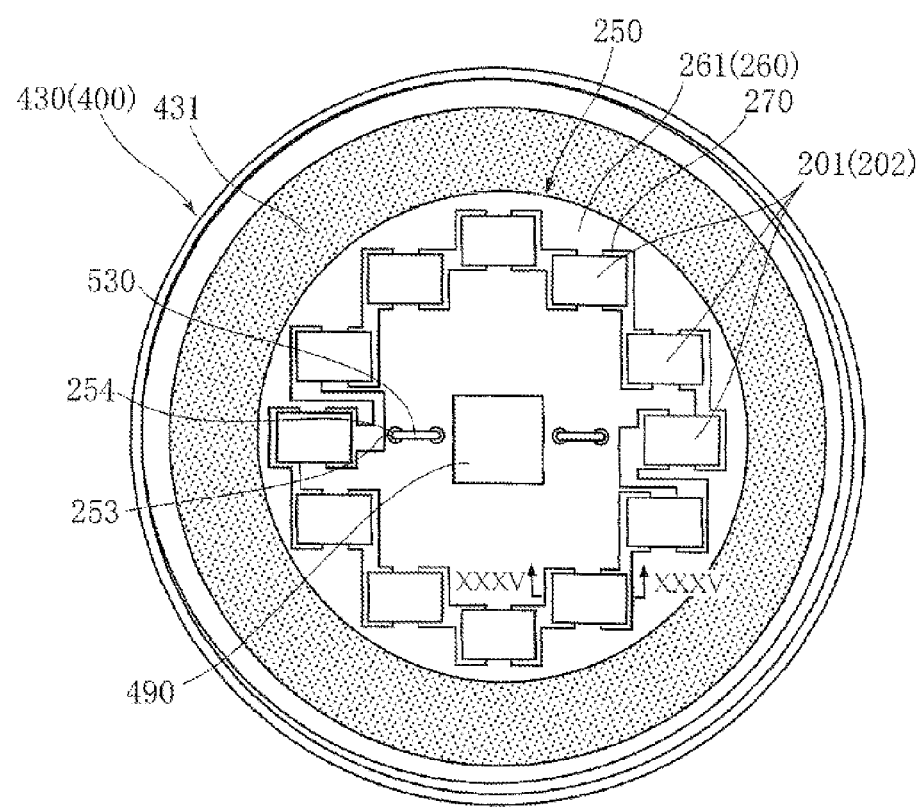
FIG. 34 is a plan view showing an essential part of the LED lightbulb shown in FIG. 32.

FIGS. 32 to 34 depict an LED lightbulb according to a sixth embodiment of the present invention. The LED lightbulb 106 according to this embodiment includes the plurality of LED modules 201, a substrate 250, the heat dissipator 400, the power source unit 500, the base 550, and the globe 600. The LED lightbulb 106 is for use with an illumination instrument designed for a common incandescent lightbulb, as substitute therefor. The LED lightbulb 106 has an overall size of approximately 60 mm in diameter and approximately 123 mm in height, which is generally the same as the size of an incandescent lightbulb of 60 W.

The substrate 250 serves to support the plurality of LED modules 201, and to provide a path for supplying power thereto. In this embodiment, the substrate 250 is formed of a glass composite copper-clad laminate having relatively high heat conductivity, in a circular shape. The substrate 250 includes a base member 260 and an interconnect pattern 270. The base member 260 includes a mounting surface 261 and a back surface 262. On the mounting surface 261, the plurality of LED modules 201 are mounted. The back surface 262 is attached to the heat dissipator 400 via an adhesive, a double-face adhesive tape, or the like.

The interconnect pattern 270 is provided on the mounting surface 261 of the base member 260, and formed of a metal layer such as Cu or Ag. The interconnect pattern 270 is provided generally in an annular shape along the outer periphery of the base member 260. The base member 260 includes two pairs of openings 253. The pairs of openings 253 are located on the respective sides of the center of the base member 260, with a predetermined spacing between the pairs.

Figure 36:
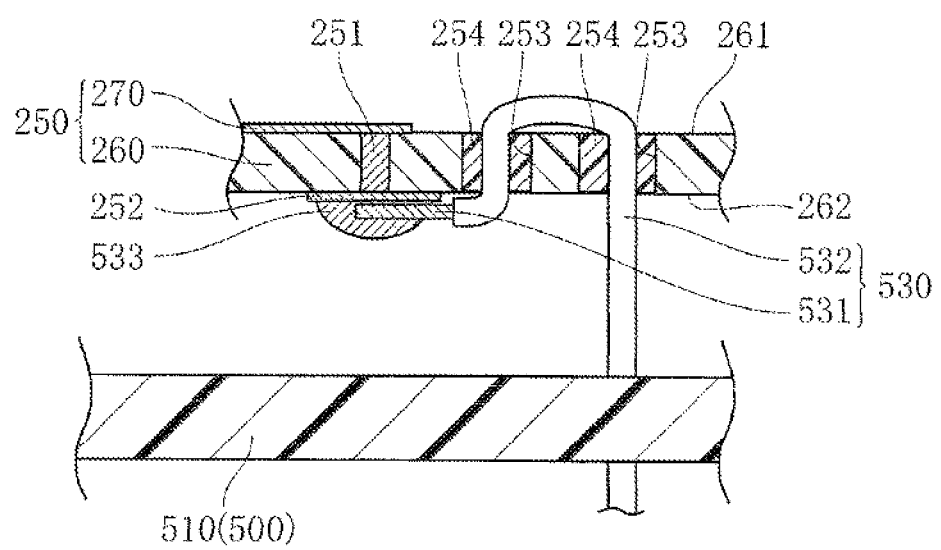
FIG. 36 is an enlarged fragmentary cross-sectional view of the LED lightbulb shown in FIG. 32.

FIG. 36 depicts a part of the cross-sectional view shown in FIG. 32 in an enlarged scale. As shown in FIG. 36, the base member 260 (substrate 250) includes conductive portions 251 and pads 252. In this embodiment, two conductive portions 251 and two pads 252 are provided, so as to each correspond to one of the two pairs of openings 253. The pads 252 are formed of Cu for example, and located on the back surface 262 of the base member 260. The conductive portions 251 provide electrical connection between the interconnect pattern 270 and the pads 252. In this embodiment, the conductive portion 251 is formed so as to penetrate through the base member 260. The pairs of openings 253 each include an opening closer to one of the pads 252 and the other farther therefrom.

The plurality of LED modules 201 are mounted on the mounting surface 261 of the substrate 250 (base member 260). As shown in FIG. 34, the LED modules 201 are arranged in an annular shape along the outer periphery of the substrate 250. In this embodiment, the LED modules 201 are all oriented in the same single direction (left-to-right direction in FIG. 34).

Figure 35:
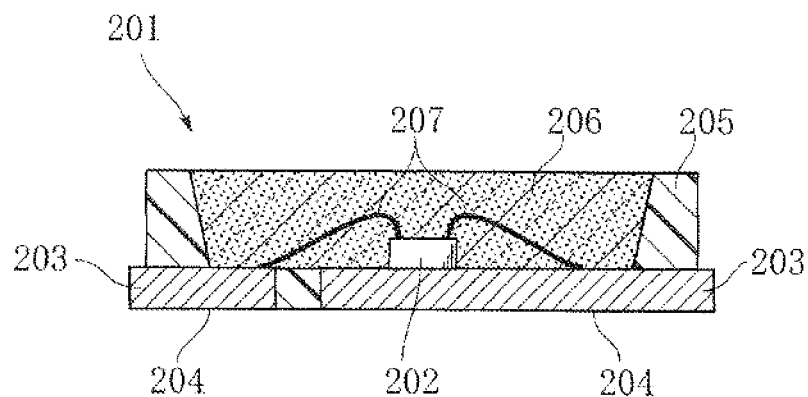
FIG. 35 is an enlarged fragmentary cross-sectional view taken along a line XXXV-XXXV in FIG. 34.

As shown in FIG. 35, the LED modules 201 each include the LED chip 202, the pair of leads 203, the case 205, the encapsulating resin 206, and the pair of wires 207. The pair of leads 203 is formed of a Cu alloy for example, and the LED chip 202 is mounted on one of the leads 203. The surface of the leads 203 opposite to the side on which the LED chip 202 is mounted serves as a mounting terminal 204 for surface-mounting the LED module 201. The LED chip 202 is the light source of the LED module 201, and configured to emit, for example, blue light. The LED chip 202 and the pair of leads 203 are connected to each other through the pair of wires 207. The encapsulating resin 206 serves to protect the LED chip 202. The encapsulating resin 206 is composed of a light-transmissive resin containing a fluorescent material that emits yellow light upon being excited by the light from the LED chip 202. Instead of the fluorescent material that emits yellow light, one that emits red light and another that emits green light may be employed in mixture. The case 205 is formed of a white resin for example, and serves to reflect upward the light emitted in a lateral direction from the LED chip 202.

Here, the LED chip 202 may be directly mounted on the substrate 250, without limitation to this embodiment.

A radiator 490 is provided generally at the center of the mounting surface 261 of the substrate 250. The radiator 490 is formed of a material having a higher radiation rate and specific heat than the substrate 250 (base member 260), such as a ceramic. The radiator 490 is finished in a black color.

As shown in FIGS. 33 and 34, the heat dissipator 400 is composed of a plate portion 430 and a tubular portion 440. Here, the heat dissipator 400 may be integrally formed instead. The plate portion 430 serves to support the substrate 250 and to transmit the heat of the substrate 250 to the tubular portion 440. It is preferable to employ a material having high heat conductivity to form the plate portion 430, for example a metal such as aluminum.

A portion of the plate portion 430 uncovered with the substrate 250 will hereafter be referred to as exposed portion 431. The exposed portion 431 has a ring shape in a plan view. An alumite treatment is applied to the exposed portion 431 of the plate portion, which is formed of aluminum.

The tubular portion 440 has a tubular shape as a whole, and is attached to the plate portion 430 by means of a bolt or an adhesive (neither shown). It is preferable to employ a material having high heat conductivity to form the tubular portion 440, for example a metal such as aluminum.

The tubular portion 440 includes a plurality of fins 441 and a power source cavity 442. The fins 441 are each formed so as to radially project outward. The power source cavity 442 accommodates therein at least a part of the power source unit 500, and in this embodiment a most part of the power source unit 500 is accommodated.

The power source unit 500 generates a DC power suitable for activating the LED module 201 (LED chip 202), for example from a commercial AC power of 100 V and supplies the DC power to the LED module 201 (LED chip 202). The power source unit 500 includes the power supply substrate 510 and the plurality of electronic parts 520.

The power supply substrate 510 is formed of, for example, a glass composite copper-clad laminate in a circular shape as a whole. As shown in FIG. 33, the plurality of electronic parts 520 are mounted on the lower surface of the power supply substrate 510. The electronic parts 520 serve to convert, for example, the commercial AC power of 100 V into the DC power suitable for activating the LED module 201 (LED chip 202). The electronic parts 520 include a capacitor, a resistor, a coil, a diode, an IC, and so forth.

As shown in FIGS. 33 and 36, the power source unit 500 and the substrate 250 are connected to each other through wiring or two wiring elements 530. As shown in FIG. 36, each wiring element 530 is routed from the power source unit 500 to the mounting surface 261 of the base member 260, through one of the pair of openings 253 farther from the pad 252. The wiring element 530 is then extended to the other opening 253 closer to the pad 252, along the mounting surface 261 of the base member 260. Further, each wiring element 530 is routed through the opening 253 closer to the pad 252, as far as the back surface 262 of the base member 260. Up to the back surface 262 from the power source unit 500, the core wire 531 of the wiring element 530 is covered with a shield 532. At the tip portion of the wiring element 530, the core wire 531 is exposed from the shield 532. The exposed portion of the core wire 531 is connected to the pad 252 with the solder 533. Each of the pair of openings 253 is filled with a seal material 254. In this embodiment, the seal material 254 is formed by filling the gap between the opening 253 and the wiring element 530 with an insulation resin.

The base 550 is the portion to be attached to an illumination instrument designed for common electric bulbs conforming to e.g. JIS, and attached to the lower end portion of the heat dissipator 400. The base 550 is designed in compliance with the specifications E17, E26 of JIS. The base 550 is connected to the power source unit 500 through wiring (not shown).

The globe 600 serves to protect the LED module 201, and is formed of a transparent or semitransparent glass or resin. The globe 600 is fixed to the heat dissipator 400. The outer surface of the globe 600 may be finished as a rough surface. The rough surface can be obtained, for example, through a shot blasting process. A cold mirror coating is applied to the inner surface of the globe 600. The cold mirror coating refers to a process of forming a surface that selectively reflects infrared light and transmits other light, for example visible light, with high transmittance.

The LED lightbulb 106 offers the following advantageous effects.

According to this embodiment, as shown in FIGS. 33 and 36, the core wire 531 of the wiring element 530 is connected to the pad 252 formed on the back surface 262 of the base member 260. Therefore, even though bromine contained in the solder 533 is emitted, the bromine can be prevented from directly reaching the LED module 201. Consequently, the decrease in light amount of the LED lightbulb 106 can be suppressed.

The wiring element 530 is routed from the power source unit 500 to the pad 252 through the pair of openings 253, i.e., so as to circumvent the mounting the surface 261 of the base member 260. Accordingly, in case that the wiring element 530 is subjected to a tensile force acting toward the power source unit 500, the portion of the wiring element 530 circumventing along the mounting surface 261 serves a buffer that mitigates the tensile force, for example by entering into contact with the mounting surface 261. Such an arrangement restricts the tensile force from directly exerting on the solder 533, thereby preventing disconnection of the core wire from the pad 252.

The openings 253 are filled with the seal material 254. Accordingly, the bromine that may be emitted from the solder 533 can be prevented from flowing to the side of the mounting surface 261.

Since the wiring element 530 is routed to the back surface 262 through one of the pair of openings 253 closer to the pad 252, the length of the wiring element 530 between the opening 253 and the pad 252 can be minimized.

When the LED module 201 generates heat through the light emitting action, the heat is transmitted to the radiator 490 through the substrate 250. Since the radiator 490 has a higher radiation rate than the substrate 250, the radiator 490 produces a larger amount of radiation heat than the substrate 250. The radiation heat is reflected by the globe 600 which bears the cold mirror coating. The reflected radiation heat is absorbed by the exposed portion 431 of the plate portion 430 of the heat dissipator 400, which can efficiently absorb heat because of the alumite treatment. Consequently, the heat from the LED module 201 can be transferred to the heat dissipator 400 utilizing the heat radiation phenomenon.

Employing a ceramic to form the radiator 490 is advantageous for achieving higher radiation rate and specific heat of the radiator 490. Finishing the radiator 490 in a black color further increases the radiation rate of the radiator 490.

Figure 37:
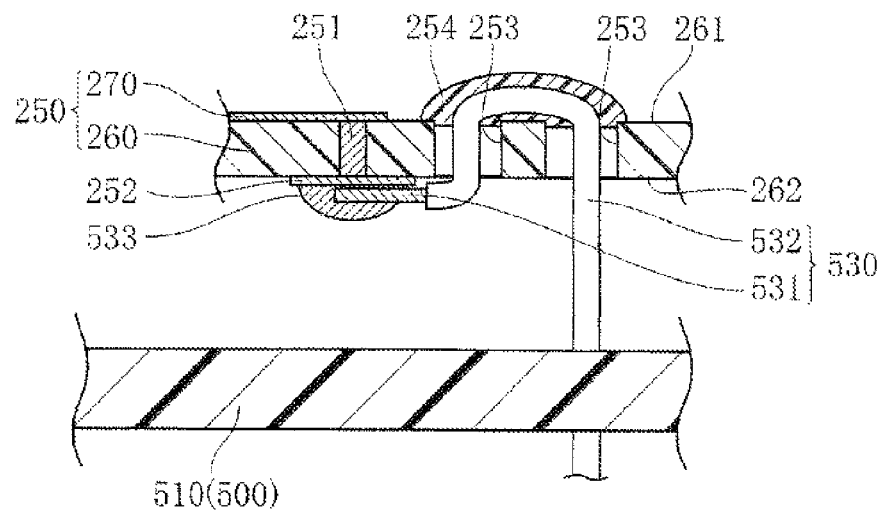
FIG. 37 is an enlarged fragmentary cross-sectional view showing a variation of the LED lightbulb according to the present invention.
Figure 38:
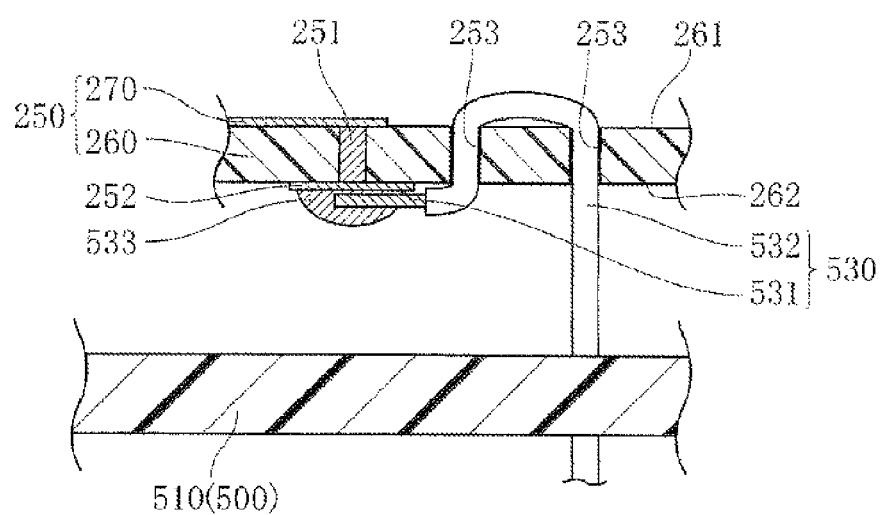
FIG. 38 is an enlarged fragmentary cross-sectional view showing another variation of the LED lightbulb according to the present invention.

FIGS. 37 and 38 depict a variation of the LED lightbulb 106. In these drawings, constituents the same as or similar to those of the foregoing embodiments are given the same numeral.

In the variation shown in FIG. 37, the seal material 254 closes the pair of openings 253 from the side of the mounting surface 261. In this variation, the seal material 254 is formed so as to only partially intrude into the pair of openings 253. The seal material 254 according to the variation can be formed by applying an insulative resin paste to the mounting surface 261 so as to cover the pair of openings 253, after passing the wiring 530 through the both openings 253. Such a configuration as the variation can also prevent bromine of the solder 533 from leaking to the side of the mounting surface 261.

The variation shown in FIG. 38 does not include the seal material 254. However, the opening 253 has an inner diameter that allows the wiring 530 to be fitted without a gap. Accordingly, the shield 532 of the wiring 530 makes close contact with the opening 253. Such a configuration as the variation can also prevent bromine of the solder 533 from leaking to the side of the mounting surface 261.

The LED lightbulb according to the present invention is not limited to the foregoing embodiments. Specific configuration of the parts of the LED lightbulb according to the present invention may be modified in various manners.

The technical configuration of the LED lightbulb according to the foregoing embodiment may be itemized as the following appendices.

[Appendix C1]

An LED lightbulb including:

one or more LED chips;

a substrate including a base member having a mounting surface and a back surface oriented opposite to each other, the substrate supporting the LED chips on the mounting surface;

a power source unit located opposite to the LED chips with respect to the substrate and configured to supply power for causing the LED chips to emit light;

a base located opposite to the substrate with respect to the power source unit; and a globe that covers the LED chips and transmits the light from the LED chips, wherein the substrate includes an interconnect pattern provided on the mounting surface of the base member, a pad provided on the back surface of the base member, and a conductive portion for electrical connection between the interconnect pattern and the pad, the pad being electrically connected to the LED chips, and the LED lightbulb including wiring having an end portion connected to the power source unit and the other end portion connected to the pad.

[Appendix C2]

The LED lightbulb according to Appendix C1, wherein the substrate includes a pair of openings, and the wiring is routed from the power source unit to the back surface of the base member through one of the pair of openings, via the mounting surface of the base member, and through the other of the pair of openings.

[Appendix C3]

The LED lightbulb according to Appendix C2, further including a seal material that closes the pair of openings.

[Appendix C4]

The LED lightbulb according to Appendix C3, wherein the seal material is formed of an insulative resin.

[Appendix C5]

The LED lightbulb according to Appendix C3 or C4, wherein the pair of openings is filled with the seal material.

[Appendix C6]

The LED lightbulb according to any of Appendices C2 to C5, wherein one of the pair of openings is located closer to the pad than the other as viewed in a depthwise direction of the base member, and the wiring is routed from the power source unit to the mounting surface of the base member through the opening more distant from the pad, and from the mounting surface of the base member to the back surface thereof through the opening closer to the pad.

[Appendix C7]

The LED lightbulb according to any of Appendices C2 to C6, wherein a plurality of the LED chips are arranged in an annular shape as viewed in the depthwise direction of the base member, and the pair of openings and the pad are located inside the plurality of LED chips as viewed in the depthwise direction of the base member.

[Appendix C8]

The LED lightbulb according to any of Appendices C1 to C7, wherein the conductive portion is formed so as to penetrate through the base member.

[Appendix C9]

The LED lightbulb according to any of Appendices C1 to C8, wherein the wiring is soldered to the pad.

[Appendix C10]

The LED lightbulb according to any of Appendices C1 to C9, further including a radiator provided on the mounting surface of the base member, the radiator having a higher radiation rate than the mounting surface of the substrate.

[Appendix C11]

The LED lightbulb according to Appendix C10, wherein the radiator has a higher specific heat than the base member.

[Appendix C12]

The LED lightbulb according to Appendix C10 or C11, wherein the radiator is formed of a ceramic.

[Appendix C13]

The LED lightbulb according to any of Appendices C10 to C12, wherein the radiator is finished in a black color.

[Appendix C14]

The LED lightbulb according to any of Appendices C10 to C13, wherein an inner surface of the globe is subjected to a cold mirror coating process.

[Appendix C15]

The LED lightbulb according to any of Appendices C10 to C14, further including a heat dissipator that supports the substrate, the heat dissipator including an exposed portion exposed from the substrate in a direction in which the substrate extends.

[Appendix C16]

The LED lightbulb according to Appendix C15, wherein the heat dissipator is formed of aluminum, and the exposed portion is subjected to an alumite treatment.

[Appendix C17]

The LED lightbulb according to Appendix C15 or C16, wherein the heat dissipator includes a power source cavity in which the power source unit is to be stored.

[Appendix C18]

The LED lightbulb according to any of Appendices C15 to C17, wherein the base is located opposite to the globe with respect to the heat dissipator.

Hereafter, an LED lightbulb according to a seventh embodiment of the present invention will be described referring to some of the drawings. In the related drawings, constituents the same as or similar to those of the foregoing embodiments are given the same numeral. The drawings are schematic representations, and hence a scale or a ratio of dimensions may differ among the drawings.

Figure 39:
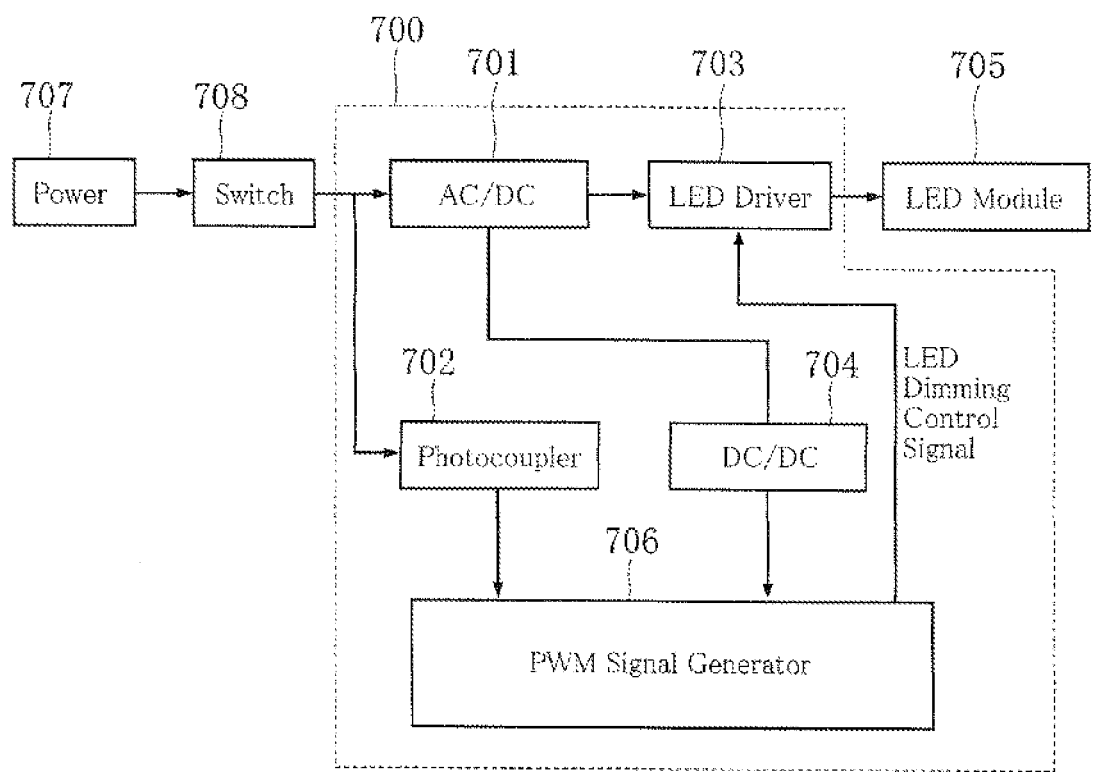
FIG. 39 is a block diagram showing a configuration of a dimming control unit and related components, provided in the LED lightbulb according to the present invention.

FIG. 39 is a block diagram showing a configuration of a dimming control unit in the LED lightbulb according to this embodiment. A switch 708 is connected to an AC power source 707. The AC power source 707 and the switch 708 are provided outside the LED lightbulb. The dimming control unit 700 of the LED lightbulb is connected to the AC power source 707 through the switch 708. The dimming control unit 700 essentially includes an AC/DC converter 701 that converts an AC voltage into a DC voltage, a photocoupler 702, an LED driver 703 that generates a driving signal for the LED, a DC/DC converter 704, a pulse-width modulation (PWM) signal generator 706. In addition, a plurality of LED modules 705 connected in series are connected to the LED driver 703, so as to emit light in accordance with the driving signal from the LED driver 703. The dimming control unit 700 and the LED modules 705 are located inside the LED lightbulb.

The switch 708 corresponds to a switch provided on a room wall for example, to be used for supplying AC power to the LED lightbulb. When the switch 708 is first pressed, the AC voltage of the AC power source 707 is supplied to the dimming control unit 700. In the dimming control unit 700, the AC/DC converter 701 converts the inputted AC voltage to a DC voltage, and supplies the DC voltage to the LED driver 703 and the DC/DC converter 704. The DC/DC converter 704 steps down the inputted DC voltage and supplies the lowered DC voltage to the PWM signal generator 706. The pulse signal generated upon turning on the switch 708 is transmitted to the PWM signal generator 706 through the photocoupler 702 free from a noise.

Once the LED driver 703 receives the DC voltage from the AC/DC converter 701 and the dimming control signal from the PWM signal generator 706, the LED module 705 is made to emit light. The LED module 705 is connected to a constant current source, and the luminance is controlled on the basis of the duty ratio of the pulse signal. The LED dimming control signal in FIG. 39 represents such a control signal.

With consecutive off-on actions of the switch 708, the pulse signals are transmitted to the PWM signal generator 706 through the photocoupler 702. The PWM signal generator 706 is triggered by the pulse signal to generate the LED dimming control signal. The LED dimming control signal is a PWM signal, and the PWM signal is supplied to the LED driver 703, so that the LED driver 703 controls the light of the LED module 705.

Figure 43:
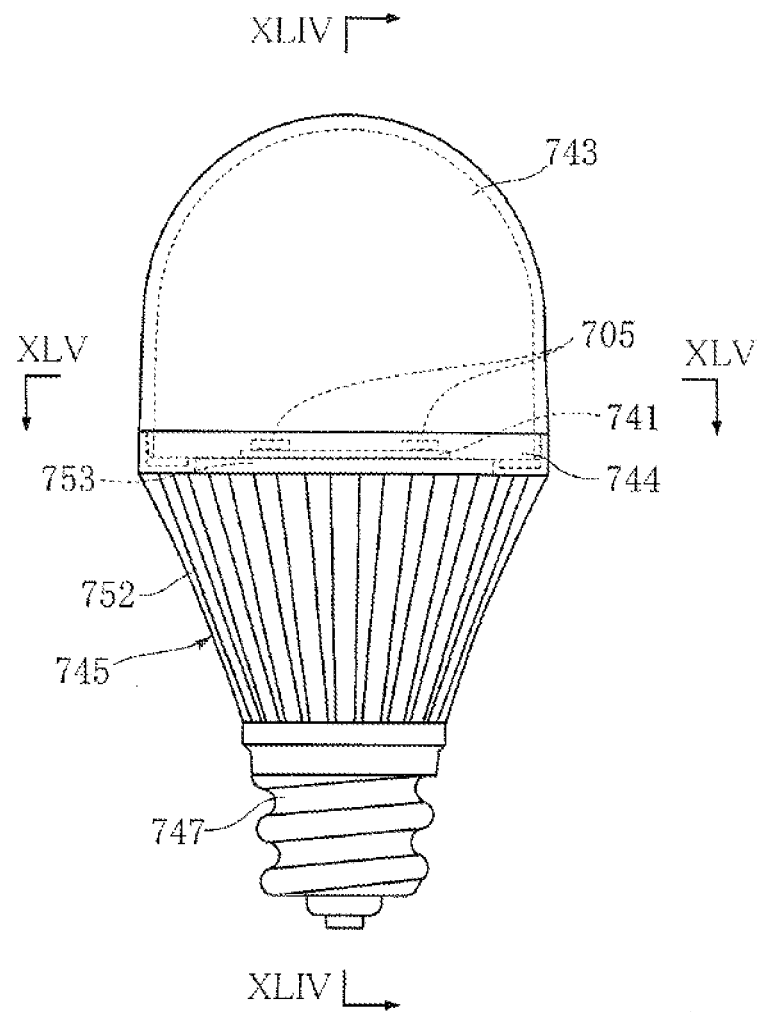
FIG. 43 is a front view showing an overall appearance of the LED lightbulb.
Figure 45:
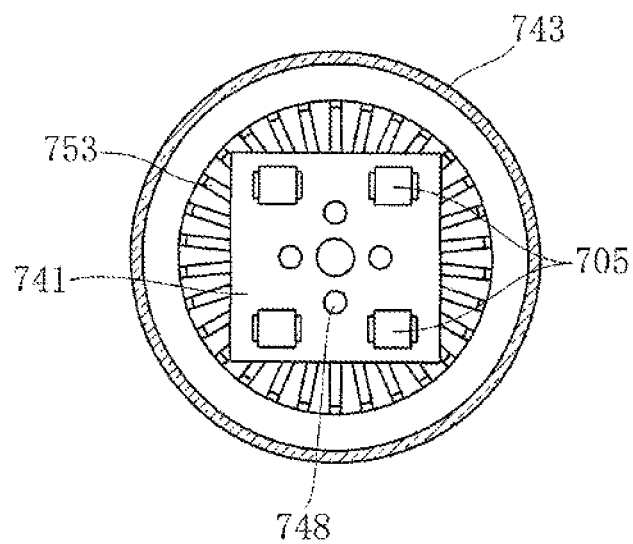
FIG. 45 is a cross-sectional view taken along a line XLV-XLV in FIG. 43.

An example of the configuration inside the LED lightbulb, where the dimming control unit 700 and the LED modules 705 are mounted, will be described here below. The LED lightbulb includes, as shown in FIGS. 43 to 45, a substrate 741, the plurality of LED modules 705, a cover 743, a bracket 744, a heat dissipator 745, the dimming control unit 700, and a base 747. The LED lightbulb is to be attached to an illumination instrument designed for an incandescent lightbulb, as substitute therefor.

The substrate 741 serves to support the LED modules 705, and includes a main body formed of a glass epoxy resin for example, on which an interconnect pattern is provided. Alternatively, the substrate 741 may include a main body formed of aluminum for example, an insulation layer formed on the main body, and an interconnect pattern stacked on the insulation layer. As shown in FIG. 45, the substrate 741 is formed, for example, in a generally square shape. As shown in FIGS. 44 and 45, the substrate 741 includes a plurality of fixing openings 748. The fixing openings 748 are utilized for combining the dimming control unit 700 and the substrate 741.

Figure 46:
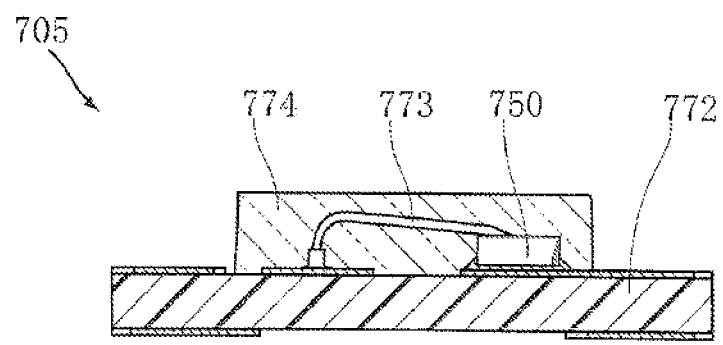
FIG. 46 is a cross-sectional view of an LED chip included in the LED lightbulb.
Figure 47:
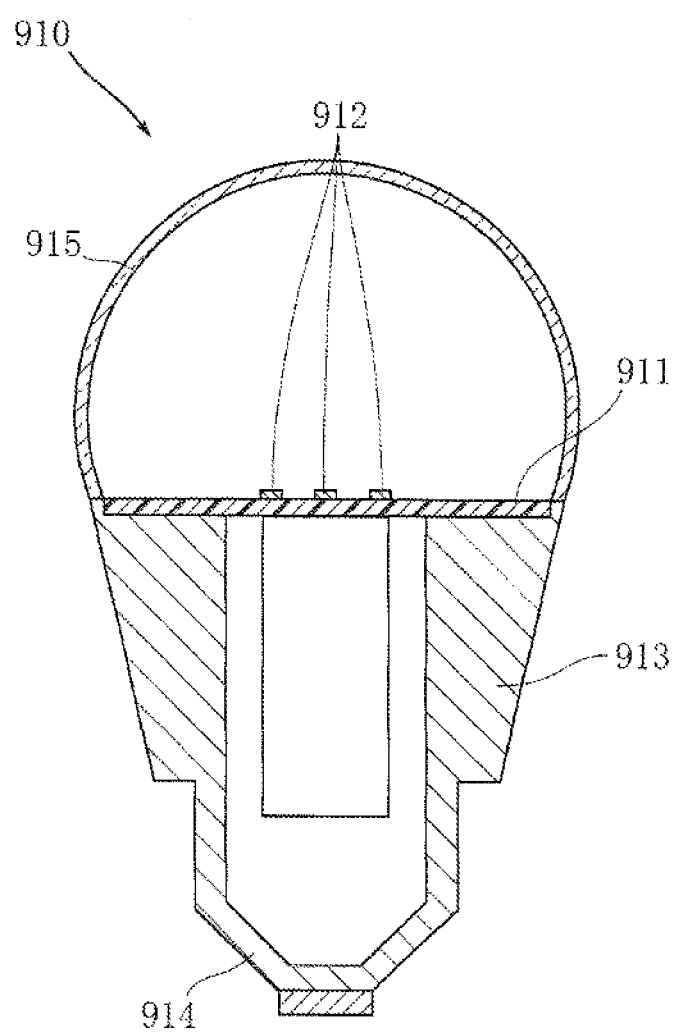
FIG. 47 is a cross-sectional view of a conventional LED lightbulb.
Figure 48:
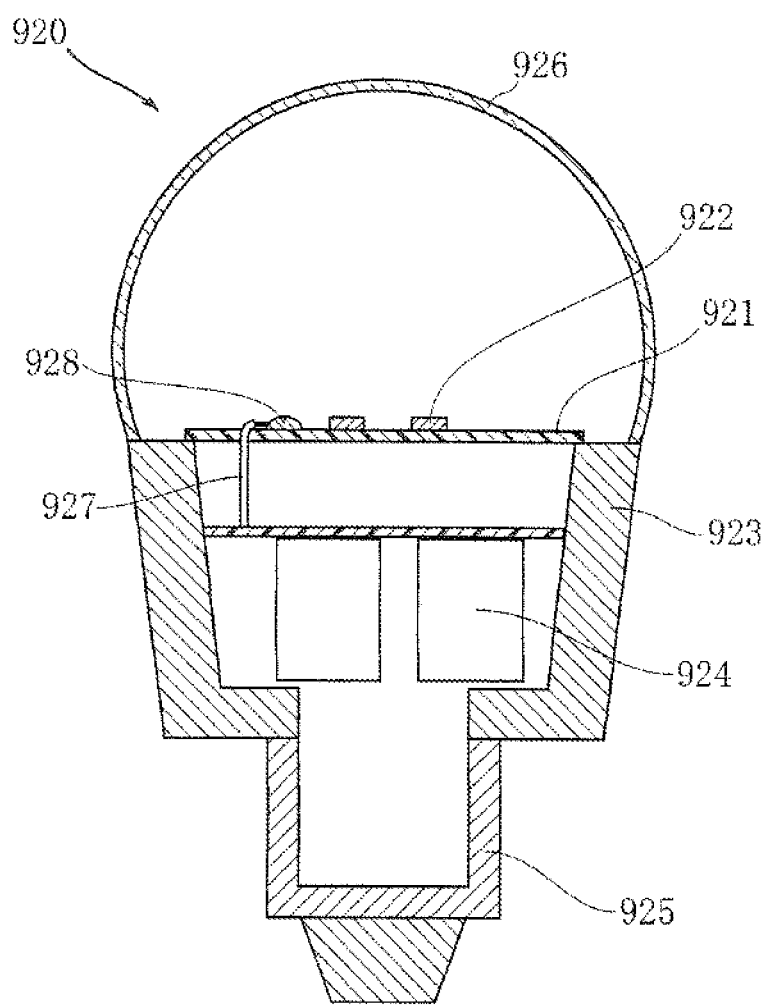
FIG. 48 is a cross-sectional view of another conventional LED lightbulb.

The plurality of LED modules 705 are configured to emit, for example, white light. As shown in FIG. 45, four LED modules 705 are mounted on the substrate 741 at the respective corners. The LED modules 705 each include, as shown in FIG. 46, an LED chip 750, a substrate 772, a wire 773, and an encapsulating resin 774.

The LED chip 750 includes a p-type semiconductor layer and an n-type semiconductor layer, for example formed of a GaN-based semiconductor material, and an active layer interposed between the p-type semiconductor layer and the n-type semiconductor layer. The LED chip 750 is configured to emit blue light, for example. The substrate 772 serves to support the LED chip 750, and includes a main body formed of a glass epoxy resin for example, on which an interconnect pattern is provided. The interconnect pattern includes a portion where the LED chip 750 is mounted, a portion serving as a mounting electrode for surface-mounting the LED chip 750, and so forth.

The wire 773 is formed of Au for example, and provides electrical connection between the upper surface of the LED chip 750 and the interconnect pattern. The encapsulating resin 774 is provided so as to cover the LED chip 750 and the wire 773, and composed of a transparent epoxy resin, or a silicone resin containing a fluorescent material. The fluorescent material emits yellow light for example, upon being excited by the blue light emitted from the LED chip 750. This yellow light and the blue light from the LED chip 750 are mixed, so as to produce white light. The encapsulating resin 774 may be composed of a transparent epoxy resin or silicone resin containing, instead of the fluorescent material that emits yellow light, one that emits red light and another that emits green light upon being excited by the blue light, in mixture.

The cover 743 serves to protect the plurality of LED modules 705, and is formed of, for example, a transparent or semitransparent resin. In this embodiment, the cover 743 has an outer shape like the upper half of a prolate spheroid, whose central line corresponds to the axial direction Na.

The bracket 744 is for simplifying the coupling between the cover 743 and the heat dissipate 745. The bracket 744 is formed of a resin for example, in a ring shape.

The heat dissipator 745 serves to dissipate the heat from the LED modules 705, and includes a tubular portion 751, a plurality of fins 752, and a pedestal 753. For example, the heat dissipator 745 can be formed of aluminum through an extrusion process.

The tubular portion 751 is of a cylindrical shape having a central axis extending in the axial direction Na. The tubular portion 751 is formed throughout the heat dissipator 745 in the axial direction Na. The cross-sectional shape of the tubular portion 751 taken orthogonally to the axial direction Na is the same through the entirety of the tubular portion 751 in the axial direction Na.

The dimming control unit 700 provides a constant current source to the LED module 705 and performs the dimming control, and includes a substrate 761, a plurality of electronic parts 762, and a case 763. The substrate 761 is formed of a glass epoxy resin for example, in a slender rectangular shape. The plurality of electronic parts 762 may be mounted on the both faces of the substrate 761. The plurality of electronic parts 762 include those that perform the functions specified in the block diagram of the dimming control unit 700 shown in FIG. 39.

Figure 40:
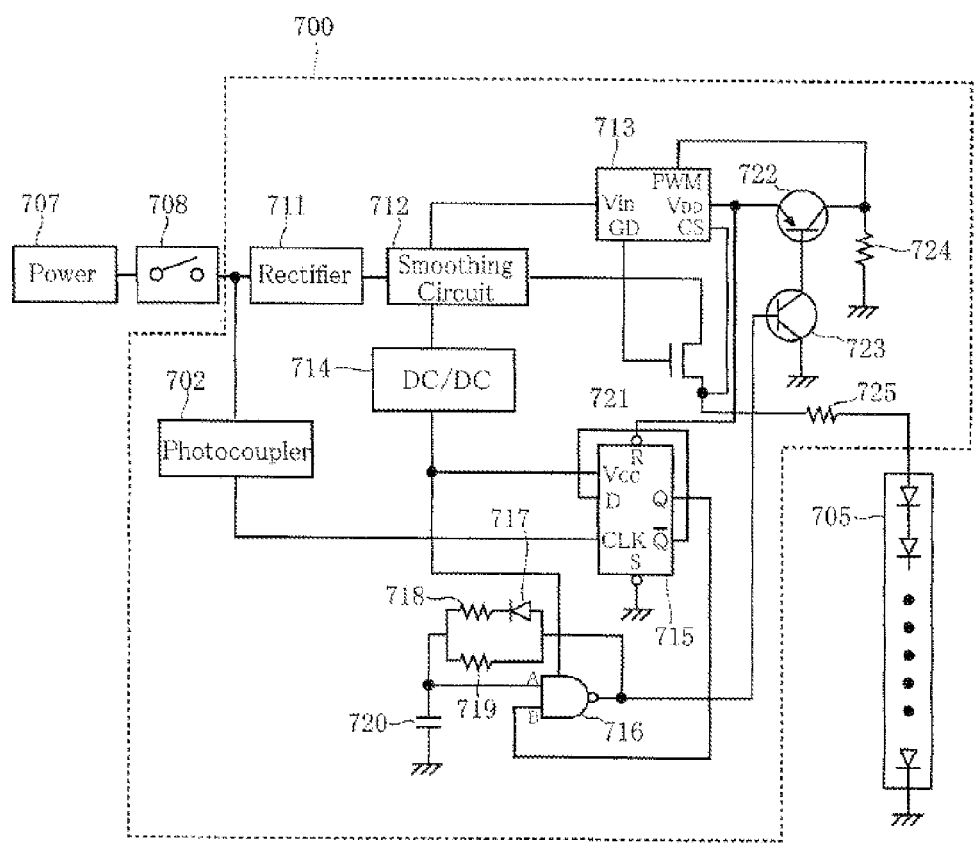
FIG. 40 is a circuit diagram of the dimming control unit shown in FIG. 39.

As described above, the dimming control unit 700 and the LED modules 705 are accommodated inside the LED lightbulb. Referring now to FIG. 40, an operation of the dimming control unit 700 will be described. FIG. 40 depicts a specific circuit configuration of the dimming control unit 700. The same constituents as those shown in FIG. 39 are given the same numeral. The dimming control unit 700 essentially includes a rectifying circuit 711, a smoothing circuit 712, an LED driver element 713, a DC/DC converter 714, a flipflop circuit 715, a NAND circuit 716, a diode 717, resistors 718, 719, a capacitor 720, an nMOSFET 721, an NPN transistor 722, a PNP transistor 723, and resistors 724, 725.

The correspondence between FIG. 39 and FIG. 40 is as follows. The AC/DC converter 701 includes the rectifying circuit 711 and the smoothing circuit 712. The LED driver 703 includes the LED driver element 713, the FET 721, the transistors 722, 723, and the resistors 724, 725. The DC/DC converter 704 corresponds to the DC/DC converter 714. The PWM signal generator 706 includes the flipflop circuit 715, the NAND circuit 716, the diode 717, the resistors 718, 719, and the capacitor 720.

The LED module 705 includes a plurality of LED chips connected in series, and FIG. 45 represents a configuration in which a plurality of LED modules 705 are connected in series. Although four LED modules 705 are shown in FIG. 45, the number of LED modules 705 is not limited to four. The rectifying circuit 711 may be constituted of, for example, a full-wave rectifying circuit that employs a diode bridge circuit. In addition, a capacitor circuit including an electrolytic capacitor may be employed as the smoothing circuit 712.

First, upon pressing the switch 708 to thereby connect the AC power source 707 to the LED lightbulb, the AC voltage is rectified by the rectifying circuit 711 and supplied to the smoothing circuit 712. The smoothing circuit 712 smoothes out the pulsating component of the alternating current, so that the current can be utilized as a DC source. The DC voltage thus smoothed out is supplied to the LED driver element 713, the DC/DC converter 714, and the drain terminal of the FET 721. The smoothed DC voltage is generated at, for example, 24 V±7.2 V (30%).

The LED driver element 713 serves to drive the LED with the constant current and to perform the dimming control with the PWM signal, and is activated once the DC voltage is supplied to the terminal Vin. The DC/DC converter 714 steps down the smoothed DC voltage to a still lower voltage, and outputs the lowered voltage. The DC voltage outputted from the DC/DC converter 714 is in a range of, for example, 3.5 V to 5 V. The lowered DC voltage is supplied as a source voltage to the terminal $V_{cc}$ of the flipflop circuit 715 and the NAND circuit 716.

The flipflop circuit 715 is of a D-flipflop type, in which the input terminal D and the output terminal Q (with bar) are short-circuited. The switching signal from the switch 708 is inputted to the clock terminal CLK of the flipflop circuit 715 through the photocoupler 702. The output terminal Q of the flipflop circuit 715 is connected to the input terminal Ib of the NAND circuit 716. A terminal of the capacitor 720 is connected to the other input terminal Ia of the NAND circuit 716, and the other terminal of the capacitor 720 is grounded.

Between the input terminal Ia of the NAND circuit 716 to which the capacitor 720 is connected and the output terminal of the NAND circuit 716, a circuit in which the resistor 718 and the diode 717 are serially connected is provided, and the resistor 719 is connected in parallel to the serially connected circuit.

When the switch 708 is first pressed so as to supply the AC power, the capacitor 720 is not charged and hence the input terminal Ia of the NAND circuit 716 connected to the capacitor 720 receives a LOW level signal. On the other hand, when the AC power is first supplied the output terminal Q of the flipflop circuit 715 outputs a LOW level signal, and hence the LOW level signal is inputted to the input terminal Ib of the NAND circuit 716. Accordingly, the NAND circuit 716 outputs a HIGH level signal, which is inputted to the base of the transistor 723.

The collector of the transistor 723 is connected to the base of the transistor 722, and the emitter of the transistor 723 is grounded. The emitter of the transistor 722 is connected to the terminal $V_{DD}$ of the LED driver element 713, and a predetermined voltage is supplied from the terminal $V_{DD}$. The collector of the transistor 722 is connected to an end of the resistor 724, and the other end of the resistor 724 is grounded. The collector of the transistor 722 is connected to the terminal PWM of the LED driver element 713.

Regarding the LED driver element 713, the terminal GD is the drive terminal for the gate of the FET 721, and the terminal $V_{DD}$ is the output terminal for the voltage regulator. The gate of the FET 721 is connected to the terminal GD of the LED driver element 713, the source of the FET 721 is connected in series to the resistor 725, and the resistor 725 is connected in series to the LED module 705.

The terminal PWM is the input terminal for receiving the PWM signal, to which, for example, the PWM signal having a frequency of 1 KHz and a magnitude of 5 V is inputted. The terminal CS is a detector of the LED current, and connected between the source terminal of the FET 721 and the resistor 725. To detect the LED current flowing through the source of the FET 721, the terminal CS detects the terminal voltage of the resistor 725 and compares the terminal voltage with a predetermined threshold voltage, and lowers the output of the terminal GD to the LOW level in the case where the terminal voltage is higher than the threshold voltage. When the terminal GD outputs the LOW level signal the gate terminal of the FET 721 receives the LOW level signal, and hence the FET 721 is turned off. Accordingly the power supply to the LED module 705 is stopped and the LED module 705 stops emitting light.

On the contrary, in the case where the voltage detected by the terminal CS is lower than the threshold voltage, a pulse signal Ps generated on the basis of an oscillation frequency in the LED driver element 713 is outputted to the terminal GD. The pulse signal Ps has a frequency sufficiently higher (for example 50 KHz) than that of the PWM signal, a magnitude of 24 V and a duty ratio of 50%. Here, the pulse signal Ps is outputted only in a period in which the PWM signal inputted to the terminal PWM is a HIGH level signal, i.e., in an ON period. The frequency of the pulse signal Ps can be varied on the basis of the value of the resistor connected between the RF terminal and the GND, in the case where the LED driver element 713 includes an RF terminal.

The dimming control for the LED module 705 is performed on the basis of the duty ratio of the PWM signal inputted to the terminal PWM. The LED module 705 emits brighter light with an increase in width of the HIGH level PWM signal, and the light from the LED module 705 becomes darker with a decrease in width of the HIGH level PWM signal.

The terminal $V_{DD}$ is the output terminal of the voltage regulator provided in the LED driver element 713, and configured to output a predetermined DC voltage.

The process of controlling the light with the switch 708 will now be described here below. As stated above, when the switch 708 is first pressed and the AC power is supplied, a HIGH level signal is inputted to the base of the transistor 723. Accordingly, the transistor 723 is turned on and so is the transistor 722, and hence a current flows through the resistor 724 so that a certain voltage is generated on the respective ends of the resistor 724. The resistance of the resistor 724 is determined such that the terminal voltage generated at the resistor 724 becomes, for example, 5 V. Thus, the HIGH level signal is continuously inputted to the terminal PWM of the LED driver element 713, and therefore the duty ratio of the PWM signal reaches 100% and the LED module 705 is lit up to its maximum luminance.

In the case where the off-on action is consecutively performed, more particularly where the switch 708 is once turned off and again turned on within a predetermined time after turning off the switch 708, the following operation is performed. Despite the switch 708 being turned off and the AC power source 707 being disconnected, the DC voltage supplied in the dimming control unit 700 does not immediately drop to zero. Accordingly, the output terminal Q of the flipflop circuit 715 is outputting the LOW level signal and the output terminal Q (with bar) of the flipflop circuit 715 is outputting the HIGH level signal, and therefore the HIGH level signal is provided to the terminal D.

Here, despite the AC power source being disconnected, the capacitor in the smoothing circuit 712 maintains a DC voltage that allows the logic circuit to operate for a certain period of time. The smoothing circuit 712 is constituted of an electrolytic capacitor of a predetermined value, and configured so as to maintain the DC voltage that allows the logic circuit to operate, for example, for three seconds.

Accordingly, in the case where the switch 708 is again turned on within the predetermined time (three seconds, for example) after the AC power source 707 is disconnected, the pulse signal based on the off-on action of the switch 708 is inputted to the clock terminal CLK of the flipflop circuit 715 through the photocoupler 702. Data inputted to the terminal D is acquired in synchronization with the rising of the pulse signal and outputted to the terminal Q, and therefore the terminal Q outputs the HIGH level signal.

In addition, when the off-on action of the switch 708 is performed the capacitor 720 remains charged, and hence the HIGH level signal is inputted to the input terminal Ia of the NAND circuit 716. Since the output from the terminal Q of the flipflop circuit 715 is inputted to the input terminal Ib of the NAND circuit 716, the input terminal Ib also receives the HIGH level signal. Accordingly, the NAND circuit 716 outputs the LOW level signal.

When the NAND circuit 716 outputs the LOW level signal the charge stored in the capacitor 720 is discharged through the resistor 719, and hence the LOW level signal is inputted to the input terminal Ia of the NAND circuit 716. The input terminal Ib of the NAND circuit 716 is still receiving the HIGH level signal, and when the input terminal Ia of the NAND circuit 716 receives the LOW level signal, the NAND circuit 716 outputs the HIGH level signal.

When the NAND circuit 716 outputs the HIGH level signal, the current is supplied to the capacitor 720 through the diode 717 and the resistor 718, and hence the capacitor 720 is charged. When the capacitor 720 is charged the input terminal Ia of the NAND circuit 716 receives the HIGH level signal, and since the input terminal Ib of the NAND circuit 716 is still receiving the HIGH level signal, the NAND circuit 716 outputs the LOW level signal. With such repetitions of the charging and discharging of the capacitor 720, the NAND circuit 716 alternately outputs the HIGH level signal (ON period) and the LOW level signal (OFF period), thus to generate a pulse signal (PWM signal).

The input terminal Ib of the NAND circuit 716 serves as the gate. When the HIGH level signal is inputted to the input terminal Ib of the NAND circuit 716, the signal inputted to the input terminal Ia is outputted as it is. Conversely, when the input terminal Ib NAND circuit 716 receives the LOW level signal, the signal inputted to the input terminal Ia is not outputted but the output from the NAND circuit 716 is fixed at the HIGH level.

Further, the NAND circuit 716, the diode 717, the resistors 718, 719, and the capacitor 720 constitute an oscillation circuit. The oscillation circuit and the flipflop circuit 715 constitute a PWM signal generation circuit. The PWM signal outputted from the NAND circuit 716 is supplied to the transistor 723 so as to turn on and off the transistor 723, and the on/off action of the transistor 723 turns on and off the transistor 722, so as to supply the PWM signal to the terminal PWM of the LED driver element 713. As stated above, an LED driving signal of a predetermined frequency is outputted from the terminal GD of the LED driver element 713 only in the ON period of the PWM signal, so as to cause the LED module 705 to emit light.

Thus, by turning off the switch 708 and then turning it on within the predetermined time the light is dimmed from the maximum luminance to a predetermined luminance. Here, on the assumption that the resistance of the diode 717 is zero, the ON period of the PWM signal is determined on the basis of the charging time that depends on the capacity of the capacitor 720 and the resistance of the resistor 718, and the OFF period of the PWM signal is determined on the basis of the discharging time that depends on the capacity of the capacitor 720 and the resistance of the resistor 719. In other words, the ON period and the OFF period can be determined as time constant C×R1 and time constant C×R2 respectively, where C represents the capacity of the capacitor 720, R1 represents the resistance of the resistor 718, and R2 represents the resistance of the resistor 719.

Although the PWM signal generator 706 is constituted of the logic circuit including the NAND circuit 716, the diode 717, the resistors 718, 719, the capacitor 720, and so forth, the foregoing function may be performed by a microprocessor (MPU).

Figure 41:
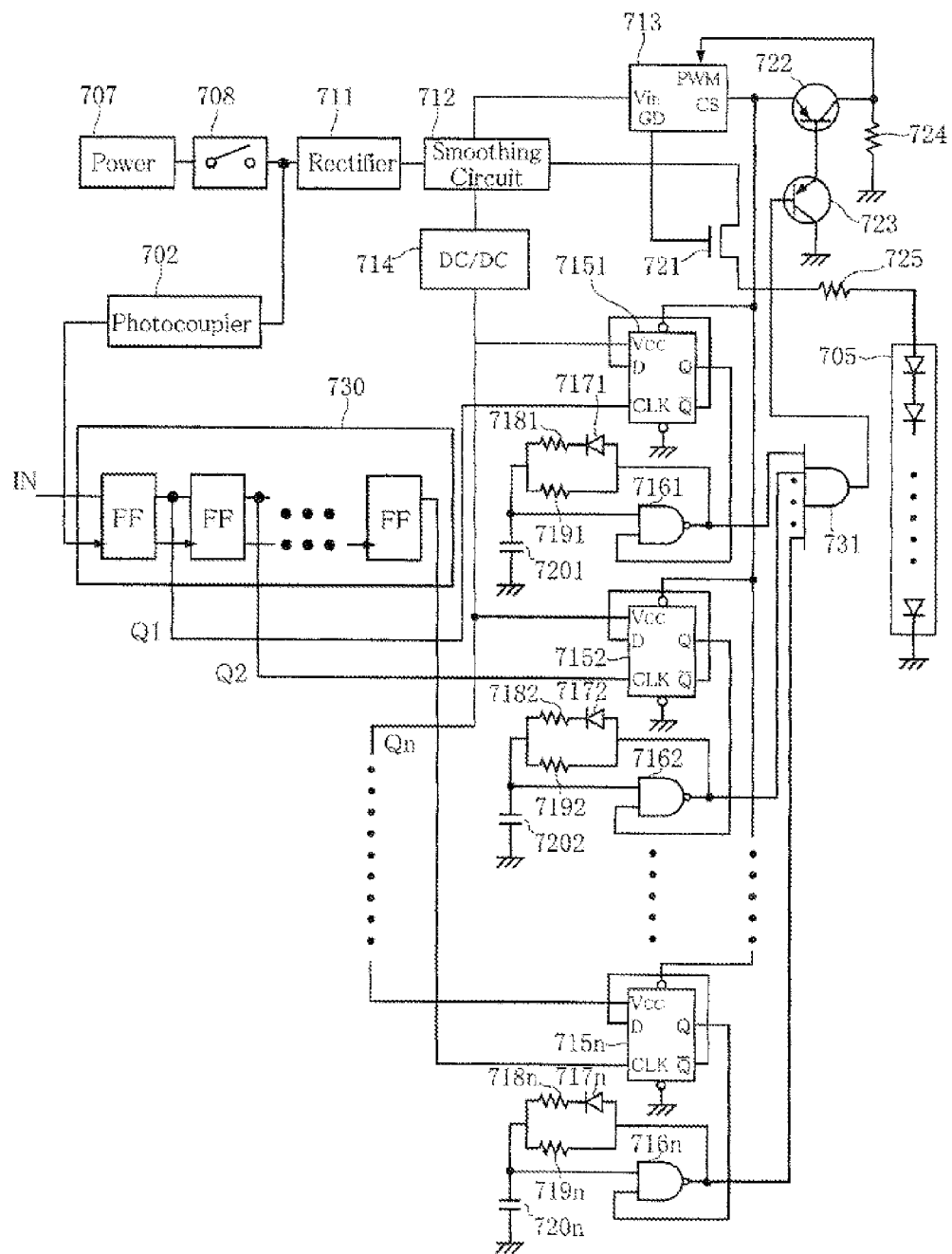
FIG. 41 is a circuit diagram of the dimming control unit shown in FIG. 39, configured so as to control light in n stages.
Figure 42:
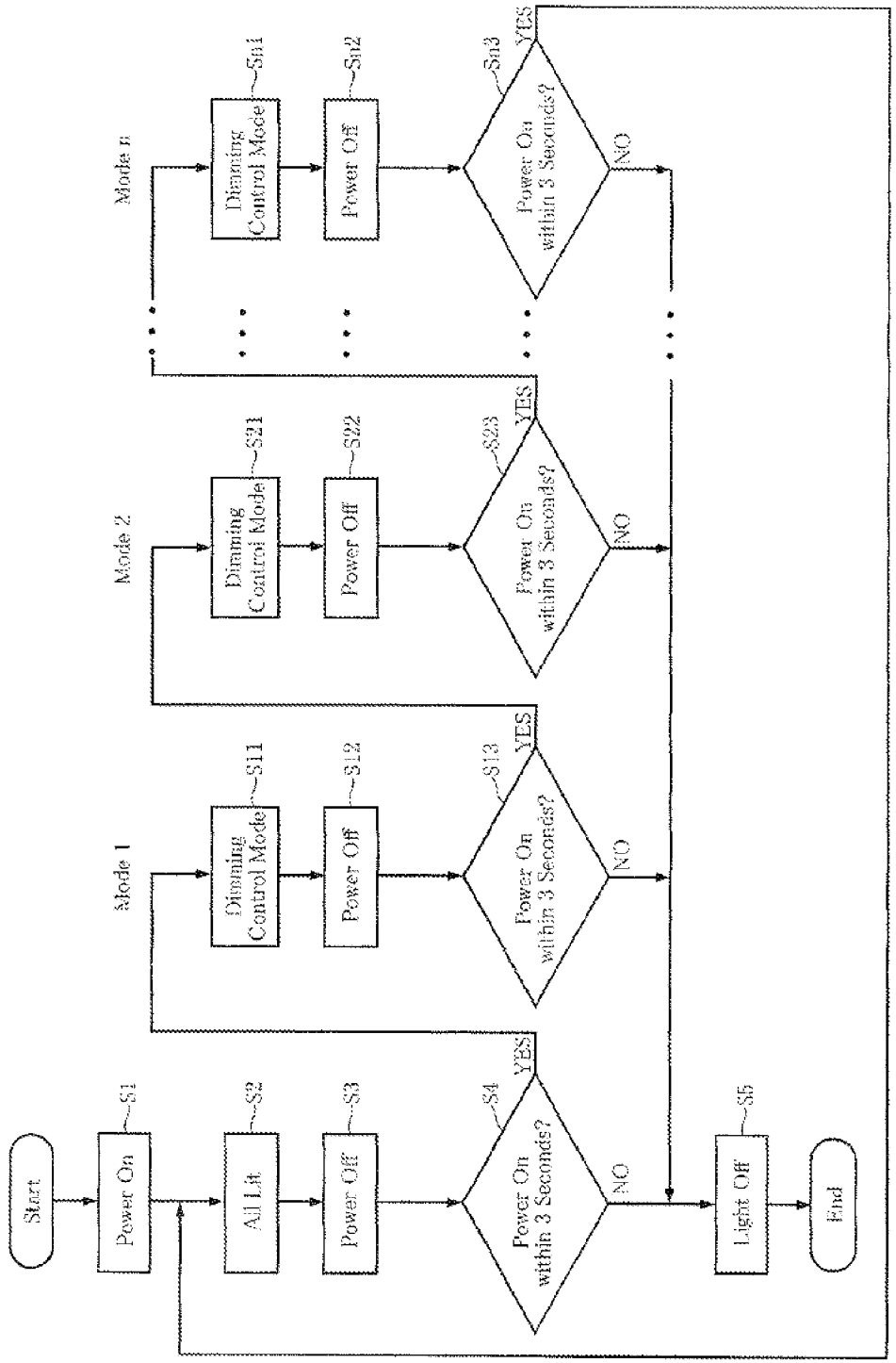
FIG. 42 is a flowchart showing a process performed by the dimming control unit shown in FIG. 41, to control light in n stages.

Hereunder, a method to control the light in multiple stages utilizing the circuit shown in FIG. 40 will be described. FIG. 41 depicts an example of a circuit capable of performing a multi-stage dimming control. FIG. 42 is a flowchart showing the multi-stage dimming control process. In FIG. 41, the same constituents as those of FIG. 40 are given the same numeral, and the description thereof will not be repeated.

Although FIG. 40 only shows a single PWM signal generation circuit including the flipflop circuit 715, the NAND circuit 716, the diode 717, the resistors 718, 719, and the capacitor 720, FIG. 41 shows a configuration in which n pieces of PWM signal generation circuits are provided.

A first PWM signal generation circuit includes a flipflop circuit 715₁, an NAND circuit 716₁, a diode 717₁, resistors 718₁, 719₁, and a capacitor 720₁. A second PWM signal generation circuit includes a flipflop circuit 715₂, an NAND circuit 716₂, a diode 717₂, resistors 718₂, 719₂, and a capacitor 720₂. Thus, an n-th PWM signal generation circuit includes a flipflop circuit 715*n*, an NAND circuit 716*n*, a diode 717*p*, resistors 718*n*, 719*n*, and a capacitor 720*n*.

In addition, the values of the resistors 7181 to 18*n*, the resistors 7191 to 19*n*, and the capacitors 7201 to 20*n* are respectively determined such that the ON period of the PWM signal becomes shorter in stages, i.e., such that the duty ratio becomes lower, from the first PWM signal generation circuit to the n-th PWM signal generation circuit.

A shift register 730 is composed of n pieces of flipflop circuits (FF), and configured so as to serially transfer data stored in each FF, triggered by an input of a clock signal. With a first off-on action of the switch 708 performed within the predetermined time, data 1 inputted to the input terminal IN is read out and outputted to a terminal Q1. At this moment, the output from the shift register 730 (from Q1, Q2, . . . , Qn) is (1, 0, . . . , 0).

Regarding the input of the data 1 to the input terminal IN, 1 is inputted only at the first off-on action of the switch 708 performed within the predetermined time, the second off-on action performed within the predetermined time, an (n+2)th off-on action performed within the predetermined time, and an (n+3)th off-on action performed within the predetermined time, and 0 is inputted otherwise. The input of the data 1 to the input terminal IN is performed, for example, by a microprocessor.

For example, when the second off-on action of the switch 708 is performed within the predetermined time, the output from the shift register 730 (Q1, Q2, Q3, . . . , Qn) becomes (1, 1, 0, . . . , 0). When the third off-on action of the switch 708 is performed within the predetermined time, the output from the shift register 730 (Q1, Q2, Q3, . . . , Qn) becomes (0, 1, 1, . . . , 0). When the n-th off-on action of the switch 708 is performed within the predetermined time, the output from the shift register 730 (Q1, Q2, . . . , Q–1, Qn) becomes (0, 0, . . . , 1, 1). When the (n+1)th off-on action of the switch 708 is performed within the predetermined time, the output from the shift register 730 (Q1, Q2, . . . , Qn–1, Qn) becomes (0, 0, . . . , 0, 1).

When the switch 708 is first pressed so as to supply the AC power (S1), the shift register 730 outputs (0, 0, . . . , 0) and hence a HIGH level signal is inputted to all input terminals of an AND circuit 731, so that the AND circuit 731 keeps outputting the HIGH level signal. Accordingly, the PWM signal gains a duty ratio of 100% and the LED module is lit up to its maximum luminance (S2). In the case where the consecutive off-on action is then performed, i.e., the switch 708 is once turned off (S3) and then turned on within the predetermined time after the switch 708 is turned off, the following operation is performed. In this embodiment, it will be assumed that the predetermined time is three seconds.

It is decided whether the AC power has been turned on again within three seconds after the AC power was disconnected (S4), and in the affirmative case (YES at S4), the operation proceeds to a mode 1, in which the first stage dimming control is performed (S1). In the case where the AC power is not turned on within three seconds (NO at S4), the light is turned off (S5).

The mode 1 in which the light is dimmed to the first stage is performed as follows. In this case, since the output from the shift register 730 is (1, 0, . . . , 0), the data 1 outputted from the terminal Q1 is inputted to the clock terminal of the flipflop circuit 7151 of the first PWM signal generation circuit. As described with reference to FIG. 40, when the switch 708 is turned off and then turned on within the predetermined time, the HIGH level signal outputted from the Q (with bar) terminal of the flip-flop circuit 7151 is inputted to the terminal D. Therefore, the terminal Q of the flipflop circuit 7151 outputs the HIGH level signal in accordance with the rising of the output signal from Q1.

Accordingly the gate of the NAND circuit 7161 is opened, and the output terminal of the NAND circuit 7161 outputs the pulse signal (PWM signal) on the basis of the repetition of charging and discharging of the capacitor 7201 described referring to FIG. 40.

On the other hand, the pulse signal is not provided to the clock terminals other than that of the flipflop circuit 7151, and the LOW level signal keeps being inputted to the remaining flipflop circuits. Accordingly, the respective terminals Q of the flipflop circuits 7152 to 715n keep outputting the LOW level signal, and thus all the NAND circuits 7162 to 716n output the HIGH level signal.

Therefore, all the input terminals of the AND circuit 731 except the one connected to the output terminal of the NAND circuit 7161 receive the HIGH level signal, and the PWM signal outputted from the NAND circuit 7161 appears as it is in the output from the AND circuit 731. Such an output of the AND circuit 731 drives the transistors 723, 722 so as to supply the PWM signal to the terminal PWM of the LED driver element 713, so that the first stage dimming control is performed.

Now, a transition from the mode 1 in which the light is dimmed to the first stage to a mode 2 in which the light is dimmed to the second stage will be described hereunder. In the state where the light is dimmed to the first stage (S11), the switch 708 is turned off to disconnect the AC power (S12). In the case where the switch 708 is again turned on for connection with the AC power source 707 within three seconds (YES at S13), the operation proceeds to the mode 2. On the contrary, in the case where the switch 708 is not turned on within three seconds after being turned off (NO at S13), the light is turned off (S5).

In the case of YES at S13, the second pulse signal is inputted through the photocoupler 702, and hence the output from the shift register 730 (Q1, Q2, Q3, . . . , Qn) becomes (1, 1, 0, . . . , 0), as described above. Accordingly, the clock signal is provided to the clock terminal of the flip-flop circuit 7151 of the first PWM signal generation circuit, so that the LOW level signal inputted to the terminal D is outputted through the terminal Q. Therefore the gate of the NAND circuit 7161 is closed and the NAND circuit 7161 keeps outputting the HIGH level signal.

At the same time, the clock signal is provided to the clock terminal of the flipflop circuit 7152 of the second PWM signal generation circuit, so that the LOW level signal inputted to the terminal D is outputted through the terminal Q. Accordingly the gate of the NAND circuit 7162 is opened, and the output terminal of the NAND circuit 7162 outputs the pulse signal (PWM signal) on the basis of the repetition of charging and discharging of the capacitor 7202.

On the other hand, the pulse signal is not provided to the clock terminals other than those of the flipflop circuits 7151, 7152 and the LOW level signal keeps being inputted to the remaining flipflop circuits. Accordingly, the respective terminals Q of the flipflop circuits 7153 to 715n keep outputting the LOW level signal, and thus all the NAND circuits 7163 to 716n output the HIGH level signal.

Therefore, all the input terminals of the AND circuit 731 except the one connected to the output terminal of the NAND circuit 7161 receive the HIGH level signal, and the PWM signal outputted from the NAND circuit 7162 appears as it is in the output from the AND circuit 731. Such an output of the AND circuit 731 drives the transistors 723, 722 so as to supply the PWM signal to the terminal PWM of the LED driver element 713, so that the second stage dimming control is performed (S21).

The foregoing operation is repeated to the mode n. For example, the transition to a mode 3 for a third stage dimming control is performed as follows. When a third pulse signal is inputted through the photocoupler 702, the output of the shift register 730 (Q1, Q2, Q3, . . . , Qn) becomes (0, 1, 1, . . . , 0). Then the clock signal is provided to the clock terminal of the flipflop circuit 7152 of the second PWM signal generation circuit, so that the LOW level signal inputted to the terminal D is outputted through the terminal Q. Therefore the gate of the NAND circuit 7162 is closed and the NAND circuit 7162 keeps outputting the HIGH level signal.

At the same time, the clock signal is provided to the clock terminal of the flipflop circuit 7153 of the third PWM signal generation circuit (not shown), so that the HIGH level signal inputted to the terminal D is outputted through the terminal Q. Accordingly the gate of the NAND circuit 7163 is opened, and the output terminal of the NAND circuit 7163 outputs the pulse signal (PWM signal) on the basis of the repetition of charging and discharging of the capacitor 7203. Then the PWM signal outputted from the NAND circuit 7163 appears as it is in the output of the AND circuit 731.

As described above, the oscillation circuit is driven by the first data of 1 outputted from the shift register 730 so as to generate the PWM signal, and then the oscillation circuit is stopped by the second data of 1 to thereby detain the PWM signal.

Upon reaching the mode n through the repetition of such operations (Sn1), the output terminal of the NAND circuit 716n outputs the pulse signal (PWM signal) on the basis of the repetition of charging and discharging of the capacitor 720n. Accordingly, the PWM signal outputted from the NAND circuit 716n appears as it is in the output of the AND circuit 731.

Then the switch 708 is turned off so as to disconnect the AC power (Sn2). In the case where the switch 708 is again turned on for connection with the AC power source 707 within three seconds (YES at Sn3), the LED module 705 resumes the maximum luminance as S2. On the contrary, in the case where the switch 708 is not turned on within three seconds after being turned off (NO at Sn3), the light is turned off (S5).

In the case where the off-on action of the switch 708 is further continued within three seconds, the dimming control in multiple stages is again performed from the mode 1.

As described thus far, consecutively turning on and off a switch, for example provided on a room wall for connecting and disconnecting the AC power source and the LED, enables the dimming control of the LED to be performed in stages.

In addition, one or a plurality of PWM signal generation circuits may be employed for color control, out of the n pieces of the PWM signal generation circuits.

The technical configuration of the LED lightbulb according to the foregoing embodiment may be itemized as the following appendices.

[Appendix D1]
An LED lightbulb including thereinside:
an LED chip; and
a dimming control unit that controls light from the LED chip in stages with a pulse-width modulation signal,
wherein the dimming control unit is activated to generate the pulse-width modulation signal by an off-on action of an external switch connecting an external AC power source and inside of the LED lightbulb.

[Appendix D2]
The LED lightbulb according to Appendix D1, wherein the dimming control unit includes an AC/DC converter that generates a DC voltage from the external AC power source, an LED driver that generates a pulse signal for driving the LED chip, and a PWM signal generator that generates a pulse-width modulation signal for controlling the LED driver.

[Appendix D3]
The LED lightbulb according to Appendix D2, wherein the PWM signal generator outputs the PWM signal when the off-on action of the external switch is performed within a predetermined time.

[Appendix D4]
The LED lightbulb according to Appendix D2 or D3, wherein the PWM signal generator includes an oscillation circuit and a flipflop circuit, and an output of the flip-flop circuit is varied by the pulse signal generated on the basis of the off-on action of the external switch, so that the oscillation circuit outputs the PWM signal.

[Appendix D5]
The LED lightbulb according to Appendix D4, wherein the oscillation circuit is activated and stopped by the variation of the output of the flipflop circuit.

[Appendix D6]
The LED lightbulb according to Appendix D4 or D5, wherein an output pulse width of the oscillation circuit is determined on the basis of a charging time of the capacitor.

[Appendix D7]
The LED lightbulb according to any of Appendices D2 to D4, wherein the LED driver generates the pulse signal for driving the LED chip only in an ON period of the PWM signal.

[Appendix D8]
The LED lightbulb according to any of Appendices D3 to D5, wherein the PWM signal generator varies a duty ratio of the PWM signal in stages in accordance with the number of times of the off-on actions, in the case where the off-on actions of the external switch each performed within the predetermined time are consecutively performed.

[Appendix D9]
The LED lightbulb according to Appendix D6, wherein the PWM signal generator outputs the PWM signal of the duty ratio of 100%, in the case where the off-on actions of the external switch each performed within the predetermined time are consecutively performed in excess of a predetermined number of times of the off-on actions.

[Appendix D10]
The LED lightbulb according to Appendix D8 or D9, wherein the PWM signal generator includes a plurality of PWM signal generation circuits, the PWM signal generation circuits each including a pair constituted of an oscillation circuit and a flipflop circuit, the oscillation circuits being configured to output the PWM signals of different duty ratios.

[Appendix D11]
The LED lightbulb according to Appendix D10, wherein each of the oscillation circuits is activated and stopped by the variation of the output of the corresponding flip-flop circuit.

[Appendix D12]
The LED lightbulb according to Appendix D10 or D11, wherein the PWM signals of the different duty ratios outputted from the respective oscillation circuits are generated on the basis of difference in charging and discharging time of the capacitor of the respective oscillation circuits.

[Appendix D13]
The LED lightbulb according to any of Appendices D1 to D11, wherein the pulse signal generated from the off-on action of the external switch is provided to the dimming control unit through a photocoupler.

The invention claimed is:
1. An LED lightbulb comprising:
a light emitting unit configured to emit light about a central axis extending in a first direction, the light emitting unit including at least one LED chip;
a pedestal including a mounting surface on which the light emitting unit is mounted, the mounting surface facing in the first direction;

a power source unit that supplies power to the light emitting unit, the power source unit being disposed at a position opposite to the light emitting unit with respect to the pedestal;

a heat dissipator attached to the pedestal and including a power source chamber that accommodates the power source unit;

a base attached to the heat dissipator; and a globe swelling in the first direction and enclosing the light emitting unit, the globe being configured to diffusingly transmit light from the light emitting unit;

wherein the light emitting unit is configured to provide a light amount not less than 50% of a maximum light amount in a region not exceeding ±60° about the central axis set as 0°, and wherein the globe is configured to provide a light amount not less than 50% in a region exceeding ±125° about the central axis set as 0°.

2. The LED lightbulb according to claim 1, wherein the globe includes a top portion, a maximum diameter portion and an exposed bottom portion, the top portion and the exposed bottom portion being spaced apart from each other in the first direction, the maximum diameter portion being located between the top portion and the exposed bottom portion, wherein the maximum diameter portion has a maximum diameter in a cross-section orthogonal to the first direction, and the exposed bottom portion is smaller in diameter of the cross-section orthogonal to the first direction than the maximum diameter portion.

3. The LED lightbulb according to claim 2, wherein in the first direction, a distance between the top portion and the maximum diameter portion is greater than a distance between the exposed bottom portion and the maximum diameter portion.

4. The LED lightbulb according to claim 2, wherein the globe includes a constricted portion between the maximum diameter portion and the exposed bottom portion, the constricted portion protruding inwardly.

5. The LED lightbulb according to claim 1, wherein the globe has a transmittance of 60 to 65%, and a light emission rate indicating a ratio of a total light flux transmitted through the globe to a total light flux from the light emitting unit is not less than 90%.

6. The LED lightbulb according to claim 1, wherein the light emitting unit includes an LED substrate on which said at least one LED chip is mounted.

7. The LED lightbulb according to claim 6, wherein the LED substrate is formed of a ceramic.

8. The LED lightbulb according to claim 6, wherein a plurality of LED chips including said at least one LED chip are arranged in a matrix pattern on the LED substrate.

9. The LED lightbulb according to claim 6, wherein the light emitting unit includes an encapsulating resin that encapsulates therein said at least one LED chip and transmits the light from said at least one LED chip.

10. The LED lightbulb according to claim 9, wherein the encapsulating resin contains a fluorescent material that emits light of a frequency different from that of the light from said at least one LED chip upon being excited by the light from said at least one LED chip.

11. The LED lightbulb according to claim 6, wherein the mounting surface includes a pair of wiring openings spaced from each other across the light emitting unit, and wiring elements pass through the wiring openings, respectively, for connecting the light emitting unit and the power source unit.

12. The LED lightbulb according to claim 11, wherein the LED substrate has a rectangular shape.

13. The LED lightbulb according to claim 12, wherein the LED substrate is formed with a pair of pads spaced apart from each other in a diagonal direction of the LED substrate, and each of the wiring elements extends along a side of the LED substrate between a corresponding one of the wiring openings and a corresponding one of the pads.

14. The LED lightbulb according to claim 13, wherein the mounting surface is flat.

15. The LED lightbulb according to claim 14, wherein the pedestal includes a disk portion that serves as the mounting surface.

16. The LED lightbulb according to claim 15, wherein the power source chamber comprises a round column-shaped space having a central axis extending in the first direction, the power source chamber being closed at an end thereof by the disk portion.

17. The LED lightbulb according to claim 16, wherein each of the wiring openings is elongated in a direction orthogonal to the first direction, and partially covered with the LED substrate.

18. The LED lightbulb according to claim 17, wherein the heat dissipator is formed with a sloped surface connected to the power source chamber, the sloped surface having a circular cross-section that increases in diameter as proceeding away from the base in the first direction, and wherein the wiring openings and the sloped surface overlap with each other as viewed in the first direction.

19. The LED lightbulb according to claim 16, wherein the wiring openings are spaced apart from the LED substrate as viewed in the first direction.

20. The LED lightbulb according to claim 19, wherein the heat dissipator is formed with a pair of concave portions that overlap with the wiring openings respectively as viewed in the first direction, each of the concave portions being recessed from said end of the power source chamber in the first direction and also recessed in a direction orthogonal to the first direction.

* * * * *